US012557312B2

(12) United States Patent
Gatto

(10) Patent No.: US 12,557,312 B2
(45) Date of Patent: Feb. 17, 2026

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 472 days.

(21) Appl. No.: 18/314,394

(22) Filed: May 9, 2023

(65) Prior Publication Data

US 2024/0088274 A1    Mar. 14, 2024

(30) Foreign Application Priority Data

Sep. 9, 2022    (JP) .................. 2022-143706

(51) Int. Cl.
*H10D 64/27*    (2025.01)
*H10D 12/00*    (2025.01)
*H10D 12/01*    (2025.01)

(52) U.S. Cl.
CPC ......... *H10D 12/481* (2025.01); *H10D 12/038* (2025.01); *H10D 64/517* (2025.01)

(58) Field of Classification Search
None
See application file for complete search history.

(56) References Cited

U.S. PATENT DOCUMENTS

| 2016/0190123 A1* | 6/2016 | Laven ................. H10D 64/518 |
| | | 257/140 |
| 2017/0025522 A1* | 1/2017 | Naito .................. H10D 64/513 |
| 2019/0312113 A1* | 10/2019 | Chen .................... H02M 7/003 |

FOREIGN PATENT DOCUMENTS

JP    2019-186318 A    10/2019

* cited by examiner

*Primary Examiner* — Eric A. Ward
(74) *Attorney, Agent, or Firm* — Studebaker Brackett PLLC

(57) ABSTRACT

A semiconductor device includes: a first trench provided from the upper surface of a first impurity layer to the inside of a first semiconductor layer, a second trench provided from the upper surface of a second impurity layer to a position lower than the lower surface of the first semiconductor layer; a second semiconductor layer of a first conductivity type provided on the surface layer of the first impurity layer and disposed to be interposed between the first trench and a third impurity layer in a plan view; and a third semiconductor layer of the first conductivity type provided in the surface layer of the second impurity layer and disposed to be interposed between the second trench and the third impurity layer in the plan view.

16 Claims, 35 Drawing Sheets

FIG. 41
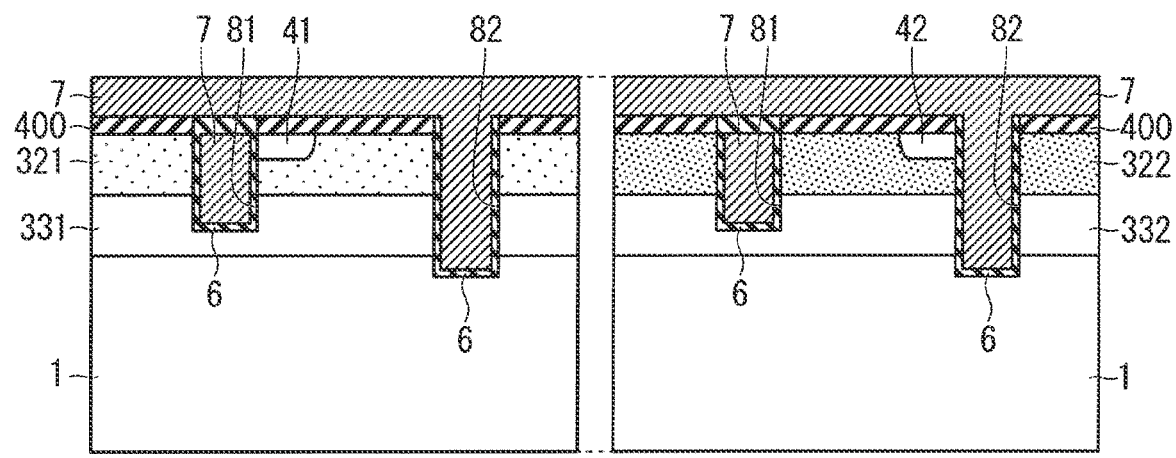
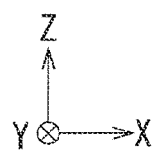
FIG. 42
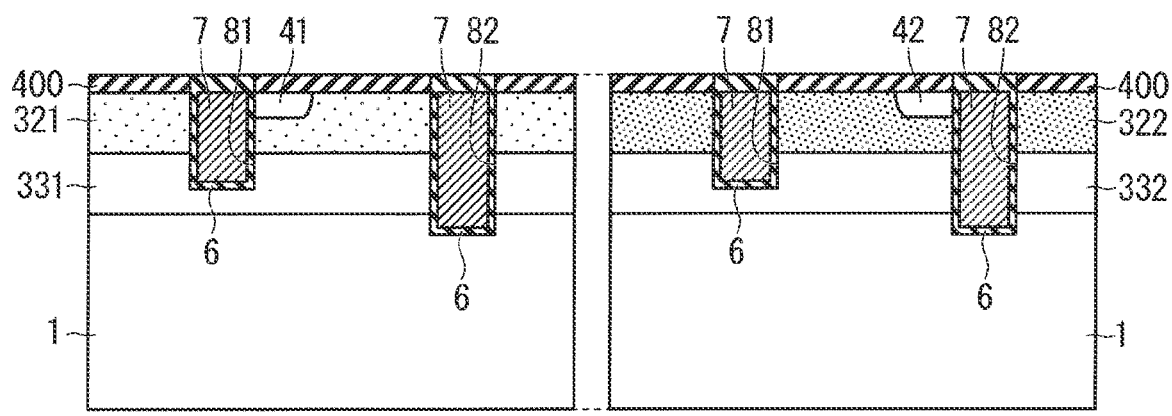
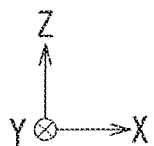

SEMICONDUCTOR DEVICE AND METHOD FOR MANUFACTURING SEMICONDUCTOR DEVICE

BACKGROUND OF THE INVENTION

Field of the Invention

The technology disclosed in the present specification relates to semiconductor technology.

Description of the Background Art

For example, a semiconductor device as disclosed in Japanese Patent Application Laid-Open No. 2019-186318, specifically, an insulated-gate bipolar transistor (i.e., IGBT), has a trench structure (specifically, a shallow gate trench) periodically formed on an upper surface of an N− type semiconductor substrate. An oxide film layer is formed on the side surface and the bottom surface of the gate trench, and a buried layer, which is, for example, polysilicon, is provided surrounded by the oxide film layer. The buried layer in the gate trench is connected to a gate electrode.

The IGBT has the other trench structure (specifically, a deep gate trench) adjacent to the gate trench and periodically formed on the upper surface of the substrate. An oxide film layer is formed on the side surface and the bottom surface of the gate trench, and a buried layer is provided surrounded by the oxide film layer. The buried layer in the gate trench is connected to the other gate electrode.

In addition, the IGBT has one or more trench structures (specifically, a deep dummy trench) adjacent to the other gate trench on the side opposite to the gate trench and formed on the upper surface of the substrate. An oxide film layer is formed on the side surface and the bottom surface of the dummy trench, and a buried layer is provided surrounded by the oxide film layer. The buried layer in the dummy trench is connected to an emitter electrode.

On the other hand, an N type layer is formed on the surface layer of the substrate between the gate trench and the other gate trench. A P type layer is formed on the surface layer of the N type layer. Further, an N+ type emitter layer and a P+ type emitter layer are selectively formed on the surface layer of the P type layer.

The N type layer is in contact with the substrate, the oxide film layer of the gate trench, and the oxide film layer of the other gate trench.

The P type layer is in contact with the P+ type emitter layer, the N type layer, the oxide film layer of the gate trench, and the oxide film layer of the other gate trench.

The N+ type emitter layer is in contact with the P type layer, the oxide film layer of the gate trench, and the oxide film layer of the other gate trench.

During the on-operation of the IGBT as described above, the gate electrode and the other gate electrode are simultaneously turned on, and electrons are injected into the substrate from the gate trench and the other gate trench. Therefore, the saturation current of the IGBT becomes high, and the maximum short-circuit pulse width, with which a short-circuit operation is possible, becomes short.

In order to ensure the short-circuit tolerance, the spacing between the adjacent N+ type emitter layers increased to make it possible to lower the electron injection efficiency per unit area and suppress the saturation current. However, when the spacing increases, parasitic resistance in a region where the P+ type emitter layer is formed increases to cause deterioration in Vce(sat)-Eoff trade-off characteristic.

Further, the other gate electrode is driven at a lower voltage than the gate electrode (e.g., the gate electrode at ±15 V, and the other gate electrode at ±9 V) to make it possible to reduce the injection of electrons from the gate trench and lower the saturation current. However, since the driving is performed at different gate voltages, the operation of a gate driver becomes more complex.

SUMMARY

The technology disclosed in the present specification is a technology for preventing an increase in saturation current while preventing deterioration in Vce(sat)-Eoff trade-off characteristic or the operational complexity of a gate driver.

A semiconductor device according to a first aspect of the technology disclosed in the present specification includes: a semiconductor substrate of a first conductivity type; a first semiconductor layer of the first conductivity type provided on a surface layer of the semiconductor substrate; a first impurity layer of a second conductivity type and a second impurity layer of the second conductivity type that are selectively provided on a surface layer of the first semiconductor layer; a first trench provided from an upper surface of the first impurity layer to an inside of the first semiconductor layer, at least one second trench provided from an upper surface of the second impurity layer to below a lower surface of the first semiconductor layer; a first electrode layer surrounded by an oxide film and buried in the first trench; a second electrode layer surrounded by an oxide film and buried in the second trench; a first gate electrode connected to the first electrode layer; a second gate electrode connected to the second electrode layer; a third impurity layer of the second conductivity type provided across a surface layer of the first impurity layer and a surface layer of the second impurity layer; a second semiconductor layer of the first conductivity type provided on the surface layer of the first impurity layer and disposed to be interposed between the first trench and the third impurity layer in a plan view; and a third semiconductor layer of the first conductivity type provided on the surface layer of the second impurity layer and disposed to be interposed between the second trench and the third impurity layer in the plan view. An impurity concentration of the first semiconductor layer is higher than an impurity concentration of the semiconductor substrate. An impurity concentration of the second impurity layer is higher than an impurity concentration of the first impurity layer. An impurity concentration of the third impurity layer is higher than an impurity concentration of the second impurity layer.

It is possible to prevent an increase in saturation current while preventing the deterioration in Vce(sat)-Eoff trade-off characteristic or the operational complexity of the gate driver.

Further, objects, features, aspects, and advantages relating to the technology disclosed in the present specification will be more apparent from the following detailed description and the accompanying drawings.

These and other objects, features, aspects and advantages of the present specification will become more apparent from the following detailed description of the present specification when taken in conjunction with the accompanying drawings.

BRIEF DESCRIPTION OF THE DRAWINGS

FIGS. 31 to 42 are views illustrating an example of the method for manufacturing the structure illustrated in FIG. 18;

DESCRIPTION OF THE PREFERRED EMBODIMENTS

Figure 1:
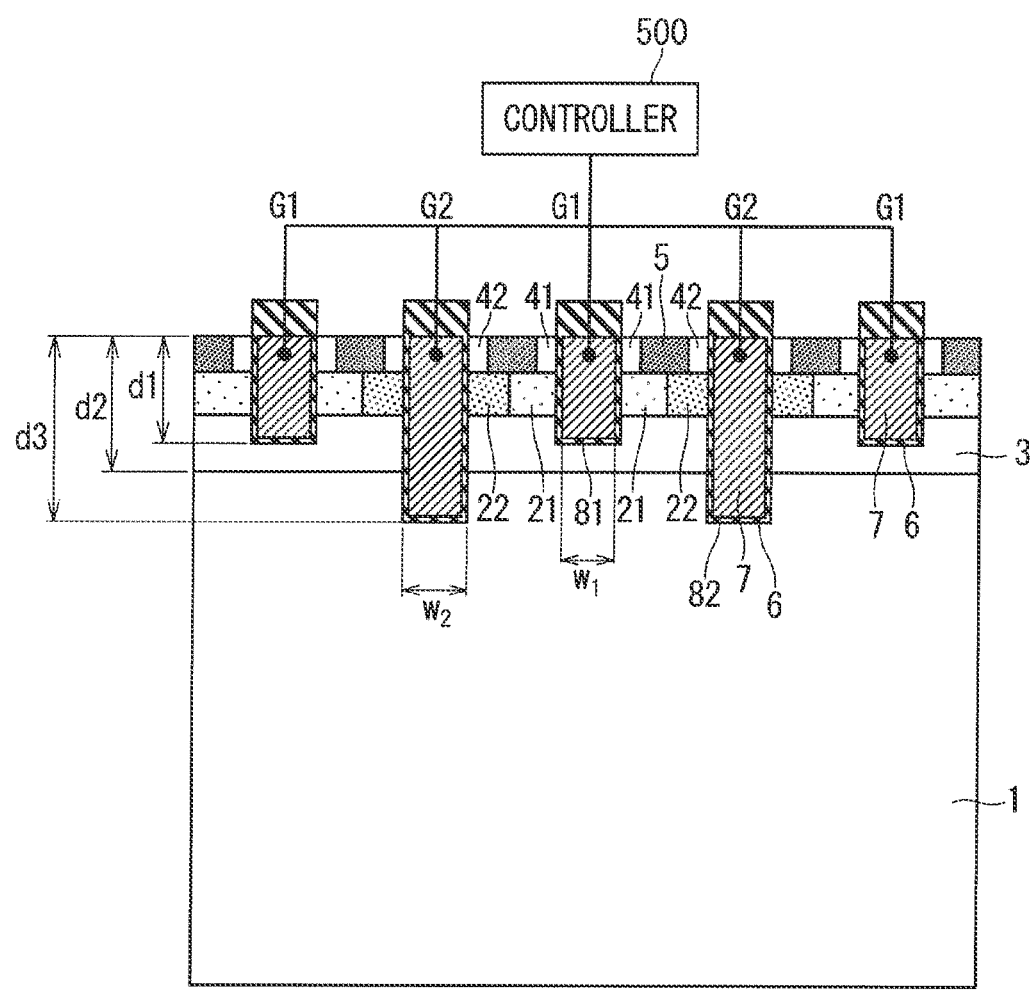
FIG. 1 is a diagram illustrating an example of a configuration of a semiconductor device according to a preferred embodiment.

Hereinafter, preferred embodiments will be described with reference to the attached drawings. In the following preferred embodiments, detailed features and the like are also shown for the description of the technology, but those are merely examples, and not all of those are necessarily essential features for enabling the preferred embodiments to be carried out.

Note that the drawings are schematically illustrated, and omission of the configuration, simplification of the configuration, or the like may be made in the drawings as appropriate for the convenience of description. The interrelationships among sizes and positions of configurations and the like, respectively illustrated in different drawings, are not necessarily accurately described but may be changed as appropriate. Even in drawings such as plan views that are not cross-sectional views, hatching may be given to facilitate understanding of the contents of the preferred embodiments.

In the description illustrated below, similar components are illustrated with the same symbol, and it is assumed that this also applies to the names and functions of those components. Accordingly, detailed descriptions of those may be omitted to avoid duplication.

In the description described in the present specification, when it is stated that a certain component is "provided", "included", or "provided", it is not an exclusive expression to exclude the existence of other components, unless otherwise specified.

Further, in the description described in the present specification, even when an ordinal number such as "first" or "second" is used, these terms are to be used for the sake of convenience to facilitate understanding of the contents of the preferred embodiments, and the contents of the preferred embodiments are not limited to the order or the like that can be caused by these ordinal numbers.

Also, in the description described in the present specification, even when a term meaning a specific position or a direction, such as "upper", "lower", "left", "right", "side", "bottom", "front", or "back" is used, these terms are to be used for the sake of convenience to facilitate understanding of the contents of the preferred embodiments, and are not related to the positions or directions when the preferred embodiment is actually implemented.

Furthermore, in the description described in the present specification, the description of "the upper surface of . . . ", "the lower surface of . . . ", or the like includes not only the upper surface itself or the lower surface itself of the subject component but also a state where another component is formed on the upper surface or the lower surface of the subject component. That is, for example, when it is described as "B provided on the upper surface of A", it does not prevent another component "C" from intervening between A and B.

First Preferred Embodiment

Hereinafter, a semiconductor device according to the present preferred embodiment will be described. For convenience of description, first, a technology related to a configuration of a semiconductor device known to the inventor will be described.

Figure 52:
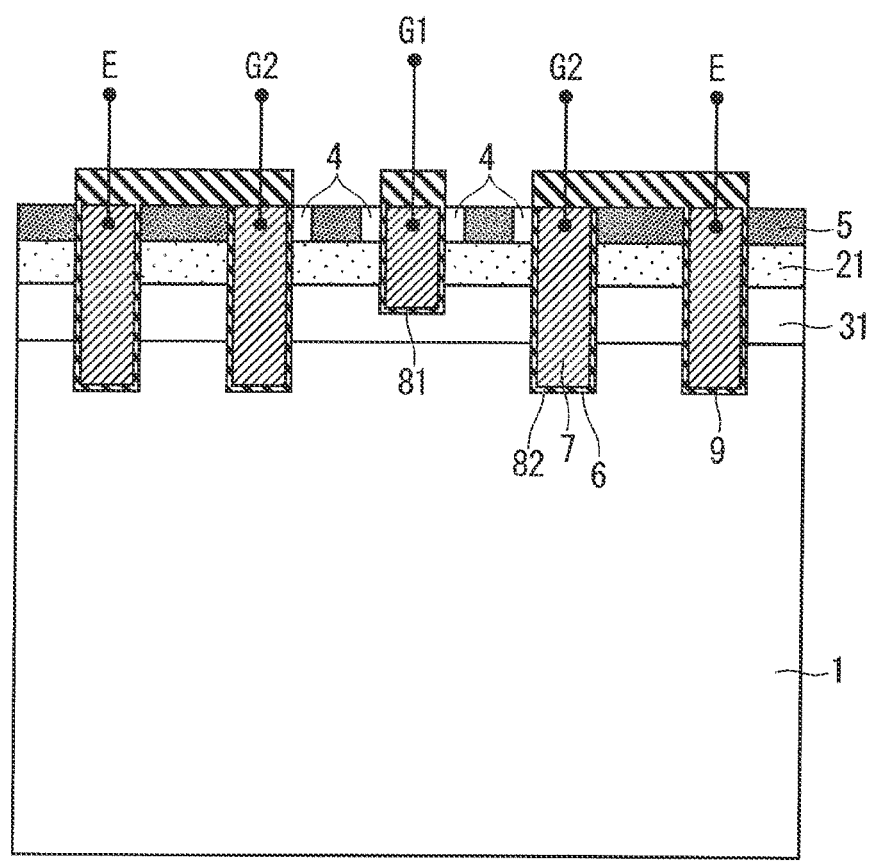
FIGS. 52 and 53 are diagrams illustrating an example of a configuration of a semiconductor device having dummy trenches.
Figure 53:
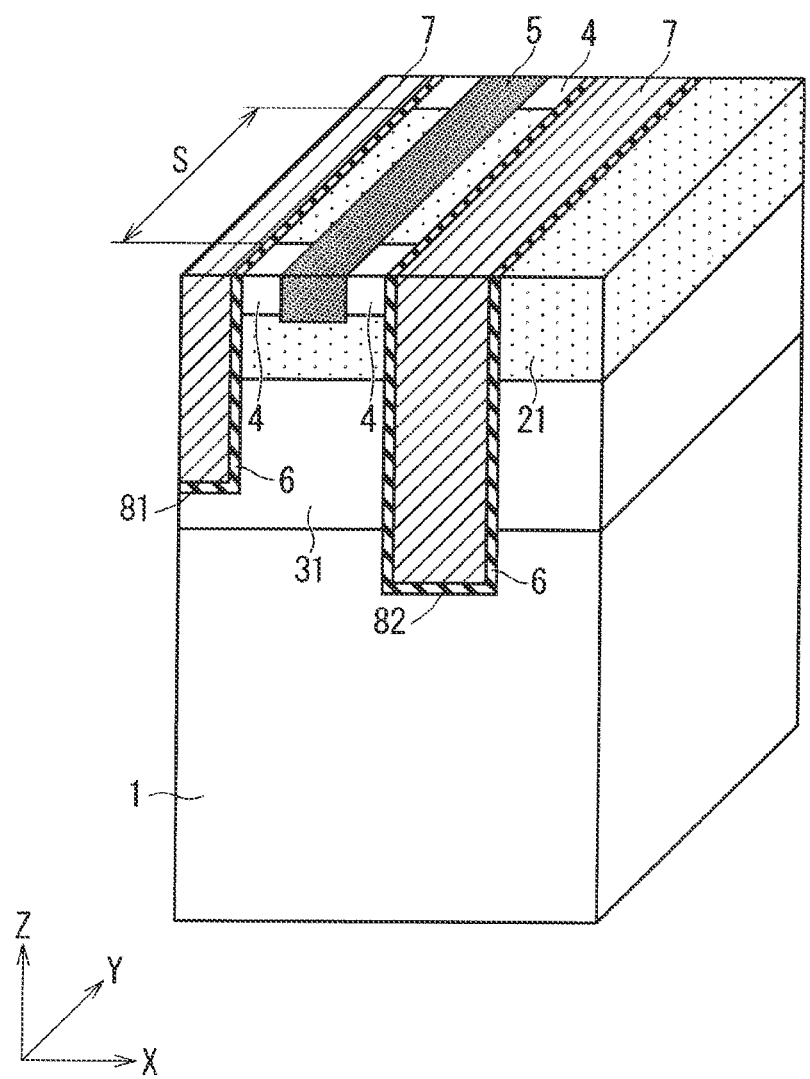

FIGS. 52 and 53 are diagrams illustrating an example of a configuration of a semiconductor device having dummy trenches. For example, a semiconductor device illustrated in FIGS. 52 and 53, specifically, an insulated-gate bipolar transistor (i.e., IGBT), has a trench structure (specifically, a shallow gate trench 81) periodically formed on an upper surface of an N− type semiconductor substrate 1. A gate oxide film 6 is formed on the side surface and the bottom surface of the gate trench 81, and a buried layer 7, which is, for example, polysilicon, is provided surrounded by the gate oxide film 6. The buried layer 7 in the gate trench 81 is connected to a gate electrode G1.

The IGBT has a trench structure (specifically, a deep gate trench 82) adjacent to the gate trench 81 and periodically formed on the upper surface of the substrate 1. A gate oxide film 6 is formed on the side surface and the bottom surface of the gate trench 82, and a buried layer 7 is provided surrounded by the gate oxide film 6. The buried layer 7 in the gate trench 82 is connected to a gate electrode G2.

In addition, the IGBT has one trench structure (specifically, a deep dummy trench 9) or more adjacent to the gate trench 82 on the side opposite to the gate trench 81 and formed on the upper surface of the substrate 1. A gate oxide film 6 is formed on the side surface and the bottom surface of the dummy trench 9, and a buried layer 7 is provided surrounded by the gate oxide film 6. The buried layer 7 in the dummy trench 9 is connected to an emitter electrode E.

On the other hand, an N type layer 3 is formed on the surface layer of the substrate 1 between the gate trench 81 and the gate trench 82 by, for example, ion implantation or thermal diffusion. The impurity concentration of the N type layer 3 is higher than the impurity concentration of the substrate 1. A P type layer 2 is formed on the surface layer of the N type layer 3. Further, an N+ type emitter layer 4 and a P+ type emitter layer 5 are selectively formed on the surface layer of the P type layer 2.

The N type layer 3 is in contact with the substrate 1, the gate oxide film 6 of the gate trench 81, and the gate oxide film 6 of the gate trench 82.

The P type layer 2 is in contact with the P+ type emitter layer 5, the N type layer 3, the gate oxide film 6 of the gate trench 81, and the gate oxide film 6 of the gate trench 82.

The N+ type emitter layer 4 is in contact with the P type layer 2, the gate oxide film 6 of the gate trench 81, and the gate oxide film 6 of the gate trench 82.

<Configuration of Semiconductor Device>

FIG. 1 is a diagram illustrating an example of the configuration of the semiconductor device according to the present preferred embodiment. The semiconductor device shown in the present preferred embodiment is particularly a semiconductor device with a bipolar transistor having an insulated gate. The semiconductor device also includes a reverse-conducting IGBT (i.e., RC-IGBT). Note that the subject semiconductor device also includes other semiconductor devices such as a metal-oxide-semiconductor field-effect transistor (metal-oxide-semiconductor field-effect transistor, that is, MOSFET). In the following preferred embodiment, a high-voltage class semiconductor device with a withstand voltage of about 3300 V is shown as an example, but the withstand voltage class is not limited to such a high withstand voltage.

The semiconductor device illustrated in FIG. 1, specifically, the IGBT, has a trench structure (specifically, a shallow gate trench 81) periodically formed on the upper surface of a substrate 1 of the N− type semiconductor. A gate oxide film 6 is formed on the side surface and the bottom surface of the gate trench 81, and a buried layer 7, which is, for example, polysilicon, is provided surrounded by the gate oxide film 6. The buried layer 7 in the gate trench 81 is connected to a gate electrode G1.

The IGBT has a trench structure (specifically, a deep gate trench 82) adjacent to the gate trench 81 and periodically formed on the upper surface of the substrate 1. A gate oxide film 6 is formed on the side surface and the bottom surface of the gate trench 82, and a buried layer 7 is provided surrounded by the gate oxide film 6. The buried layer 7 in the gate trench 82 is connected to a gate electrode G2.

On the other hand, an N type layer 3 is formed on the surface layer of the substrate 1 between the gate trench 81 and the gate trench 82. A P type layer 21 and a P type layer 22 (channel layer) are selectively formed on the surface layer of the N type layer 3. Further, an N+ type emitter layer 41 and a P+ type emitter layer 5 are selectively formed on the surface layer of the P type layer 21. The N+ type emitter layer 42 and the P+ type emitter layer 5 are selectively formed on the surface layer of the P type layer 22. The P+ type emitter layer 5 is provided across the surface layer of the P type layer 21 and the surface layer of the P type layer 22.

The gate trench 81 is provided from the upper surface of the P type layer 21 to the inside of the N type layer 3. The gate trench 82 is provided from the upper surface of the P type layer 22 to a position below the lower surface of the N type layer 3.

The N type layer 3 is in contact with the substrate 1, the gate oxide film 6 of the gate trench 81, and the gate oxide film 6 of the gate trench 82.

The P type layer 21 is in contact with the P+ type emitter layer 5, the N type layer 3, the gate oxide film 6 of the gate trench 81, and the gate oxide film 6 of the gate trench 82.

The N+ type emitter layer 41 is in contact with the P type layer 21 and the gate oxide film 6 of the gate trench 81. The N+ type emitter layer 41 is disposed to be interposed between the gate trench 81 and the P+ type emitter layer 5 in a plan view.

The P type layer 22 is in contact with the P+ type emitter layer 5, the N type layer 3, and the gate oxide film 6 of the gate trench 82.

The N+ type emitter layer 42 is in contact with the P type layer 22 and the gate oxide film 6 of the gate trench 82. The N+ type emitter layer 42 is disposed to be interposed between the gate trench 82 and the P+ type emitter layer 5 in the plan view.

Here, the depth (d1) of the bottom surface of the gate trench 81 (from the upper surface of the P+ type emitter layer 5), the depth (d2) of the lower surface of the N type layer 3 (from the upper surface of the P+ type emitter layer 5), and the depth (d3) of the bottom surface of the gate trench 82 (from the upper surface of the P+ type emitter layer 5) satisfy a relationship of "d1<d2<d3".

The peak impurity concentration (P1) of the P type layer 21 and the peak impurity concentration (P2) of the P type layer 22 satisfy a relationship of "P1<P2".

The semiconductor device illustrated in FIG. 1 includes a controller 500 that is connected to gate electrode G2 and gate electrode G1, and controls the gate electrode G2 and the gate electrode G1 such that the turn-off timing of the voltage signal of gate electrode G1 is later than the turn-off timing of the voltage signal of gate electrode G2.

Figure 2:
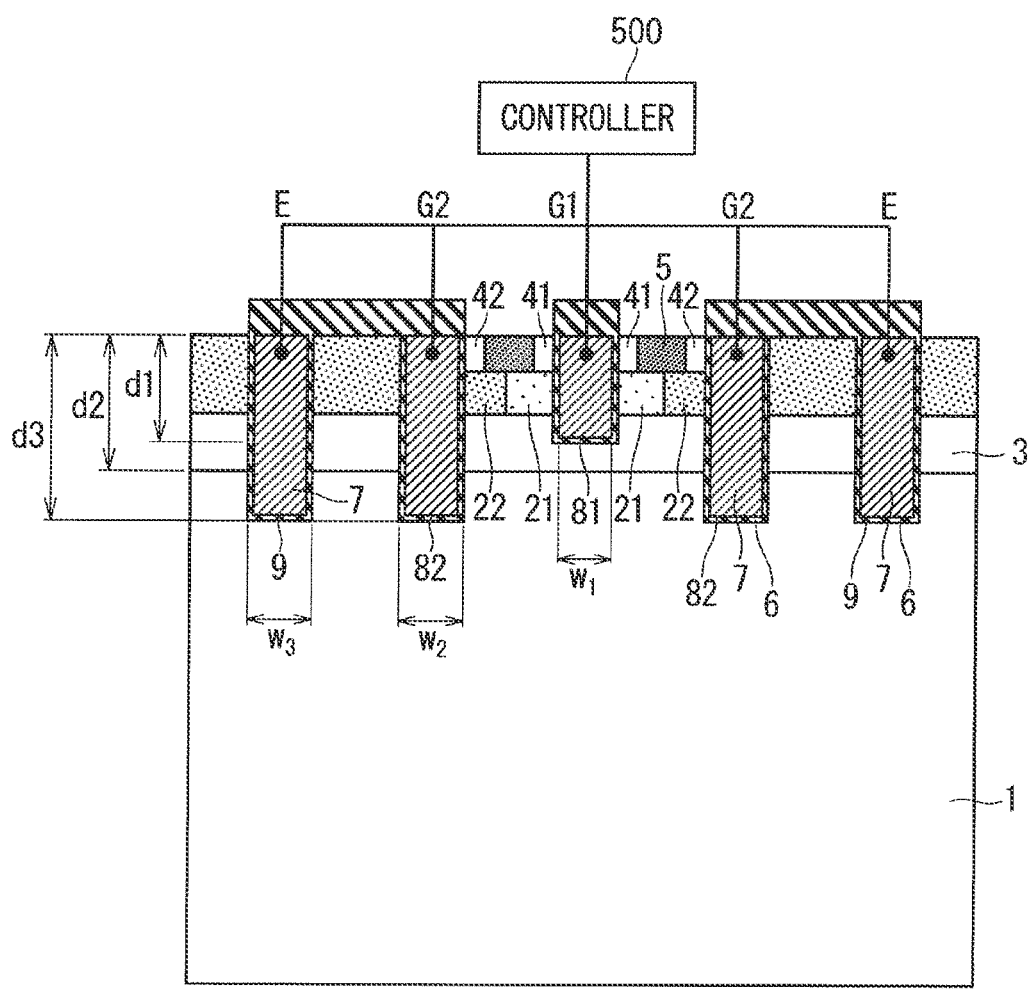
FIG. 2 is a diagram illustrating a modification of the configuration of the semiconductor device according to the preferred embodiment.

FIG. 2 is a diagram illustrating a modification of the configuration of the semiconductor device according to the present preferred embodiment.

In addition to the semiconductor device illustrated in FIG. 1, the semiconductor device illustrated in FIG. 2 has one trench structure (specifically, a deep dummy trench 9) or more adjacent to the gate trench 82 on the side opposite to the gate trench 81 and formed on the upper surface of the substrate 1. A gate oxide film 6 is formed on the side surface and the bottom surface of the dummy trench 9, and a buried layer 7 is provided surrounded by the gate oxide film 6. The buried layer 7 in the dummy trench 9 is connected to an emitter electrode E. The dummy trench 9 is provided from the upper surface of the substrate 1 to a position below the lower surface of the N type layer 3.

In FIG. 2, the P type layer 22 and the N type layer 3 are formed between the gate trench 82 and the dummy trench 9, but the P type layer 22 and the N type layer 3 may not be formed in this place, or another diffusion layer may be formed instead of the P type layer 22 and the N type layer 3.

Further, the depth of the bottom surface of the dummy trench 9 illustrated in FIG. 2 can be made equal to the depth of the bottom surface of the gate trench 82. By forming the dummy trench 9 and the gate trench 82 in this manner, the dummy trench 9 and the gate trench 82 can be simultaneously formed, thus reducing the manufacturing cost.

Second Preferred Embodiment

A semiconductor device according to the present preferred embodiment will be described. In the following description, components similar to the components described in the above-described preferred embodiment will be illustrated with the same reference numerals, and a detailed description thereof will be omitted as appropriate.
<Configuration of Semiconductor Device>

Figure 3:
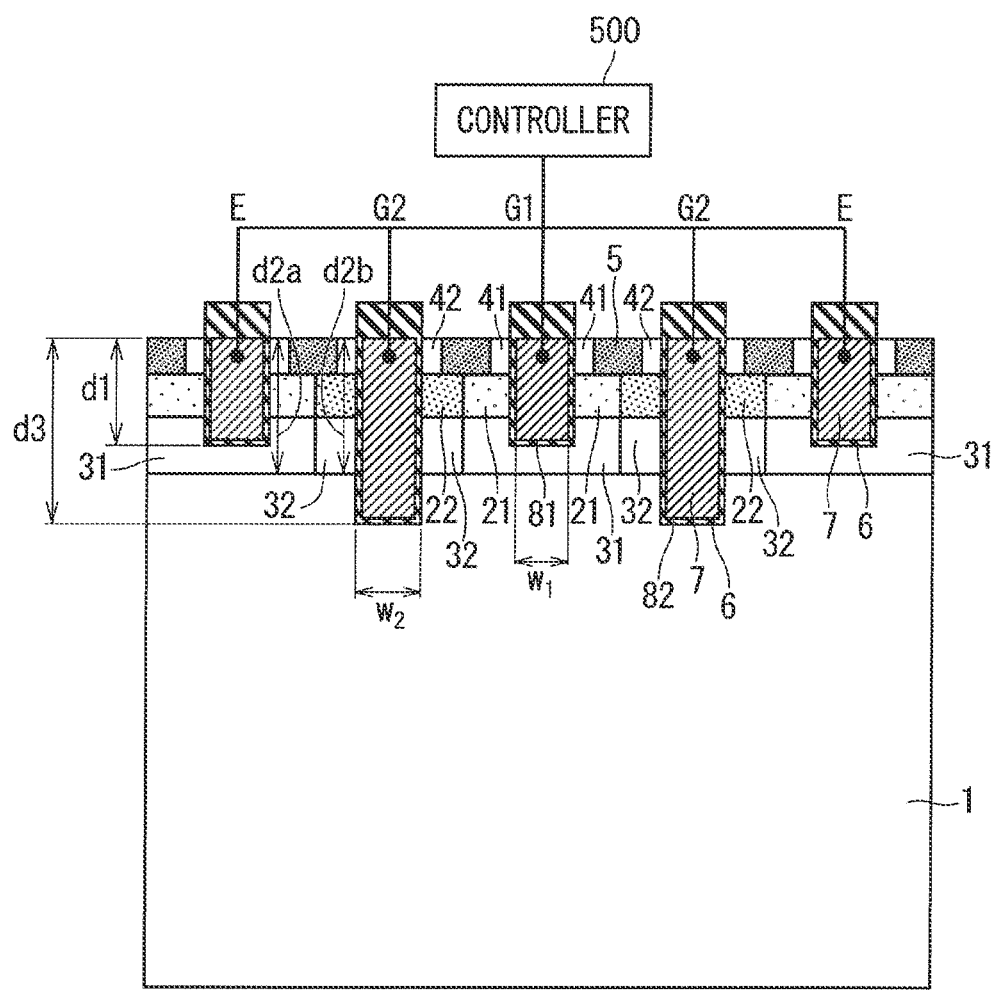
FIG. 3 is a diagram illustrating an example of a configuration of a semiconductor device according to a preferred embodiment.

FIG. 3 is a diagram illustrating an example of the configuration of the semiconductor device according to the present preferred embodiment.

The semiconductor device illustrated in FIG. 3, specifically, the IGBT, has a trench structure (specifically, a shallow gate trench 81) periodically formed on the upper surface of a substrate 1 of the N− type semiconductor. A gate oxide film 6 is formed on the side surface and the bottom surface of the gate trench 81, and a buried layer 7, which is, for example, polysilicon, is provided surrounded by the gate oxide film 6. The buried layer 7 in the gate trench 81 is connected to a gate electrode G1.

The IGBT has a trench structure (specifically, a deep gate trench 82) adjacent to the gate trench 81 and periodically formed on the upper surface of the substrate 1. A gate oxide film 6 is formed on the side surface and the bottom surface of the gate trench 82, and a buried layer 7 is provided surrounded by the gate oxide film 6. The buried layer 7 in the gate trench 82 is connected to a gate electrode G2.

On the other hand, an N type layer 31 and an N type layer 32 are selectively formed on the surface layer of the substrate 1 between the gate trench 81 and the gate trench 82.

A P type layer 21 is formed on the surface layer of the N type layer 31. A P type layer 22 is formed on the surface layer of the N type layer 32.

Further, an N+ type emitter layer 41 and a P+ type emitter layer 5 are selectively formed on the surface layer of the P type layer 21. The N+ type emitter layer 42 and the P− type emitter layer 5 are selectively formed on the surface layer of the P type layer 22.

The N type layer 31 is in contact with the substrate 1 and the gate oxide film 6 of the gate trench 81.

The N type layer 32 is in contact with the substrate 1 and the gate oxide film 6 of the gate trench 82.

The P type layer 21 is in contact with the P+ type emitter layer 5, the N type layer 31, and the gate oxide film 6 of the gate trench 81.

The N+ type emitter layer 41 is in contact with the P type layer 21 and the gate oxide film 6 of the gate trench 81.

The P type layer 22 is in contact with the P+ type emitter layer 5, the N type layer 32, and the gate oxide film 6 of the gate trench 82.

The N+ type emitter layer 42 is in contact with the P type layer 22 and the gate oxide film 6 of the gate trench 82.

Here, the depth (d1) of the bottom surface of the gate trench 81 (from the upper surface of the P+ type emitter layer 5), the depth (d2a) of the lower surface of the N type layer 31 (from the upper surface of the P+ type emitter layer 5), the depth (d2b) of the lower surface of the N type layer 32 (from the upper surface of the P+ type emitter layer 5), and the depth (d3) of the bottom surface of the gate trench 82 (from the upper surface of the P+ type emitter layer 5) satisfy relationships of "d1<d2a<d3" and "d1<d2b<d3".

The peak impurity concentration (P1) of the P type layer 21 and the peak impurity concentration (P2) of the P type layer 22 satisfy a relationship of "P1<P2".

The peak impurity concentration (N1) of the N type layer 31 and the peak impurity concentration (N2) of the N type layer 32 satisfy a relationship of "N1<N2".

The semiconductor device illustrated in FIG. 3 includes a controller 500 that is connected to gate electrode G2 and gate electrode G1, and controls the gate electrode G2 and the gate electrode 1 such that the turn-off timing of the voltage signal of gate electrode G1 is later than the turn-off timing of the voltage signal of gate electrode G2.

Figure 4:
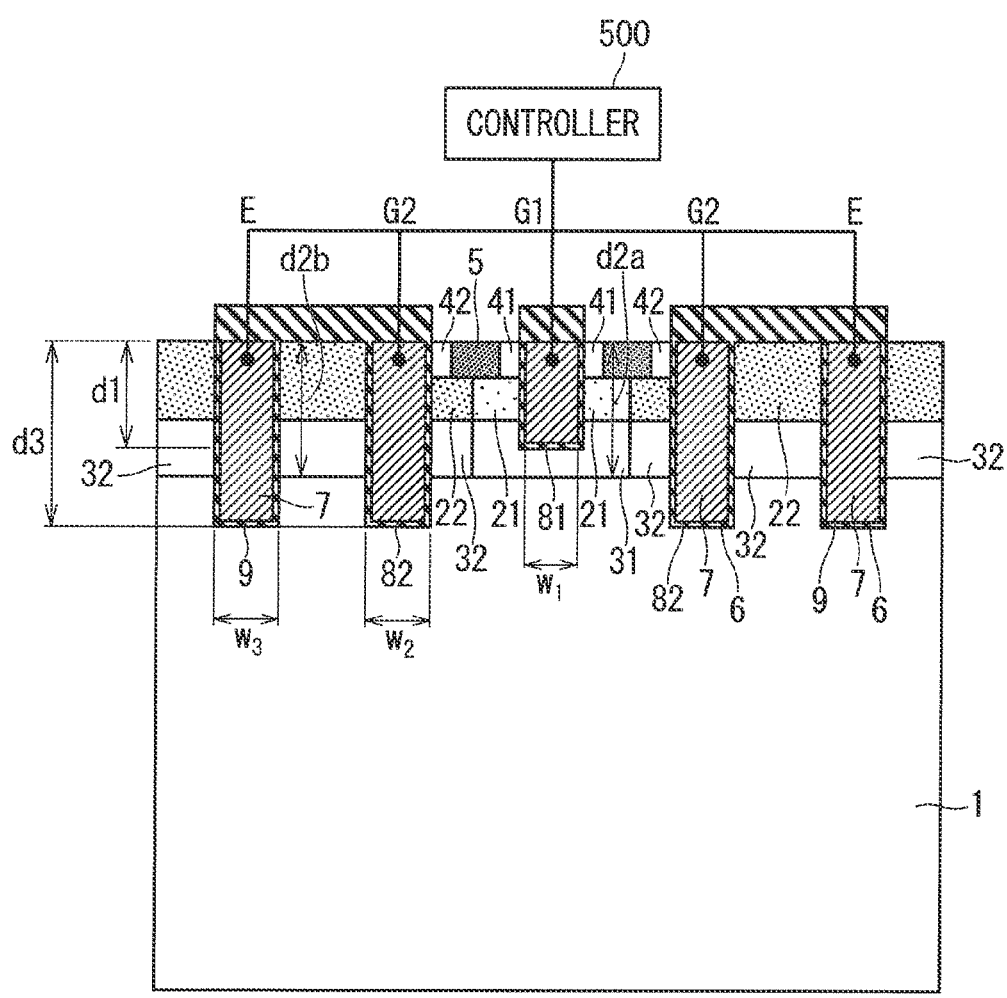
FIG. 4 is a view illustrating a modification of the configuration of the semiconductor device according to the preferred embodiment.

FIG. 4 is a diagram illustrating a modification of the configuration of the semiconductor device according to the present preferred embodiment.

In addition to the semiconductor device illustrated in FIG. 3, the semiconductor device illustrated in FIG. 4 has one trench structure (specifically, a deep dummy trench 9) or more adjacent to the gate trench 82 on the side opposite to the gate trench 81 and formed on the upper surface of the substrate 1. A gate oxide film 6 is formed on the side surface and the bottom surface of the dummy trench 9, and a buried layer 7 is provided surrounded by the gate oxide film 6. The buried layer 7 in the dummy trench 9 is connected to an emitter electrode E.

In FIG. 4, the P type layer 22 and the N type layer 32 are formed between the gate trench 82 and the dummy trench 9, but the P type layer 22 and the N type layer 32 may not be formed in this place, or another diffusion layer may be formed instead of the P type layer 22 and the N type layer 32.

Here, the N type layer 31 (and the P type layer 21) is formed along a direction in which the gate trench 81 and the gate trench 82 extend in the plan view of the substrate 1. Then, the N type layer 31 (and the P type layer 21) is formed adjacent to the gate trench 81 in the plan view.

Similarly, the N type layer 32 (and the P type layer 22) is formed along a direction in which the gate trench 81 and the gate trench 82 extend in the plan view of the substrate 1. Then, the N type layer 32 (and the P type layer 22) is formed adjacent to the gate trench 82 in the plan view.

The allowable range of the peak impurity concentration of the substrate 1 in FIGS. 1 to 4 is, for example, $1\times10^{12}$ cm$^{-3}$ or more and $1\times10^{14}$ cm$^{-3}$ or less.

The peak impurity concentration of the P type layer 21 in FIGS. 1 to 4 is, for example, $2.0\times10^{17}$ cm$^{-3}$, and the allowable range is, for example, $1\times10^{16}$ cm$^{-3}$ or more and $1\times10^{17}$ cm$^{-3}$ or less. The concentration gradient of the P type layer 21 in FIGS. 1 to 4 is, for example, $8.0\times10^{17}$ cm$^{-3}$/μm. The peak impurity concentration of the P type layer 22 in FIGS. 1 to 4 is, for example, $4.0\times10^{17}$ cm$^{-3}$, and the allowable range is, for example, $1\times10^{16}$ cm$^{-3}$ or more and $1\times10^{17}$ cm$^{-3}$ or less. The concentration gradient of the P type layer 22 in FIGS. 1 to 4 is, for example, $8.0\times10^{17}$ cm$^{-3}$/μm.

The peak impurity concentration of the N type layer 31 in FIGS. 3 to 4 is, for example, $1.5\times10^{16}$ cm$^{-3}$, and the allowable range is, for example, $1\times10^{15}$ cm$^{-3}$ or more and $1\times10^{16}$ cm$^{-3}$ or less. The concentration gradient of the N type layer 31 in FIGS. 3 to 4 is, for example, $2.4\times10^{17}$ cm$^{-3}$/μm. The peak impurity concentration of the N type layer 32 in FIGS. 3 to 4 is, for example, $5.0\times10^{16}$ cm$^{-3}$, and the allowable range is, for example, $1\times10^{15}$ cm$^{-3}$ or more and $1\times10^{16}$ cm$^{-3}$ or less. The concentration gradient of the N type layer 32 in FIGS. 3 to 4 is, for example, $2.4\times10^{17}$ cm$^{-3}$/μm.

The allowable range of the peak impurity concentration of the N+ type emitter layer 41 in FIGS. 1 to 4 is, for example, $1\times10^{18}$ cm$^{-3}$ or more and $1\times10^{19}$ cm$^{-3}$ or less. The allowable range of the peak impurity concentration of the N+ type emitter layer 42 in FIGS. 1 to 4 is, for example, $1\times10^{18}$ cm$^{-3}$ or more and $1\times10^{19}$ cm$^{-3}$ or less.

The allowable range of the peak impurity concentration of the P+ type emitter layer 5 in FIGS. 1 to 4 is, for example, $1\times10^{18}$ cm$^{-3}$ or more and $1\times10^{20}$ cm$^{-3}$ or less.

<Action>

Figure 5:
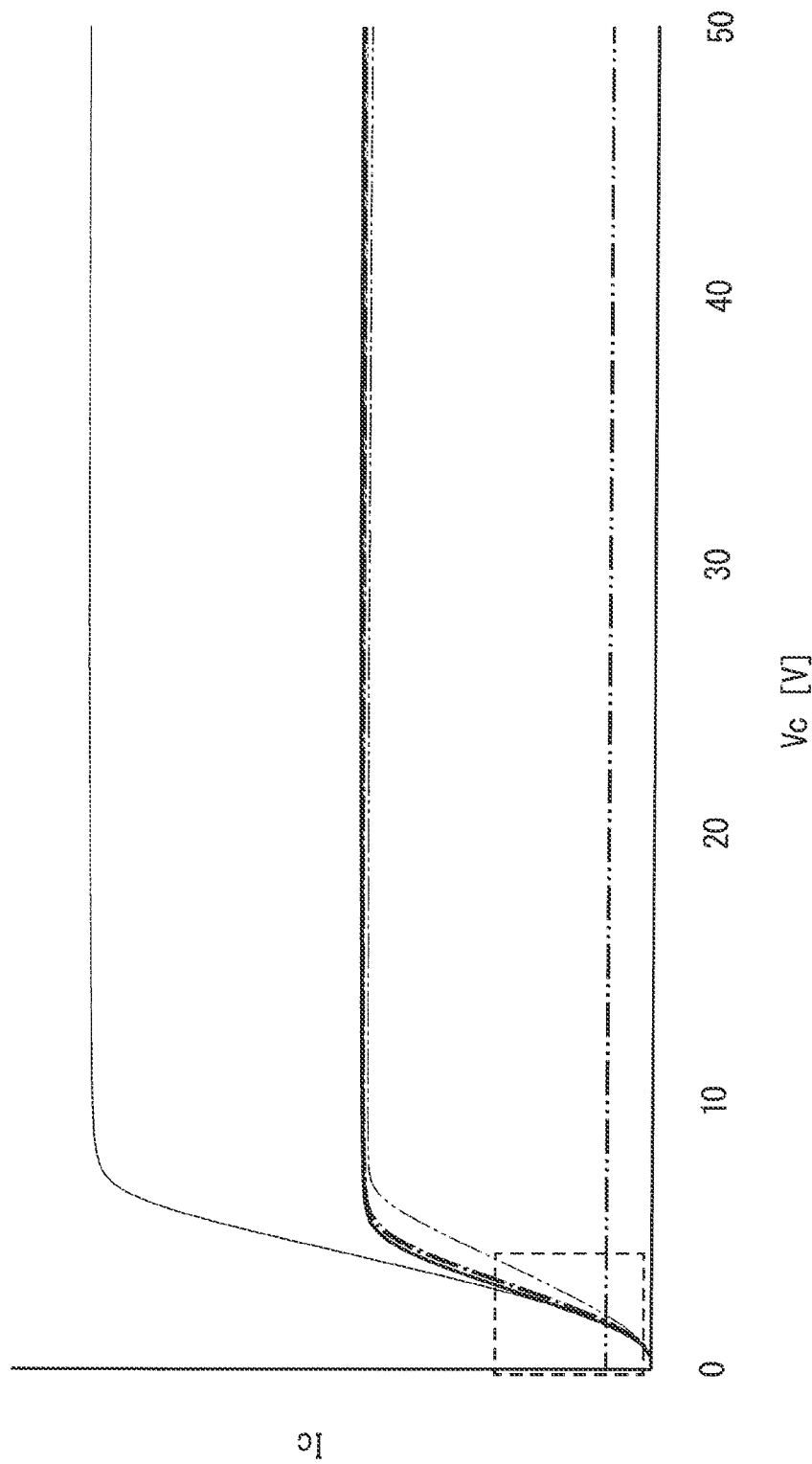
FIGS. 5 and 6 are diagrams illustrating examples of output characteristics in a configuration illustrated in FIG. 52, the configuration illustrated in FIG. 2, and the configuration illustrated in FIG. 4.
Figure 6:
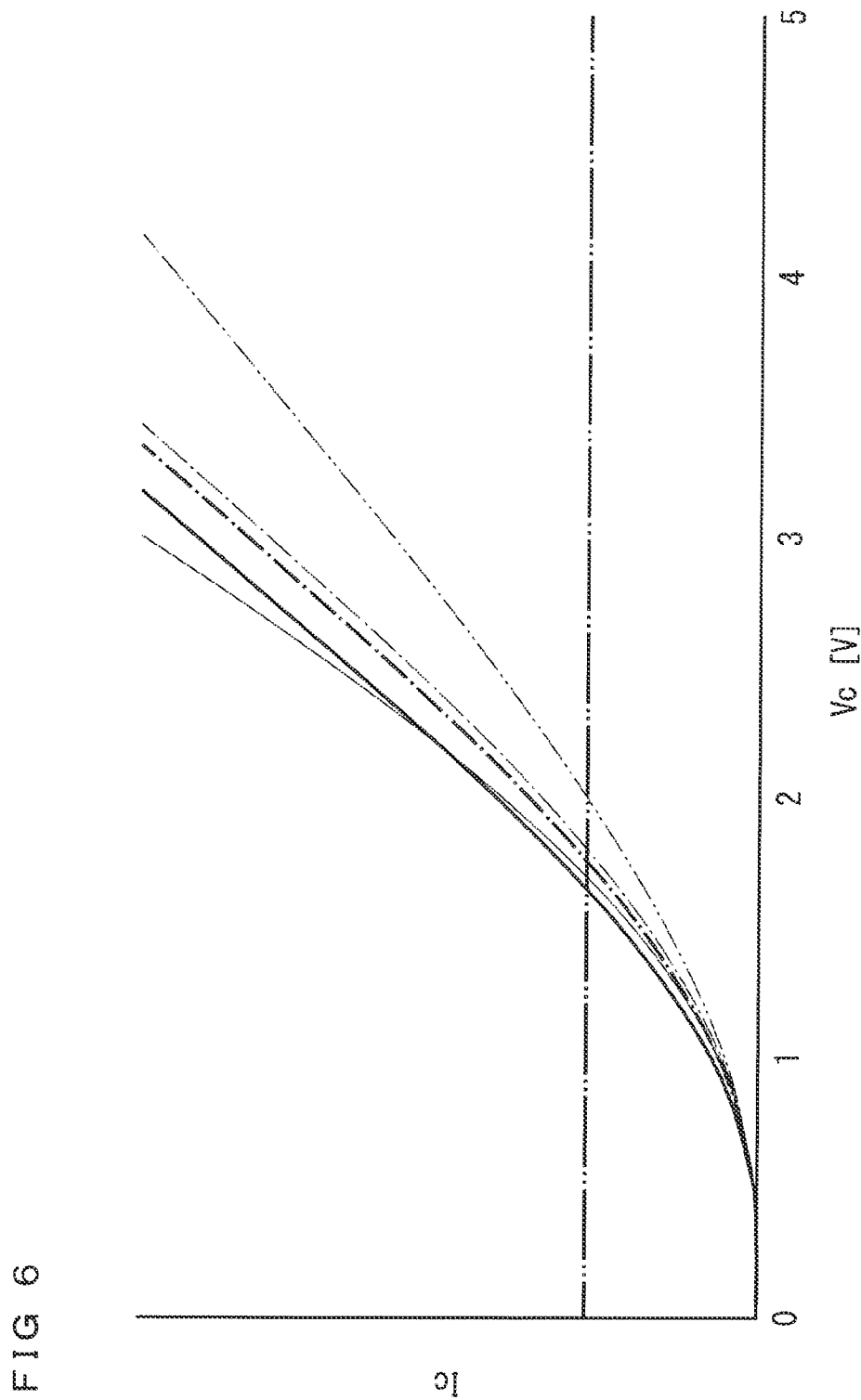

FIGS. 5 and 6 are diagrams illustrating examples of output characteristics in the configuration illustrated in FIG. 52, the configuration illustrated in FIG. 2, and the configuration illustrated in FIG. 4, respectively. FIG. 6 is an enlarged view of a region up to a voltage value of 5 V in FIG. 5. In FIGS. 5 and 6, the vertical axis represents the current value, and the horizontal axis represents the voltage value [V].

In FIGS. 5 and 6, the output characteristic of the configuration illustrated in FIG. 52 is indicated by a thin solid line, the output characteristic in which the spacing S (cf. FIG. 53) of the configuration illustrated in FIG. 52 has been adjusted is indicated by a thin double-dashed line, the output characteristic in which the voltage of the gate electrode G2 of the configuration illustrated in FIG. 52 has been adjusted is indicated by a thin single-dashed line, the output characteristic of the configuration illustrated in FIG. 2 is indicated by a thick single-dashed line, the output characteristic of the configuration illustrated in FIG. 4 is indicated by a thick solid line, and the rated current is indicated by a thick double-dashed line.

Referring to FIGS. 5 and 6, in the case of the configuration illustrated in FIG. 52, the gate electrode G1 and the gate electrode G2 are simultaneously turned on, and electrons are injected into the substrate 1 from the gate trench 81 and the gate trench 82. Then, the saturation current increases.

In the case of the configuration illustrated in FIG. 52 with the spacing S (cf. FIG. 53) adjusted, the spacing S between the adjacent N+ type emitter layers 4 can be adjusted to suppress the saturation current. However, Vce(sat) increases.

In the case of the configuration illustrated in FIG. 52 with the voltage of the gate electrode G2 adjusted, the applied voltage of the gate electrode G2 can be adjusted to suppress the saturation current. However, the gate electrode G1 and the gate electrode G2 are driven at different voltage values, making the driving of a gate driver more complex.

On the other hand, in the case of the configuration illustrated in FIG. 2, the saturation current can be reduced while the deterioration in Vce(sat) is prevented without changing the gate voltage.

Furthermore, also in the case of the configuration illustrated in FIG. 4, the saturation current can be reduced while the deterioration in Vce(sat) is prevented without changing the gate voltage.

Figure 7:
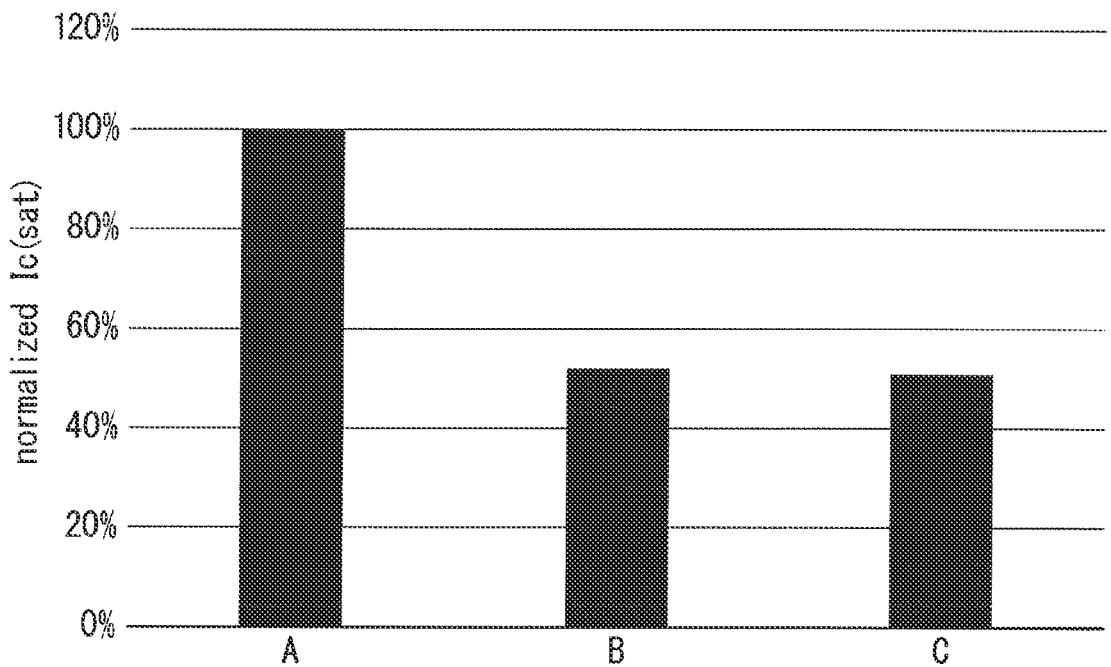
FIG. 7 is a diagram illustrating an example of a comparison of normalized saturation current values in the configuration illustrated in FIG. 52, the configuration illustrated in FIG. 2, and the configuration illustrated in FIG. 4.

FIG. 7 is a diagram illustrating an example of a comparison of normalized saturation current values in the configuration illustrated in FIG. 52, the configuration illustrated in FIG. 2, and the configuration illustrated in FIG. 4. In FIG. 7, the vertical axis represents the normalized current value.

According to FIG. 7, it can be seen that the saturation current value is large in A corresponding to the configuration illustrated in FIG. 52, and as compared to A, the saturation current value is reduced to about 50% in B corresponding to the configuration illustrated in FIGS. 2 and C corresponding to the configuration illustrated in FIG. 4.

Figure 8:
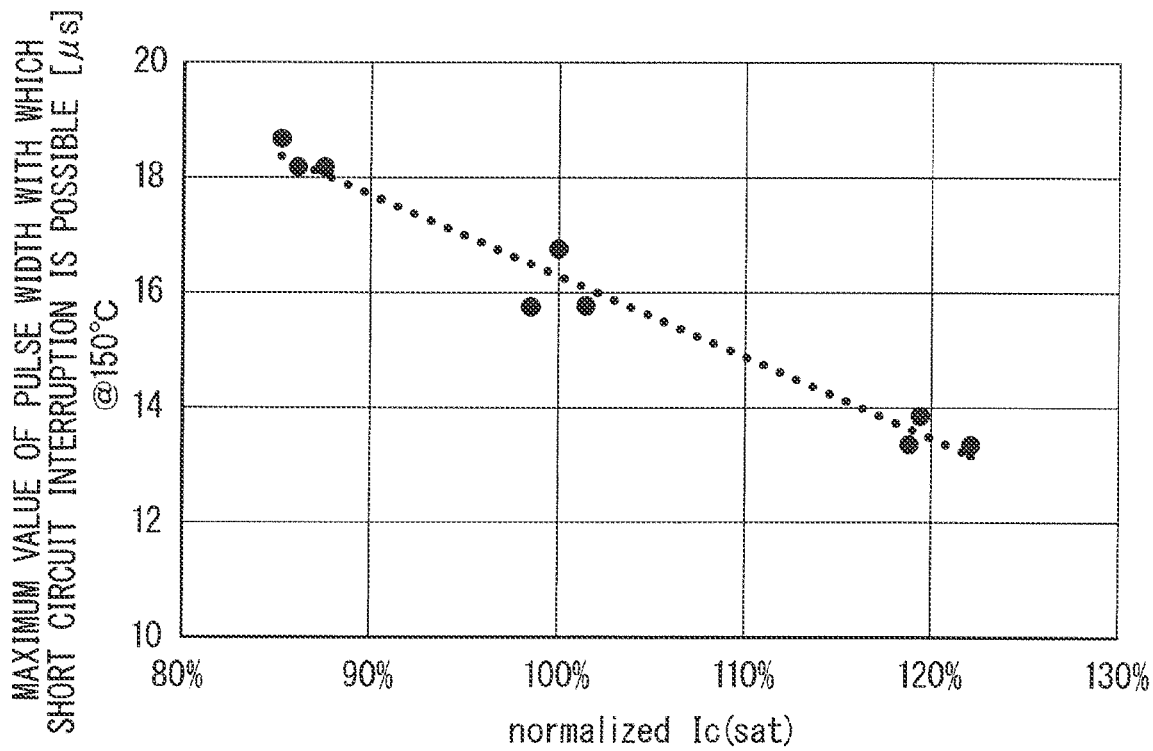
FIG. 8 is a diagram illustrating a relationship between a saturation current value and the maximum value of a pulse width with which a short circuit can be interrupted.

FIG. 8 is a diagram illustrating a relationship between a saturation current value and the maximum value of a pulse width with which a short circuit can be interrupted. In FIG. 8, the vertical axis represents the maximum value [μs] of the pulse width, and the horizontal axis represents the saturation current value. In FIG. 8, for example, the relationship at 150° C. is illustrated.

Referring to FIG. 8, it can be seen that when the saturation current value is reduced, the current value at the time of the short-circuit operation is also reduced, thereby increasing the maximum value of the pulse width with which a short circuit can be interrupted.

From the above relationship, it can be seen that by applying the configuration illustrated in the above preferred embodiment (FIGS. 1 to 4), the short-circuit tolerance can be ensured without changing the gate voltage.

Next, a mechanism for reducing the saturation current value due to the configuration illustrated in the above preferred embodiment (FIGS. 1 to 4) will be described.

When the output of the IGBT is saturated, a portion having a trench structure operates as a MOSFET and injects an electron current into the substrate 1. Then, the electron current becomes the base current of the bipolar transistor, and an output current between a collector and an emitter is controlled.

When the electron current injected into the substrate 1 decreases, the saturation current of the IGBT also decreases. When the structure is constant (when the structures are the same), the electronic current of the MOSFET is determined by the applied voltage and the threshold voltage of the MOSFET. The threshold voltage of the MOSFET is determined by the impurity concentration of the P type layer of the portion operating as the MOSFET.

In the configuration illustrated in FIGS. 1 to 4, the peak impurity concentration (P2) of the P type layer (i.e., P type layer 22) in the portion operating as the MOSFET of the gate trench 82 is set higher than the peak impurity concentration (P1) of the P type layer 21, so that the threshold voltage of the portion operating as the MOSFET increases. As a result, the electronic current can be reduced without changing the gate voltage. Therefore, the saturation current value of the IGBT can be reduced.

Next, a mechanism for improving the Vce(sat)-Eoff trade-off of the IGBT due to the configuration illustrated in the above preferred embodiment (FIGS. 1 to 4) will be described.

When the electron injection from the deep gate trench 82 is reduced by providing the P type layer 22 in the configuration illustrated in FIG. 2, Vce(sat) of the IGBT in the on-state slightly increases.

Figure 9:
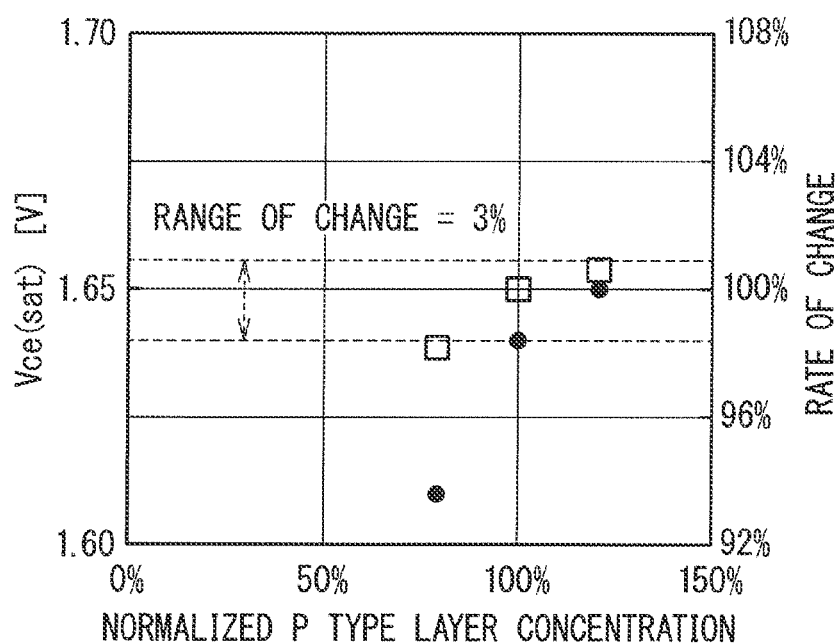
FIG. 9 is a diagram illustrating an example of the concentration dependence of a normalized P type layer on a saturation voltage Vce(sat) in the configuration illustrated in FIG. 4.

FIG. 9 is a diagram illustrating an example of the concentration dependence of the normalized P type layer 22 on the saturation voltage Vce(sat) in the configuration illustrated in FIG. 4. In FIG. 9, the vertical axis represents the saturation voltage [V] and the rate of change, and the horizontal axis represents the normalized impurity concentration of the P type layer 22. In FIG. 9, the circles indicate the voltage values, and the squares indicate the rates of change.

Figure 10:
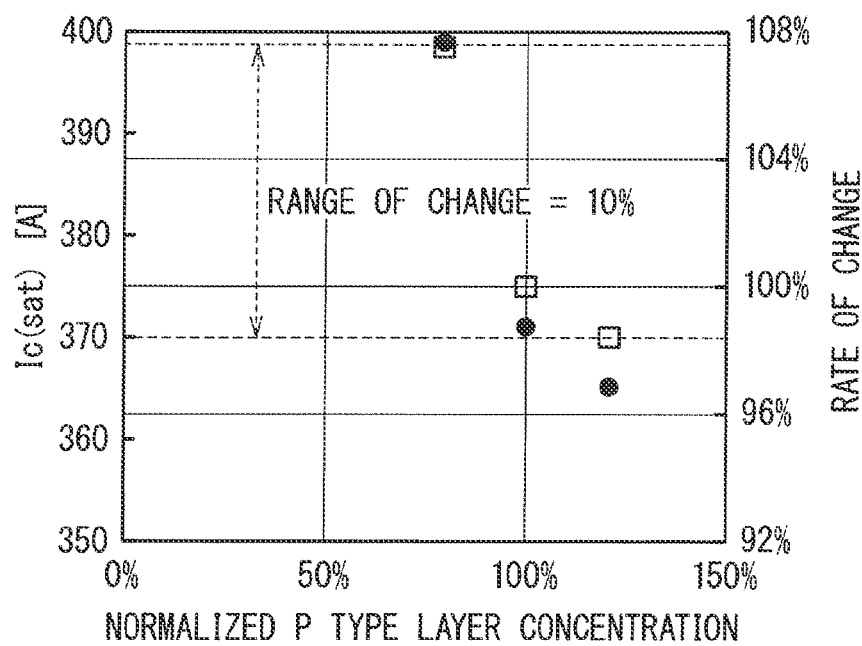
FIG. 10 is a diagram illustrating an example of the concentration dependence of the normalized P type layer on a saturation current Ic(sat) in the configuration illustrated in FIG. 4.

FIG. 10 is a diagram illustrating an example of the concentration dependence of the normalized P type layer 22 on the saturation current Ic(sat) in the configuration illustrated in FIG. 4. In FIG. 10, the vertical axis represents the saturation current [A] and the rate of change, and the horizontal axis represents the normalized impurity concentration of the P type layer 22. In FIG. 10, the circles indicate the current values, and the squares indicate the rates of change.

Figure 11:
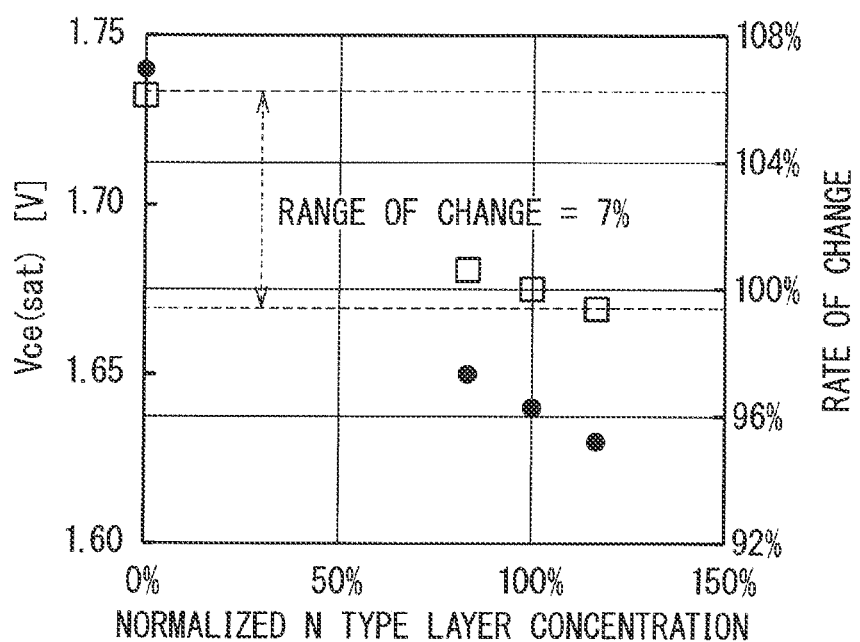
FIG. 11 is a diagram illustrating an example of the concentration dependence of a normalized N type layer on a saturation voltage Vce(sat) in the configuration illustrated in FIG. 4.

FIG. 11 is a diagram illustrating an example of the concentration dependence of the normalized N type layer 32 on the saturation voltage Vce(sat) in the configuration illustrated in FIG. 4. In FIG. 11, the vertical axis represents the saturation voltage [V] and the rate of change, and the horizontal axis represents the normalized impurity concentration of the N type layer 32. In FIG. 11, the circles indicate the voltage values, and the squares indicate the rates of change.

Figure 12:
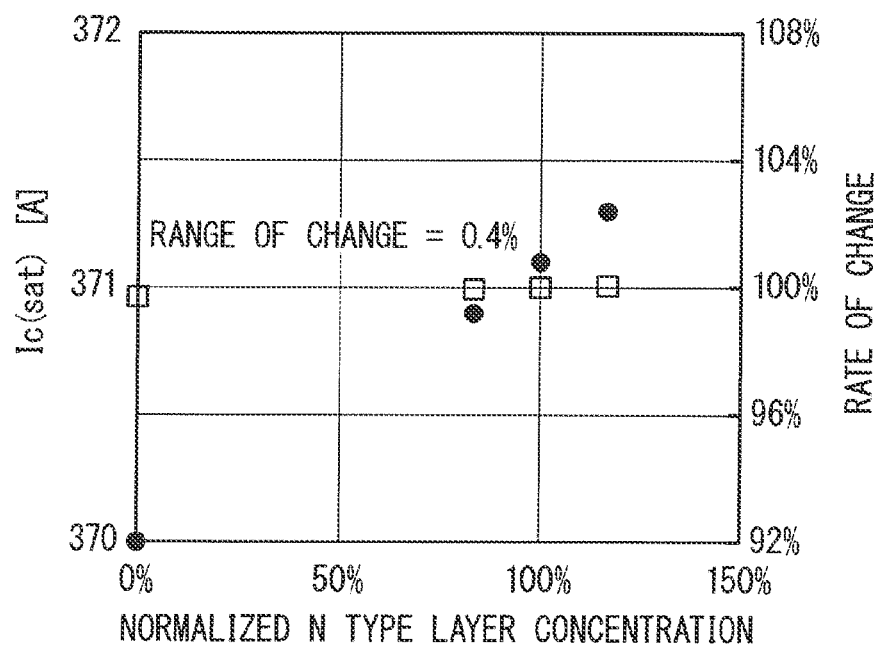
FIG. 12 is a diagram illustrating an example of the concentration dependence of the normalized N type layer on a saturation current Ic(sat) in the configuration illustrated in FIG. 4.

FIG. 12 is a diagram illustrating an example of the concentration dependence of the normalized N type layer 32 on the saturation current Ic(sat) in the configuration illustrated in FIG. 4. In FIG. 12, the vertical axis represents the saturation current [A] and the rate of change, and the horizontal axis represents the normalized impurity concentration of the N type layer 32. In FIG. 12, the circles indicate the current values, and the squares indicate the rates of change.

As illustrated in FIGS. 9 and 10, when the impurity concentration of the P type layer 22 increases, the saturation current Ic(sat) greatly decreases (range of change=10%), but the saturation voltage Vce(sat) slightly increases (range of change=3%).

As illustrated in FIGS. 11 and 12, when the impurity concentration of the N type layer 32 increases, the saturation voltage Vce(sat) decreases (range of change=7%), but the saturation current Ic(sat) is substantially constant (range of change=0.4%).

As described above, for example, in the case of the configuration illustrated in FIG. 4, setting the P type layer 22 and the N type layer 32 to appropriate impurity concentrations can reduce the saturation voltage Vce(sat) while suppressing the saturation current Ic(sat).

Figure 13:
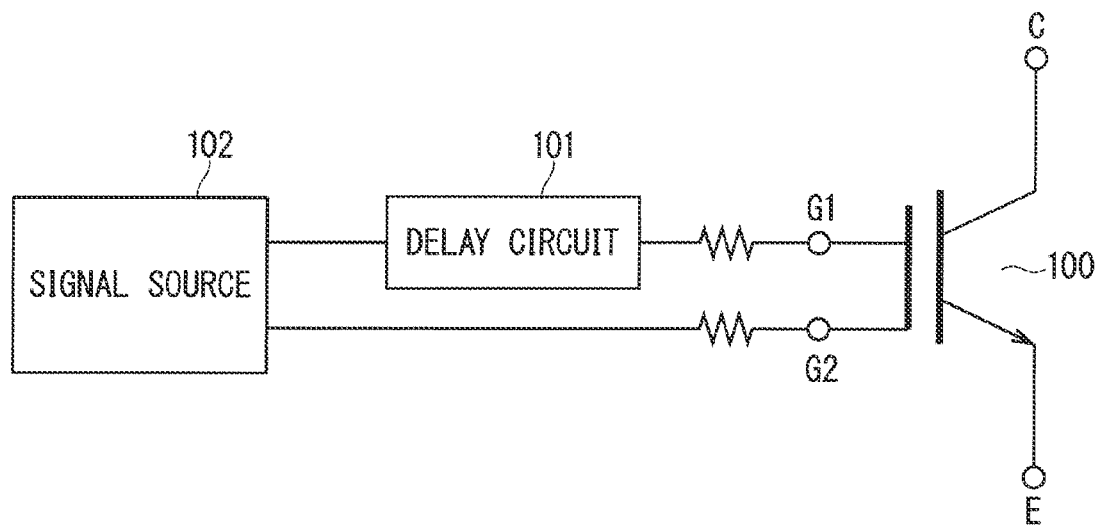
FIG. 13 is a diagram illustrating an example of a circuit diagram of an IGBT with double gate control.

FIG. 13 is a diagram illustrating an example of a circuit diagram of an IGBT with double gate control. As illustrated in FIG. 13, the gate voltage of the IGBT 100 is controlled by the gate electrode G1 and the gate electrode G2. The gate electrode G1 and the gate electrode G2 are connected to the signal source 102 via a resistor, and the gate electrode G1 is further connected to the signal source 102 via a delay circuit 101. Here, the signal source 102, the delay circuit 101, and the circuit resistor correspond to a controller. However, the circuit resistor may be built in the signal source 102 and the delay circuit 101.

Figure 14:
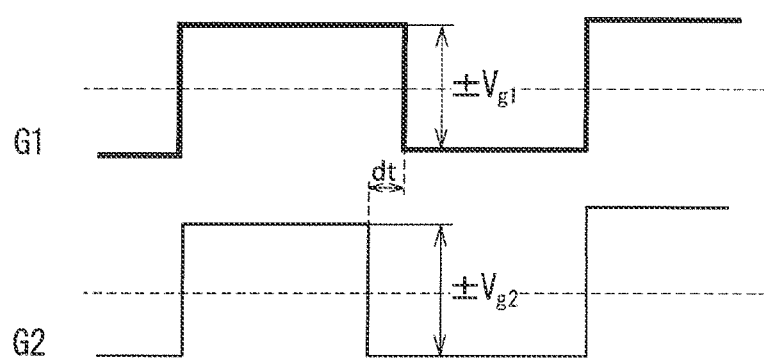
FIG. 14 is an example of a sequence of gate voltages input to the IGBT illustrated in FIG. 13.

FIG. 14 is an example of a sequence of gate voltages input to the IGBT 100 illustrated in FIG. 13. As illustrated in FIG. 14, the gate voltage applied from the gate electrode G1 is $V_{g1}$, and the gate voltage applied from the gate electrode G2 is $V_{g2}$. With the gate electrode G1 being connected to the signal source 102 via the delay circuit 101, the gate voltage applied from the gate electrode G1 is delayed by dt. That is, the signal source 102 is connected to the gate electrode G1 and the gate electrode G2 (when the circuit resistor is omitted), and the turn-off timing of the voltage signal of the gate electrode G1 can be controlled so as to be later than the turn-off timing of the voltage signal of the gate electrode G2.

Figure 15:
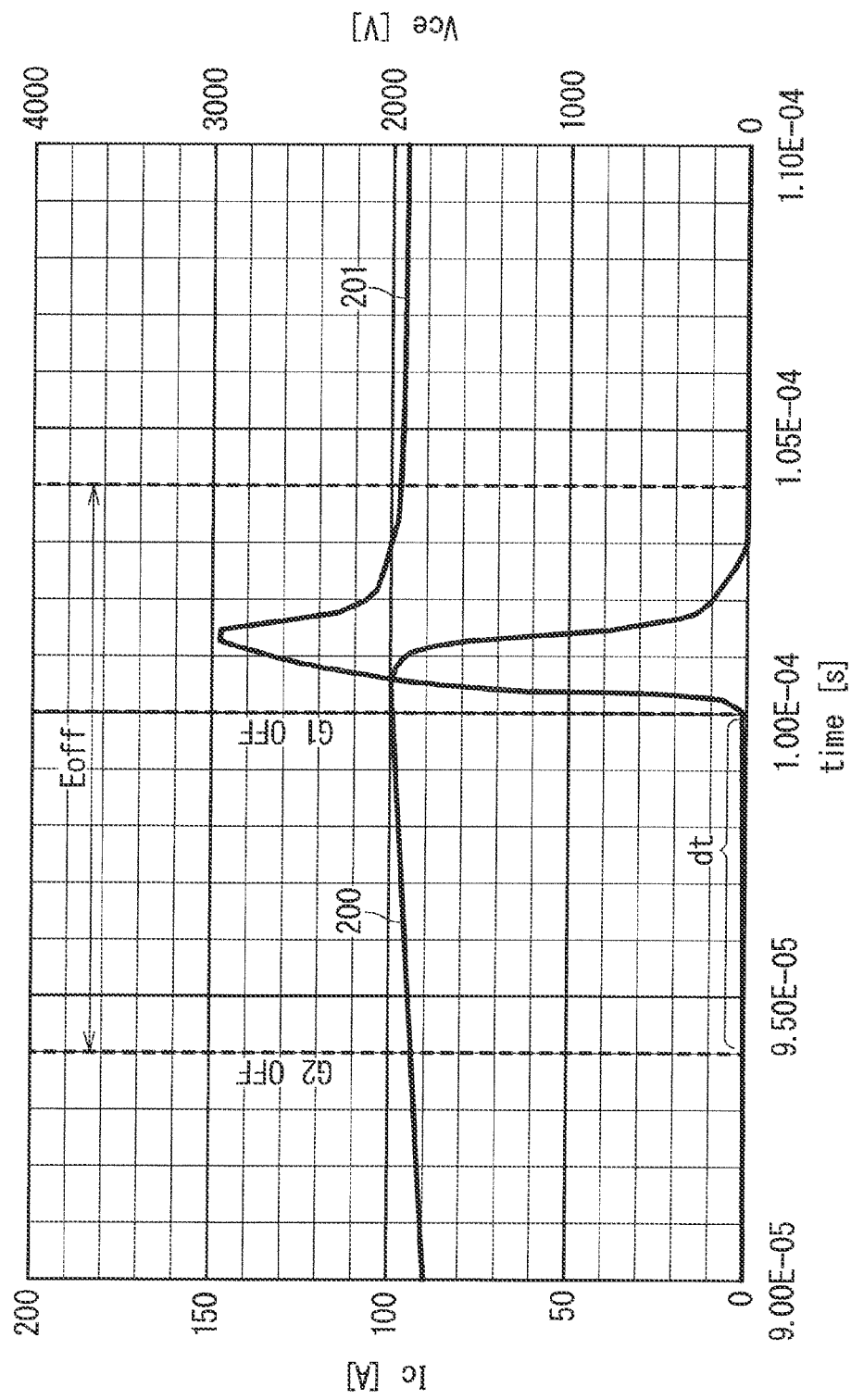
FIG. 15 is a diagram illustrating an example of the turn-off waveform of the IGBT illustrated in FIG. 13.

FIG. 15 is a diagram illustrating an example of a turn-off waveform of the IGBT 100 illustrated in FIG. 13. In FIG. 15, the vertical axis represents the current value [A] and the voltage value [V], and the horizontal axis represents time [s]. In addition, a waveform 200 indicates the waveform of the current value, and a waveform 201 indicates the waveform of the voltage value.

Here, the time difference between the turn-off of the gate electrode G1 and the turn-off of the gate electrode G2 is defined as a delay time dt. The loss from the turn-off to the current-off of the gate electrode G2 is defined as Eoff.

Figure 16:
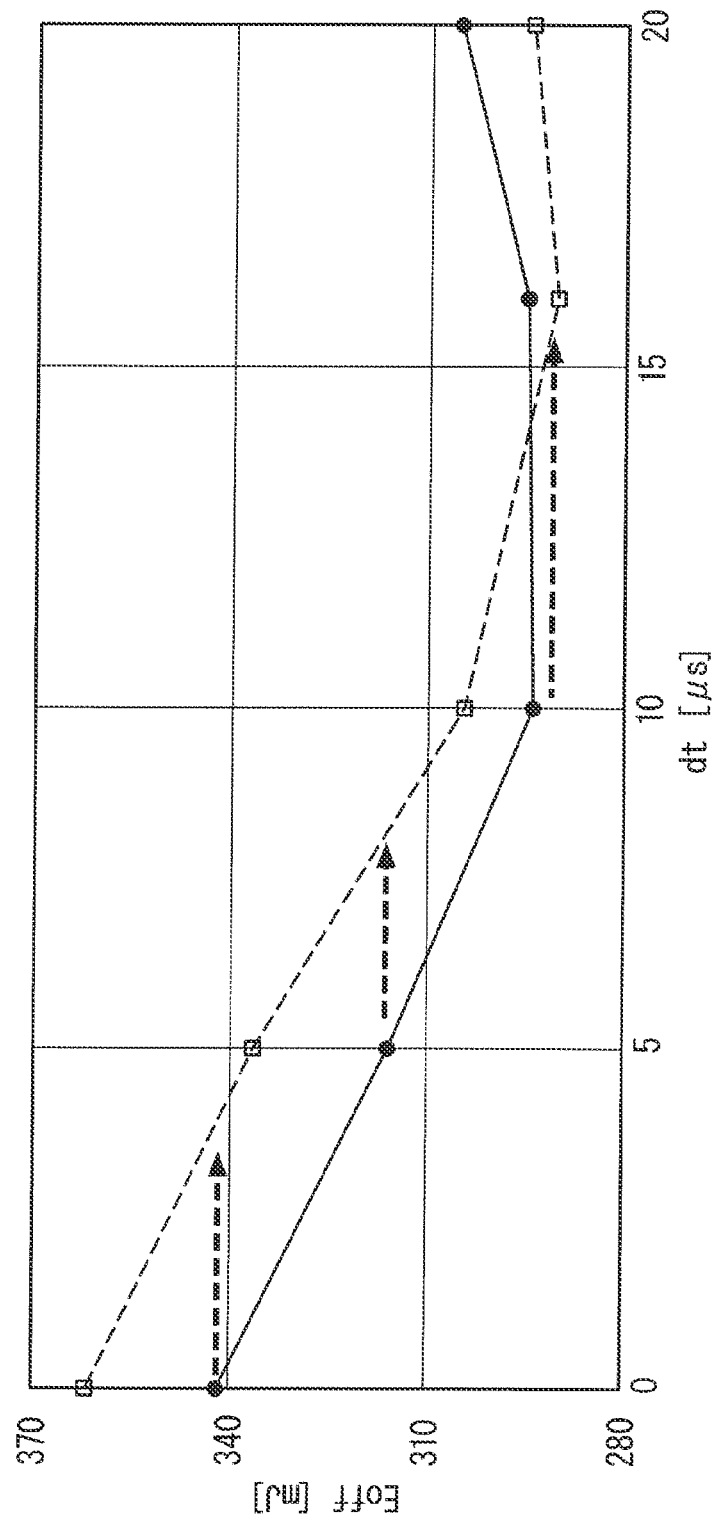
FIG. 16 is a diagram illustrating an example of the dependence of dt on Eoff in a case where the impurity concentrations of the N type layer are different in the configuration illustrated in FIG. 4.

FIG. 16 is a diagram illustrating an example of the dependence of dt on Eoff in a case where the impurity concentrations of the N type layer 32 are different in the configuration illustrated in FIG. 4. In FIG. 16, the circles indicate a case where the impurity concentration of the N type layer 32 is low, and the squares indicate a case where the impurity concentration of the N type layer 32 is high.

As illustrated in FIG. 16, when the impurity concentration of the N type layer 32 is high, Eoff is large when dt is equal to or less than a certain value, but when dt exceeds the certain value, Eoff is similarly small in both cases where the impurity concentration of the N type layer 32 is high and low.

Figure 17:
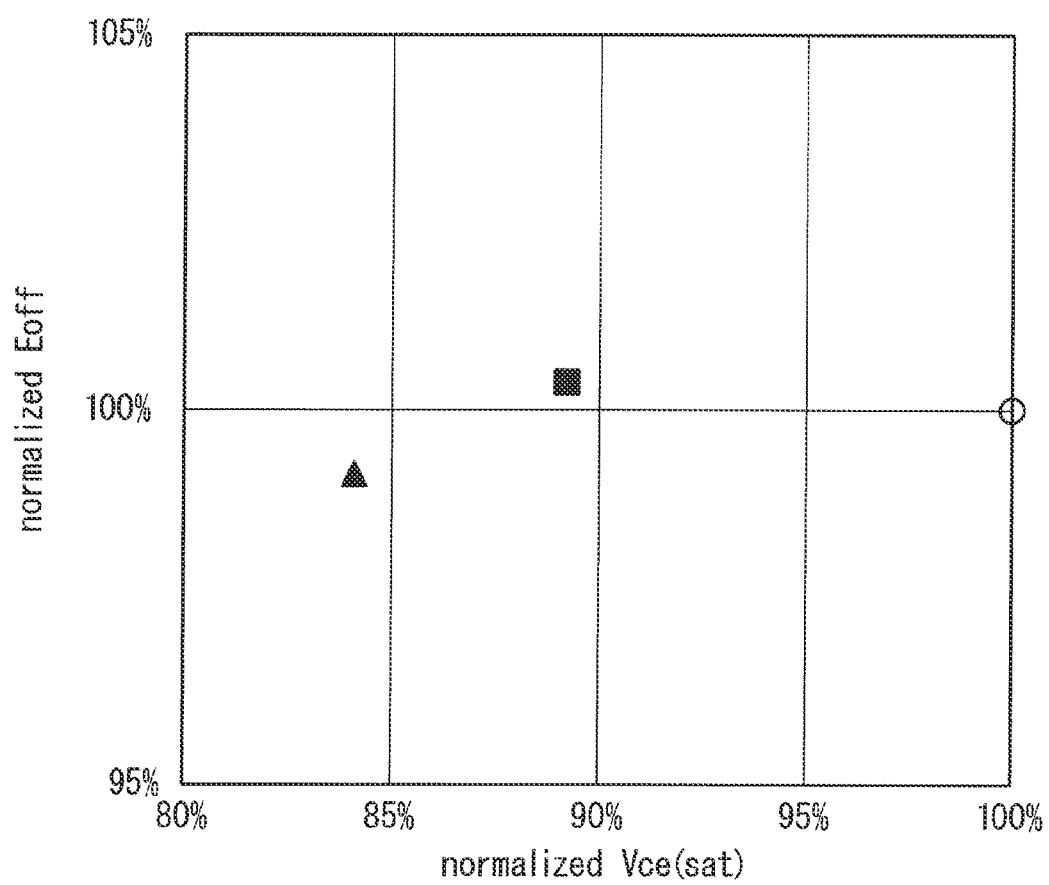
FIG. 17 is a diagram illustrating an example of a trade-off characteristic between the saturation voltage Vce(sat) and Eoff.

FIG. 17 is a diagram illustrating an example of a trade-off characteristic between the saturation voltage Vce(sat) and Eoff. In FIG. 17, the vertical axis represents normalized Eoff, and the horizontal axis represents normalized saturation voltage Vce(sat).

The circle in FIG. 17 corresponds to the configuration illustrated in FIG. 52 with the spacing S (cf. FIG. 53) adjusted, the square in FIG. 17 corresponds to the configuration illustrated in FIG. 2, and the triangle in FIG. 17 corresponds to the configuration illustrated in FIG. 4.

In any of the above configurations, dt has been adjusted to minimize Ioff. Further, the spacing S of the configuration illustrated in FIG. 52 has been adjusted to make the saturation current Ic constant.

When the configuration illustrated in FIG. 52 with the spacing S adjusted is compared with the configurations illustrated in FIGS. 2 and 4, it can be seen that the saturation voltage Vce(sat) decreases in the configuration illustrated in FIG. 2 compared to the configuration illustrated in FIG. 52 with the spacing S adjusted. It can also be seen that the saturation voltages Vce(sat) and Eoff further decrease in the configuration illustrated in FIG. 4 compared to the configuration illustrated in FIG. 52 with the spacing S adjusted and the configuration illustrated in FIG. 2.

Therefore, by adjusting the impurity concentration of the P type layer 22, the impurity concentration of the N type layer 32, and the delay time dt in the configuration illustrated in FIG. 4, it is possible to improve the trade-off characteristic between the saturation voltage Vce(sat) and Eoff while suppressing the saturation current.

Third Preferred Embodiment

A semiconductor device and a method for manufacturing the semiconductor device according to the present preferred embodiment will be described. In the following description, components similar to the components described in the above-described preferred embodiments will be illustrated with the same reference numerals, and a detailed description thereof will be omitted as appropriate.

<Configuration of Semiconductor Device>

Figure 18:
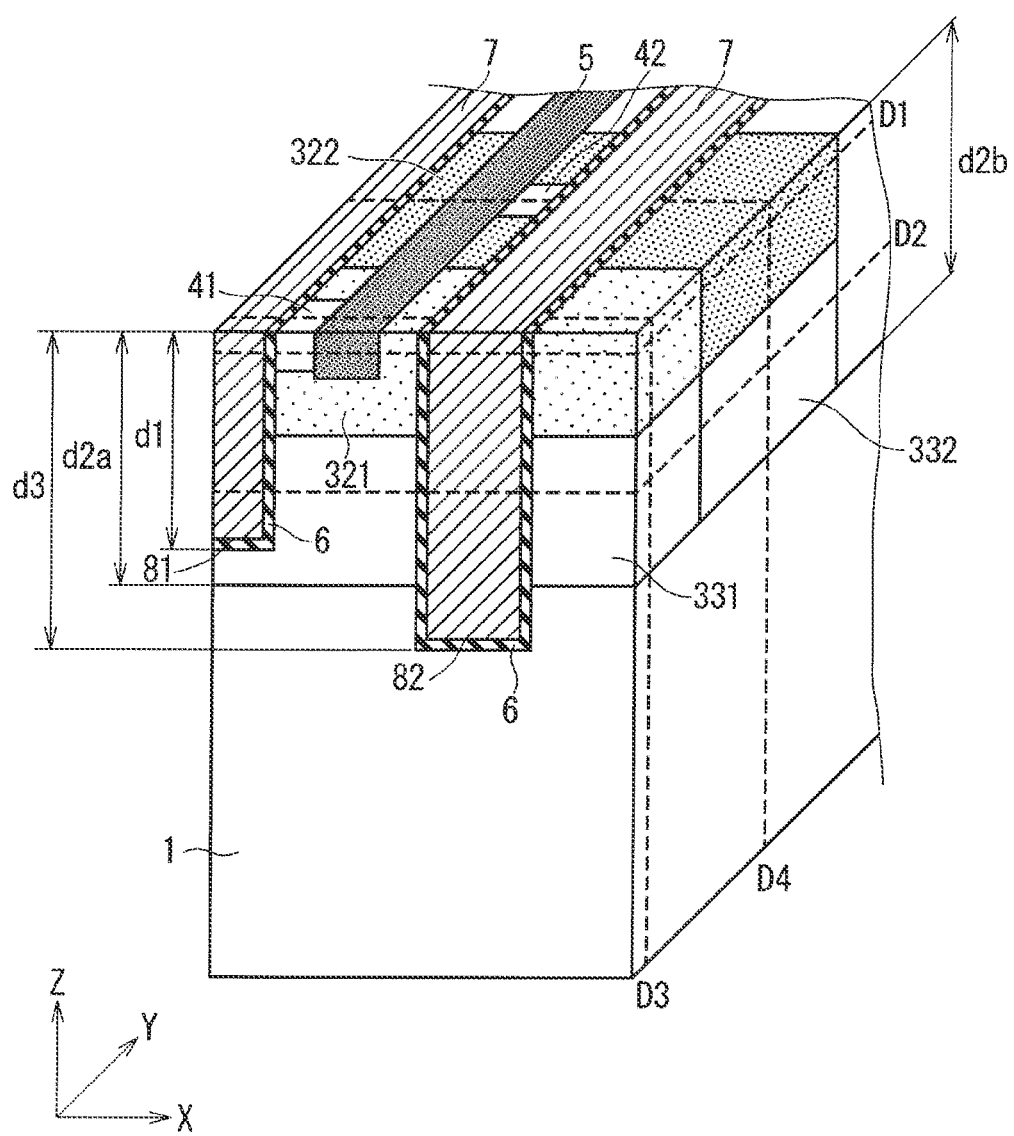
FIG. 18 is a diagram illustrating an example of a configuration of a semiconductor device according to a preferred embodiment.

FIG. 18 is a diagram illustrating an example of the configuration of the semiconductor device according to the present preferred embodiment.

The semiconductor device illustrated in FIG. 18, specifically, the IGBT, has a trench structure (specifically, a shallow gate trench 81) periodically formed on the upper surface of the substrate 1 of the N− type semiconductor. A gate oxide film 6 is formed on the side surface and the bottom surface of the gate trench 81, and a buried layer 7, which is, for example, polysilicon, is provided surrounded by the gate oxide film 6. The buried layer 7 in the gate trench 81 is connected to a gate electrode G1 (not illustrated here).

The IGBT has a trench structure (specifically, a deep gate trench 82) adjacent to the gate trench 81 and periodically formed on the upper surface of the substrate 1. A gate oxide film 6 is formed on the side surface and the bottom surface of the gate trench 82, and a buried layer 7 is provided surrounded by the gate oxide film 6. The buried layer 7 in the gate trench 82 is connected to a gate electrode G2 (not illustrated here).

On the other hand, an N type layer 331 and an N type layer 332 are selectively formed on the surface layer of the substrate 1 between the gate trench 81 and the gate trench 82. A P type layer 321 is formed on the surface layer of the N type layer 331. A P type layer 322 is formed on the surface layer of the N type layer 332.

Here, the N type layer 331 (and the P type layer 321) is formed to extend in a direction intersecting with a direction in which the gate trench 81 and the gate trench 82 extend in the plan view of the substrate 1. That is, the N type layer 331 (and the P type layer 321) is formed across the gate trench 81 and the gate trench 82 adjacent to each other in the plan view.

Similarly, the N type layer 332 (and the P type layer 322) is formed to extend in a direction intersecting with the direction in which the gate trench 81 and the gate trench 82 extend in the plan view of the substrate 1. That is, the N type layer 332 (and the P type layer 322) is formed across the gate trench 81 and the gate trench 82 adjacent to each other in the plan view.

Furthermore, an N+ type emitter layer 41 and a P+ type emitter layer 5 are selectively formed on the surface layer of the P type layer 321. In addition, the N+ type emitter layer 42 and the P+ type emitter layer 5 are selectively formed on the surface layer of the P type layer 322.

The N type layer 331 is in contact with the substrate 1, the gate oxide film 6 of the gate trench 81, and the gate oxide film 6 of the gate trench 82.

The N type layer 332 is in contact with the substrate 1, the gate oxide film 6 of the gate trench 81, and the gate oxide film 6 of the gate trench 82.

The P type layer 321 is in contact with the P+ type emitter layer 5, the N type layer 331, the gate oxide film 6 of the gate trench 81, and the gate oxide film 6 of the gate trench 82.

The N+ type emitter layer 41 is in contact with the P type layer 321 and the gate oxide film 6 of the gate trench 81.

The P type layer 322 is in contact with the P+ type emitter layer 5, the N type layer 332, the gate oxide film 6 of the gate trench 81, and the gate oxide film 6 of the gate trench 82.

The N+ type emitter layer 42 is in contact with the P type layer 322 and the gate oxide film 6 of the gate trench 82.

Here, the depth (d1) of the bottom surface of the gate trench 81 (from the upper surface of the P+ type emitter layer 5), the depth (d2a) of the lower surface of the N type layer 331 (from the upper surface of the P+ type emitter layer 5), the depth (d2b) of the lower surface of the N type layer 332 (from the upper surface of the P+ type emitter layer 5), and the depth (d3) of the bottom surface of the gate trench 82 (from the upper surface of the P+ type emitter layer 5) satisfy relationships of "d1<d2a<d3" and "d1<d2b<d3".

The peak impurity concentration (P1) of the P type layer 321 and the peak impurity concentration (P2) of the P type layer 322 satisfy a relationship of "P1<P2".

The peak impurity concentration (N1) of the N type layer 331 and the peak impurity concentration (N2) of the N type layer 332 satisfy a relationship of "N1<N2".

The semiconductor device illustrated in FIG. 18 includes a controller 500 that is connected to gate electrode G2 and gate electrode G1, and controls the gate electrode G2 and the gate electrode G1 such that the turn-off timing of the voltage signal of gate electrode G1 is later than the turn-off timing of the voltage signal of gate electrode G2.

In FIG. 18, the N type layer 3 may be provided instead of the N type layer 331 and the N type layer 332.

Figure 19:
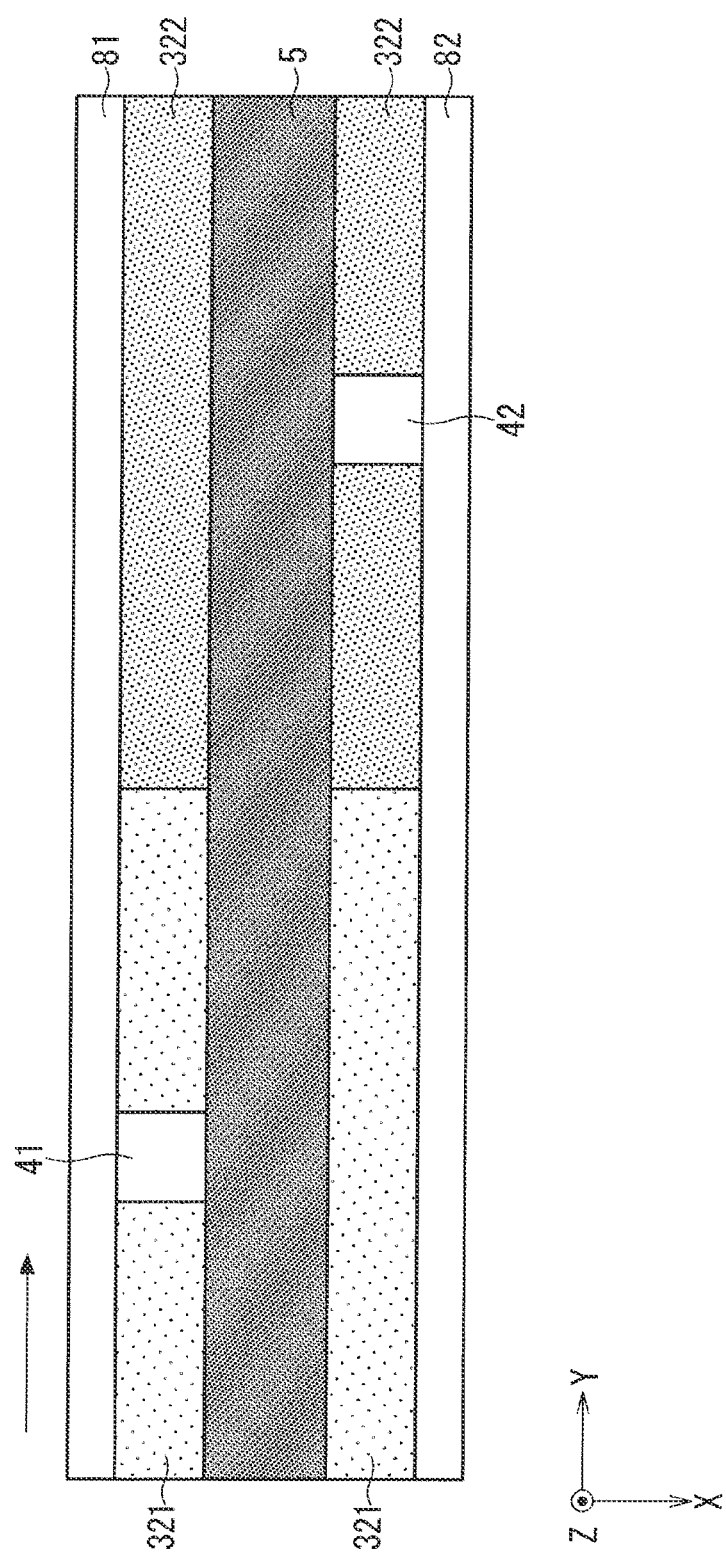
FIG. 19 is a cross-sectional view of a cross section D1 illustrated in FIG. 18.

FIG. 19 is a cross-sectional view taken along a cross section D1 illustrated in FIG. 18. As shown by an example in FIG. 19, the P type layer 321 is formed across the adjacent gate trench 81 and gate trench 82 in a plan view. Similarly, the P type layer 322 is formed across the adjacent gate trench 81 and gate trench 82 in the plan view.

Figure 20:
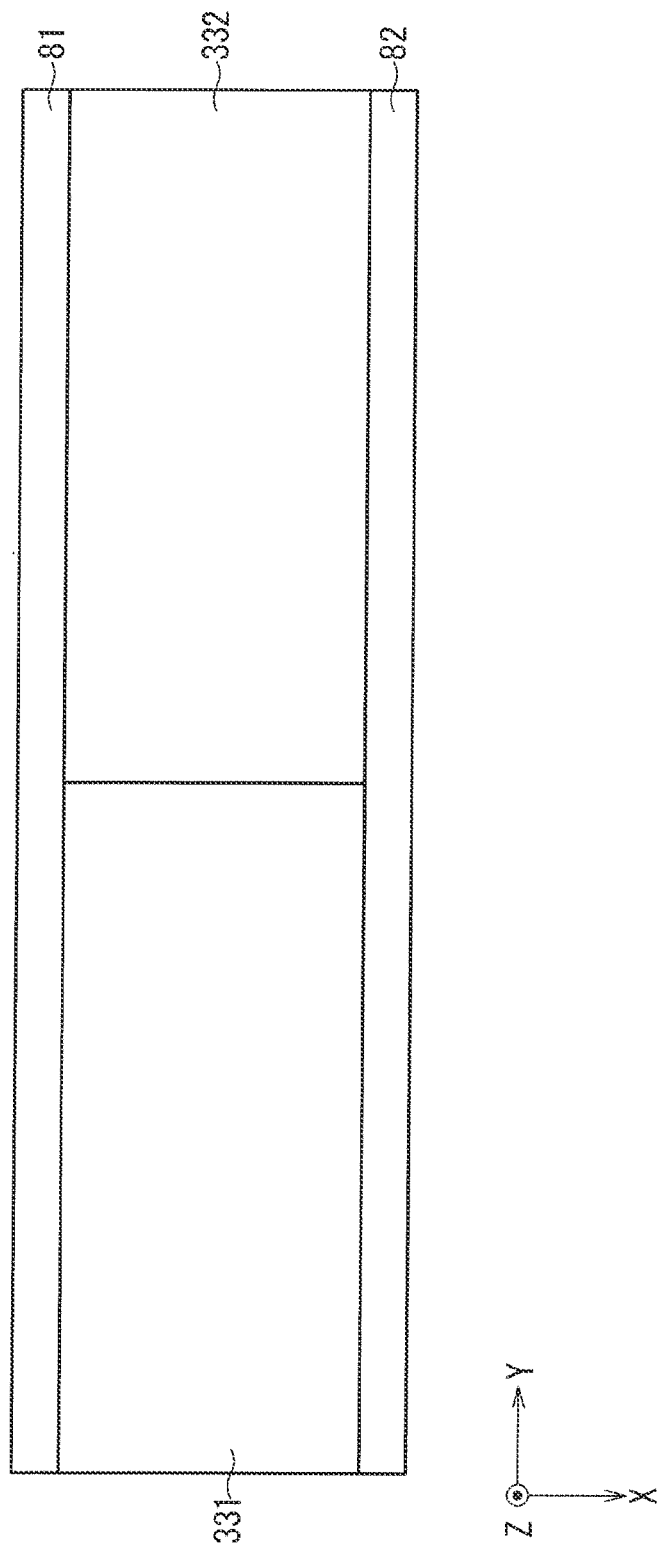
FIG. 20 is a cross-sectional view taken along a cross section D2 illustrated in FIG. 18.

FIG. 20 is a cross-sectional view taken along a cross section D2 illustrated in FIG. 18. As shown by an example in FIG. 20, the N type layer 331 is formed across the adjacent gate trench 81 and the gate trench 82 in a plan view. Similarly, the N type layer 332 is formed across the adjacent gate trench 81 and the gate trench 82 in the plan view.

<Method for Manufacturing Semiconductor Device>

Next, a method for manufacturing the structure illustrated in FIG. 18 will be described. FIGS. 21 to 26 are diagrams illustrating an example of the method for manufacturing the structure illustrated in FIG. 18. FIGS. 21 to 26 show an example of a process for forming a P type layer and an N type layer by four-time implantation. In each of FIGS. 21 to 26, a cross-sectional view of a cross section D3 in FIG. 18 is shown on the left side, and a cross-sectional view of a cross section D4 in FIG. 18 is shown on the right side.

Figure 21:
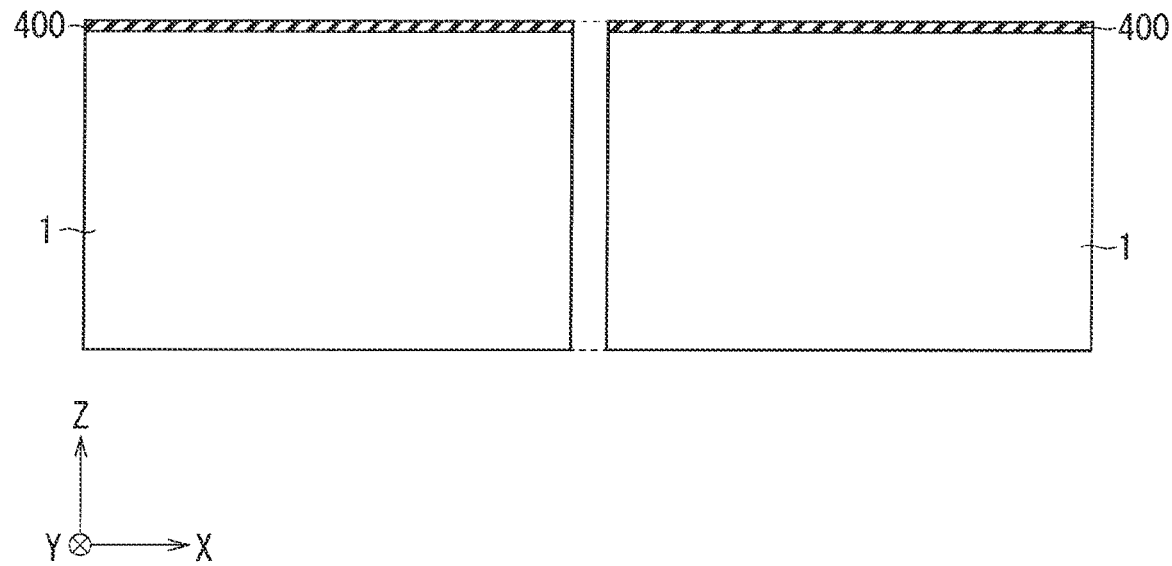
FIGS. 21 to 26 are views illustrating an example of a method for manufacturing the structure illustrated in FIG. 18.

First, as illustrated in FIG. 21, a silicon oxide film 400 is formed on the upper surface of the substrate 1.

Figure 22:
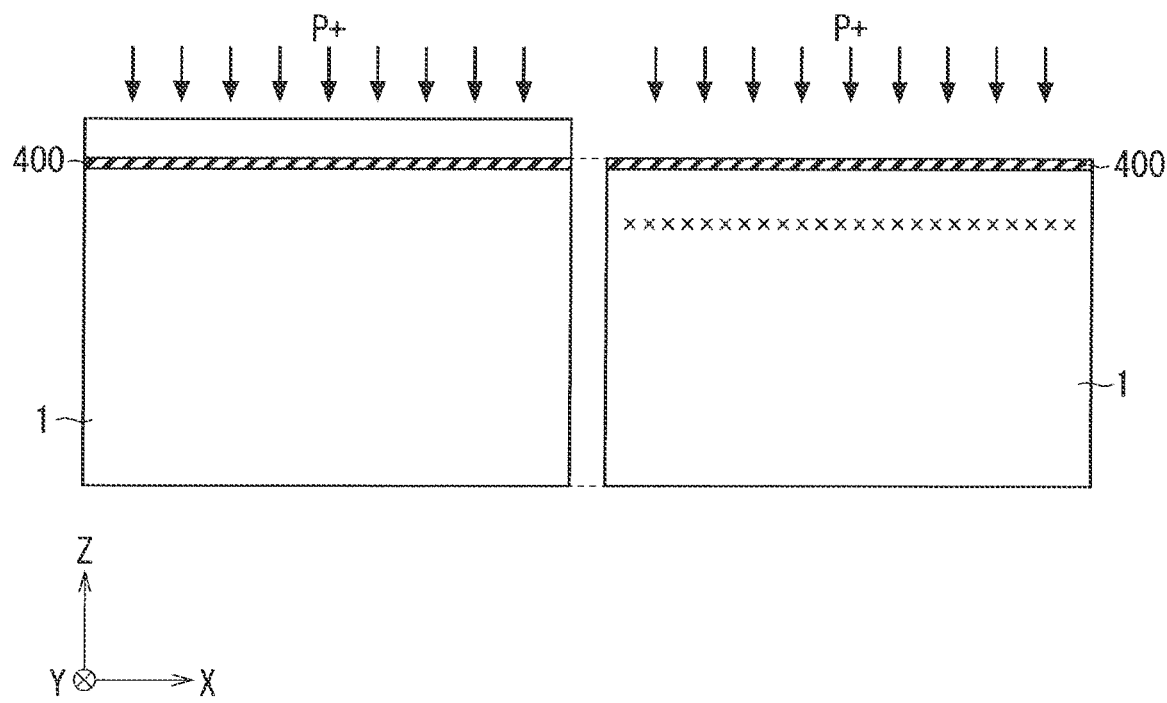

Next, as illustrated in FIG. 22, P+ ions are implanted into the upper surface of the substrate 1 with a place where the P type layer 321 and the N type layer 331 are formed masked (i.e., with the structure of the cross section D3 in the left figure masked).

Figure 23:
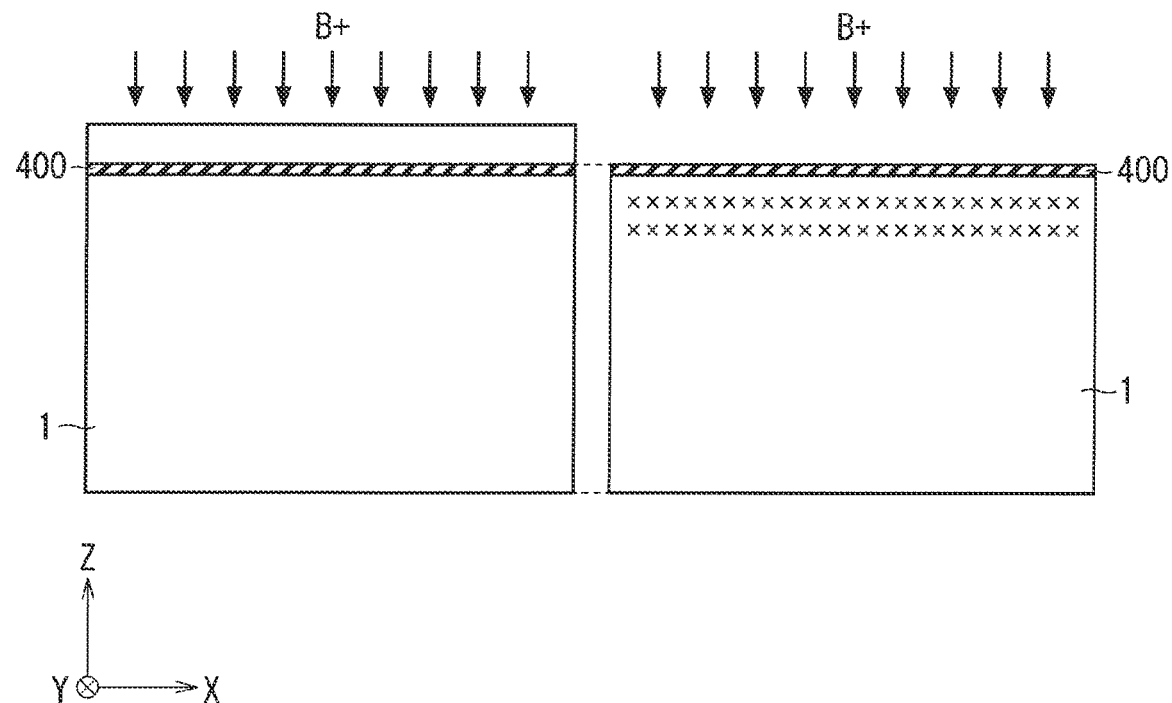

Next, as illustrated in FIG. 23, B+ ions are implanted into the upper surface of the substrate 1 with the place where the P type layer 321 and the N type layer 331 are formed are masked (i.e., with the structure of the cross section D3 in the left figure masked).

Figure 24:
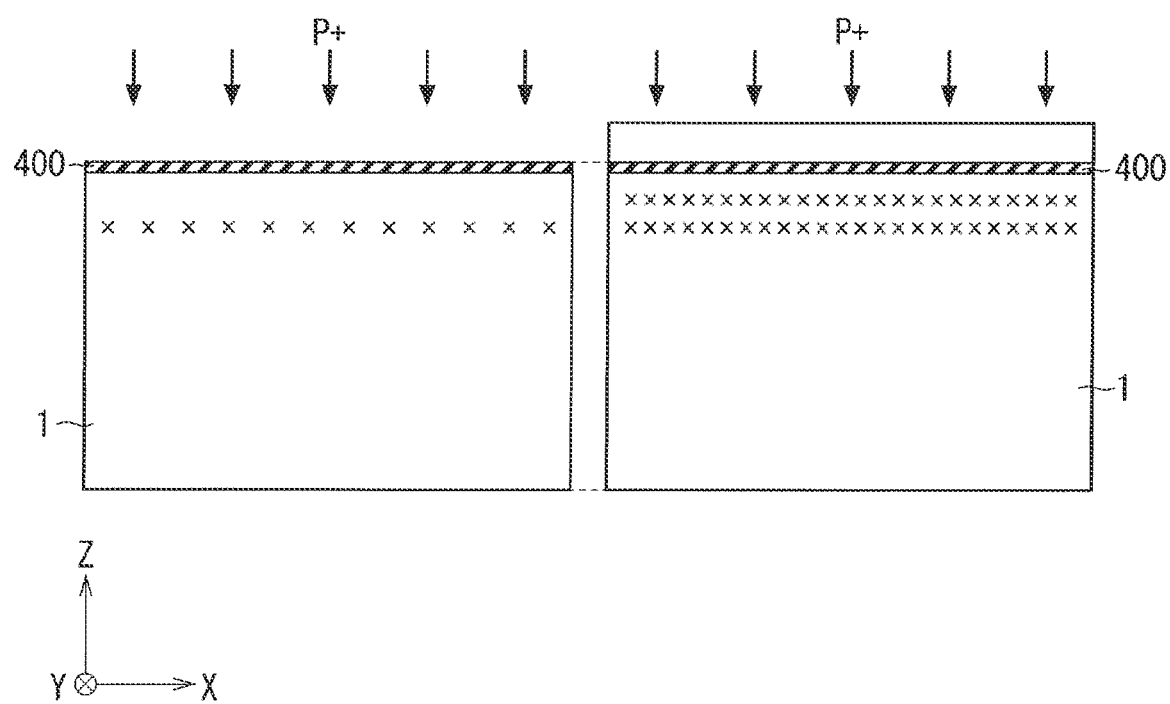

Next, as illustrated in FIG. 24, P+ ions are implanted into the upper surface of the substrate 1 with a place where the P type layer 322 and the N type layer 332 are formed masked (i.e., with the structure of the cross section D4 in the right figure masked). Note that the concentration of the P+ ion implantation in this step is lower than the concentration of the P+ ion implantation illustrated in FIG. 22.

Figure 25:
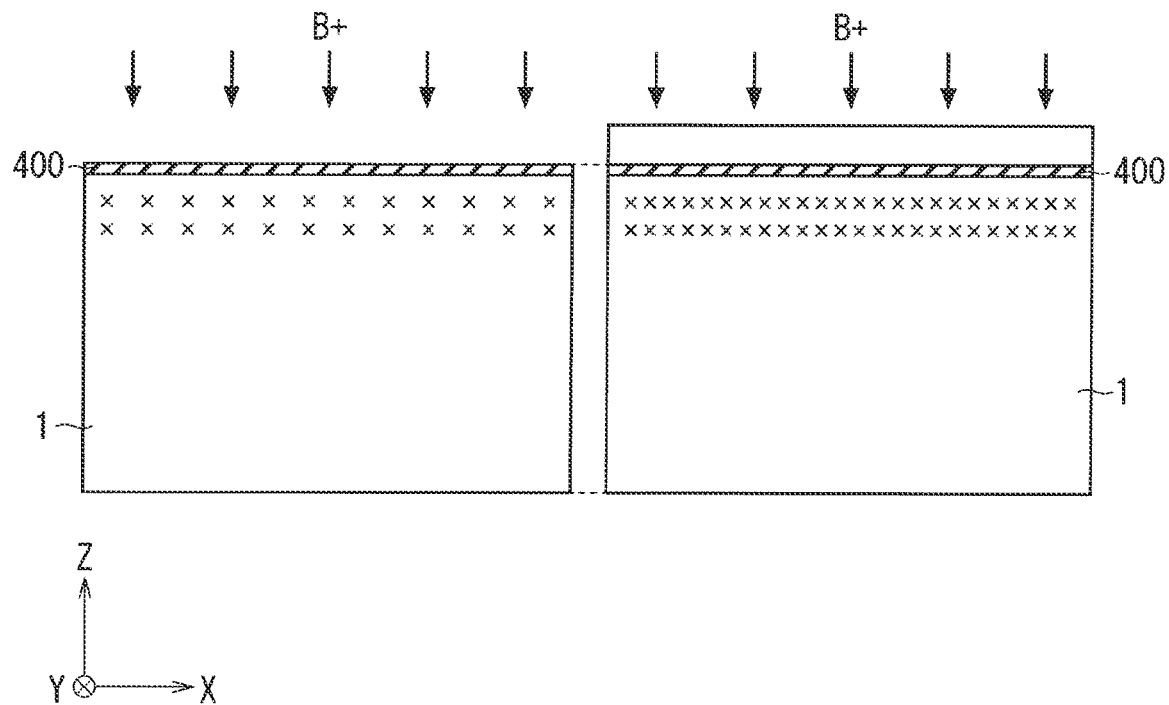

Next, as illustrated in FIG. 25, B+ ions are implanted into the upper surface of the substrate 1 with the place where the P type layer 322 and the N type layer 332 are formed are masked (i.e., with the structure of the cross section D4 in the right figure masked). Note that the concentration of B+ ion implantation in this step is lower than the concentration of B+ ion implantation illustrated in FIG. 23.

Figure 26:
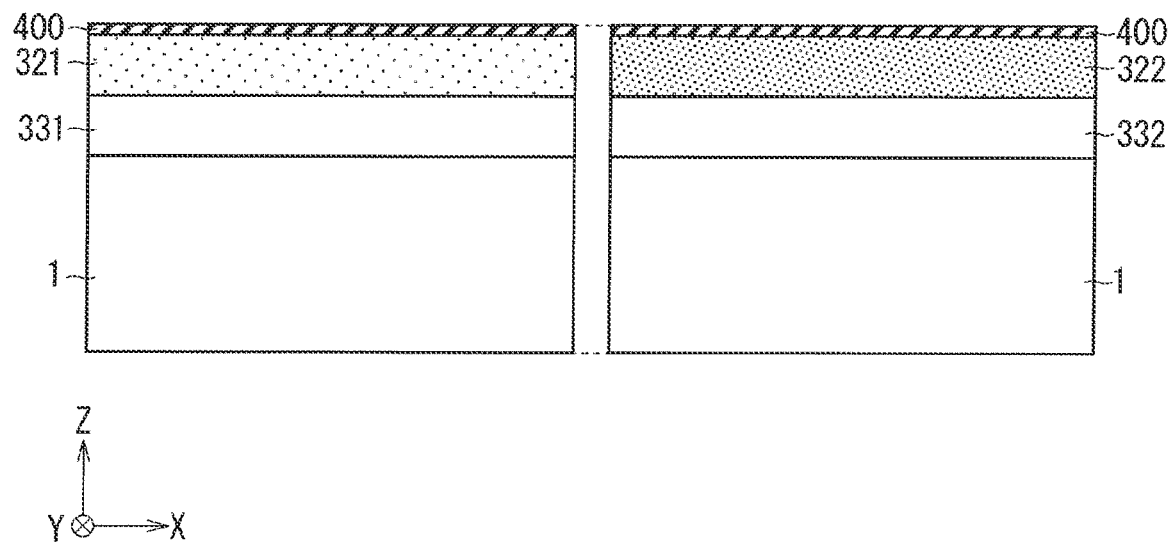

In this way, it is possible to manufacture a structure in which the P type layer 321 is formed on the surface layer of the N type layer 331 and the P type layer 322 is formed on the surface layer of the N type layer 332 as illustrated in FIG. 26.

In FIGS. 21 to 26, the cross section D3 is masked first, but the cross section D4 may be masked first. In FIGS. 21 to 26, P+ ions are implanted first, but B+ ions may be implanted first.

FIGS. 27 to 30 are views illustrating another example of the method for manufacturing the structure illustrated in FIG. 18. FIGS. 27 to 30 show an example of a process for forming a P type layer and an N type layer by two-time implantation. In each of FIGS. 27 to 30, a cross-sectional view of the cross section D3 in FIG. 18 is shown on the left side, and a cross-sectional view of the cross section D4 in FIG. 18 is shown on the right side.

Figure 27:
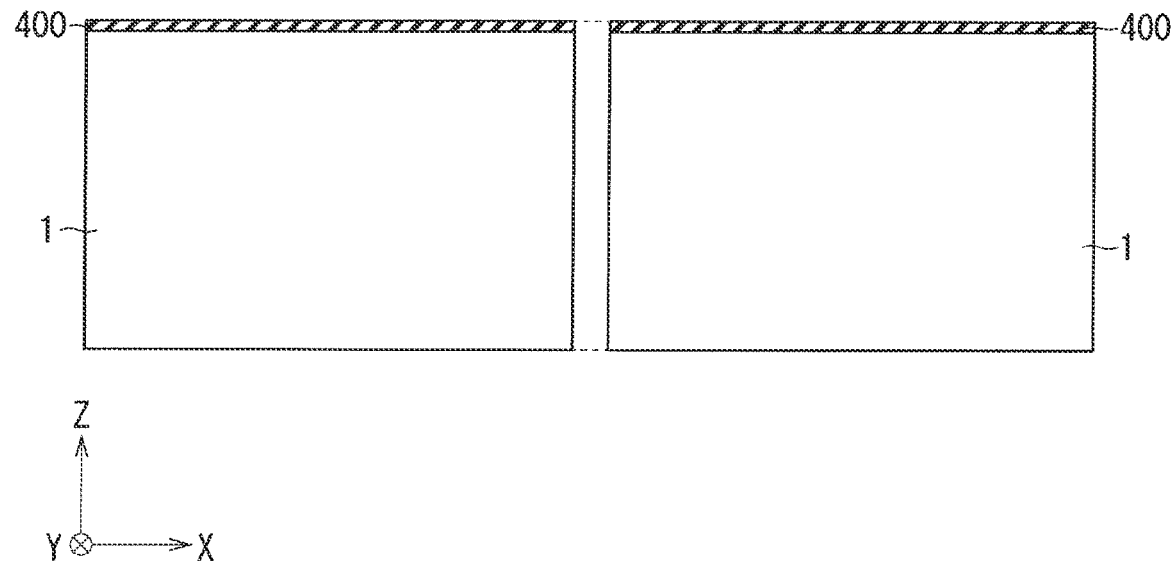
FIGS. 27 to 30 are views illustrating another example of the method for manufacturing the structure illustrated in FIG. 18.

First, as illustrated in FIG. 27, a silicon oxide film 400 is formed on the upper surface of the substrate 1.

Figure 28:
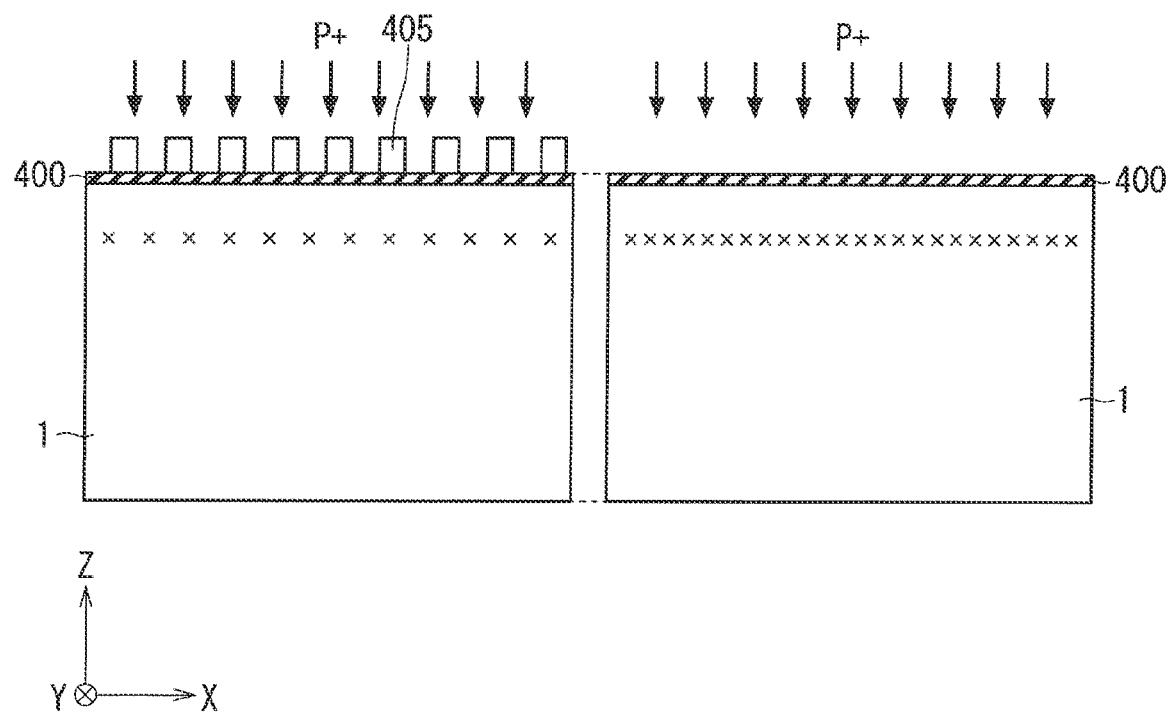

Next, as illustrated in FIG. 28, P+ ions are implanted into the upper surface of the substrate 1 with a place where the P type layer 321 and the N type layer 331 are formed is partially masked by an implantation mask 405 (i.e., only the structure of the cross section D3 in the left figure is covered by a photoresist mask with a stripe pattern or a dot pattern). By the implantation, P+ ions are implanted into the structure of the cross section D3 covered by the implantation mask 405 at a concentration lower than that of the structure of the cross section D4 not covered by the implantation mask 405. In this manner, the N type layer 331 is formed on the surface layer of the substrate 1 having the structure of the cross section D3, and the N type layer 332 is formed on the surface layer of the substrate 1 having the structure of the cross section D4, simultaneously.

Figure 29:
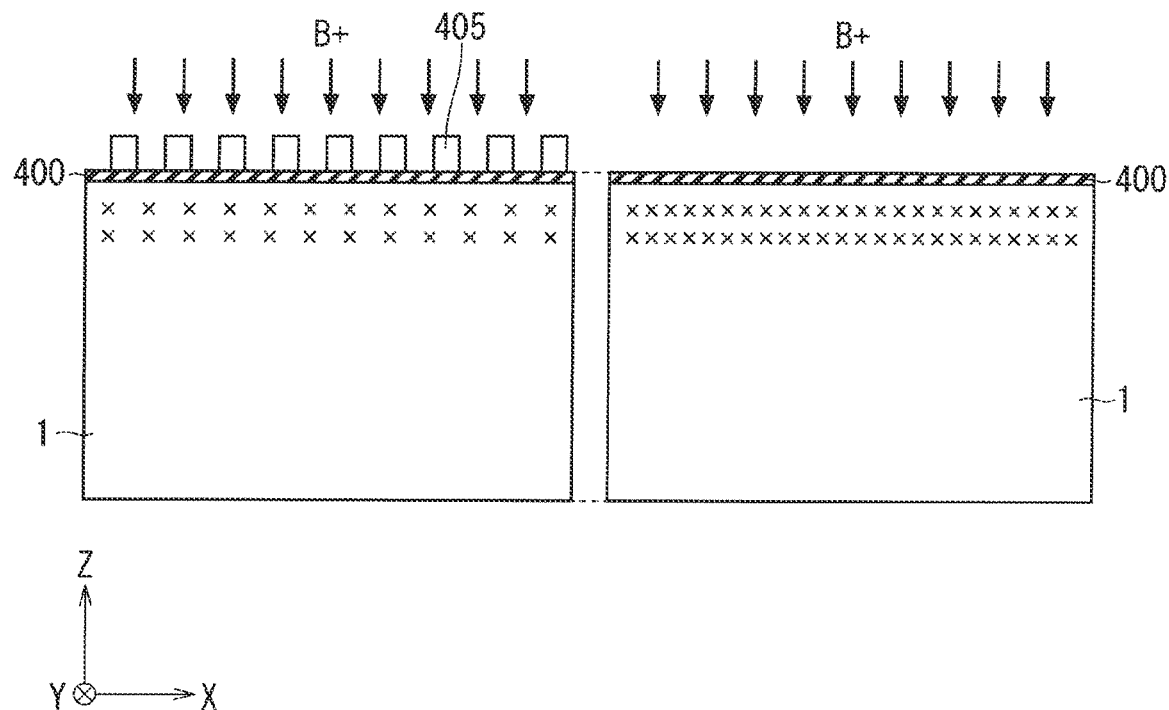

Next, as illustrated in FIG. 29, B+ ions are implanted into the upper surface of the substrate 1 with the place where the P type layer 321 and the N type layer 331 are formed is partially masked by the implantation mask 405 (i.e., only the structure of the cross section D3 in the left figure is covered by a photoresist mask with a stripe pattern or a dot pattern). By the implantation, B+ ions are implanted into the structure of the cross section D3 covered by the implantation mask 405 at a concentration lower than that of the structure of the cross section D4 not covered by the implantation mask 405. In this manner, the P type layer 321 is formed on the surface layer of the N type layer 331 having the structure of the cross section D3, and the P type layer 322 is formed on the surface layer of the N type layer 332 having the structure of the cross section D4, simultaneously.

Figure 30:
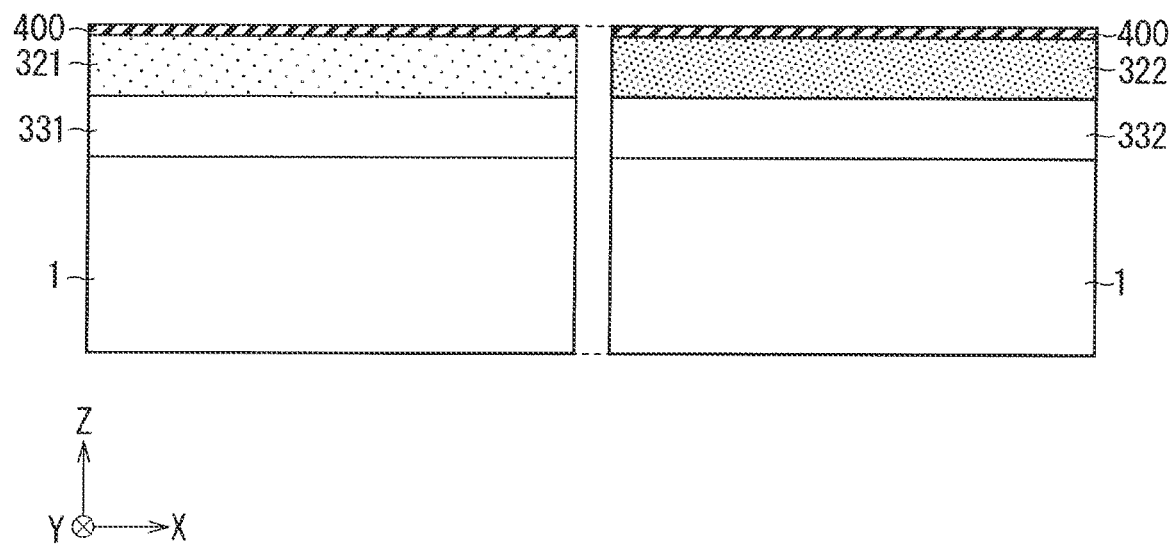

As described above, a structure in which the P type layer 321 is formed on the surface layer of the N type layer 331 and the P type layer 322 is formed on the surface layer of the N type layer 332 as illustrated in FIG. 30 can be manufactured by a small number of processes.

In FIGS. 27 to 30, P+ ions are implanted first, but B+ ions may be implanted first.

FIGS. 31 to 42 are diagrams illustrating an example of the method for manufacturing the structure illustrated in FIG. 18. FIGS. 31 to 42 show an example of a process for forming a trench structure by two-time etching. In each of FIGS. 31 to 42, a cross-sectional view of the cross section D3 in FIG. 18 is shown on the left side, and a cross-sectional view of the cross section D4 in FIG. 18 is shown on the right side.

Figure 31:
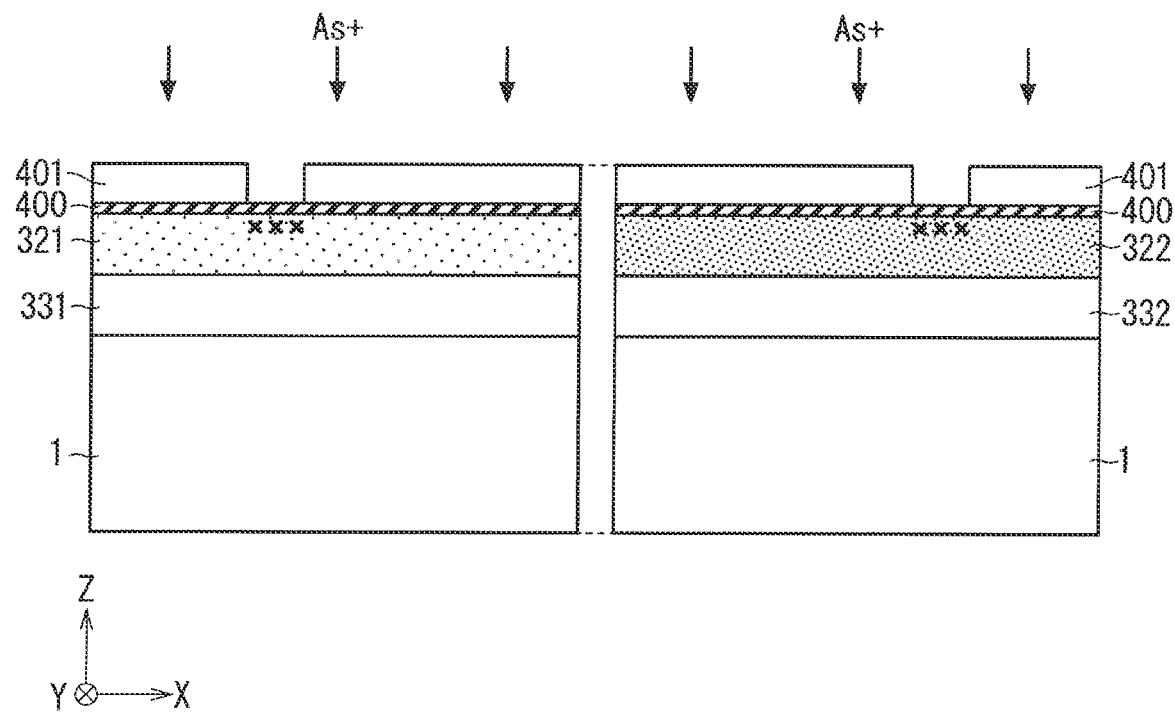

First, as illustrated in FIG. 31, a silicon oxide film 400 is formed on the upper surface of the substrate 1. Then, after a resist 401 having an opening is formed on the upper surface of the silicon oxide film 400, As+ ions are implanted.

Figure 32:
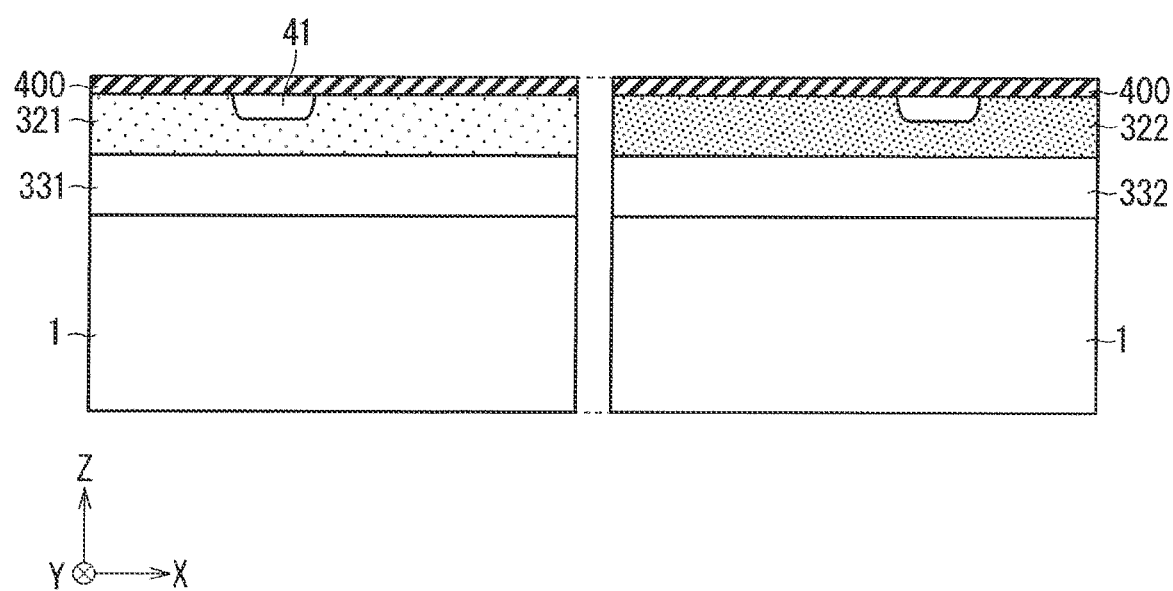

Next, as illustrated in FIG. 32, the implanted ions are diffused by high-temperature treatment (drive-in).

Figure 33:
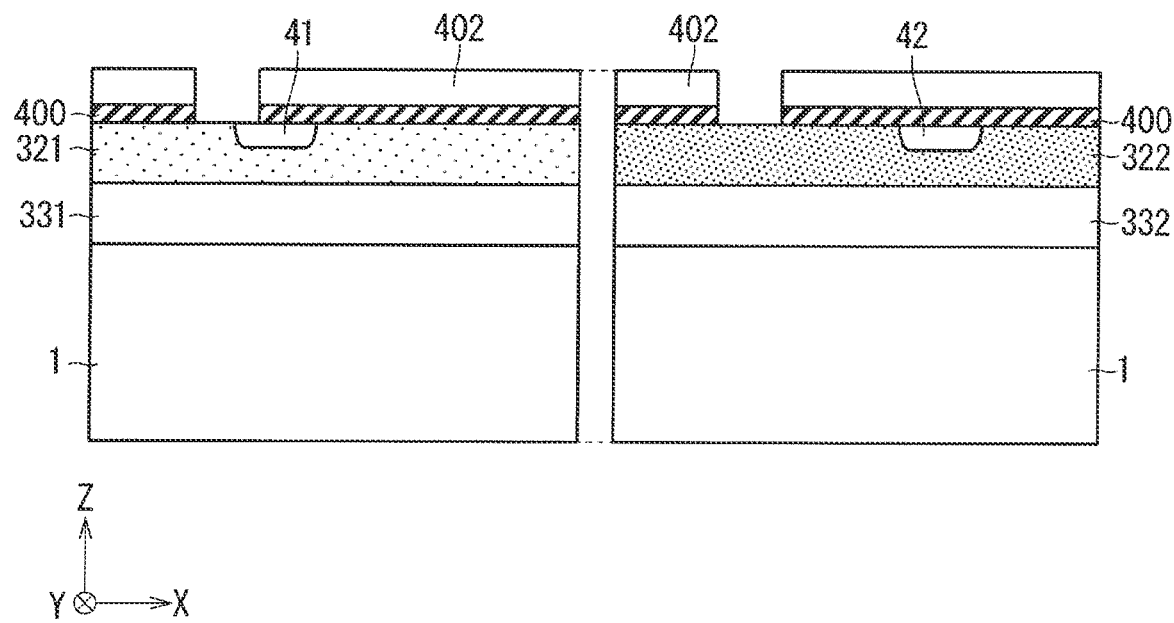

Next, as illustrated in FIG. 33, a resist 402 having an opening in each of the cross section D3 and the cross section D4 is formed on the upper surface of the silicon oxide film 400, and the silicon oxide film 400 is etched.

Figure 34:
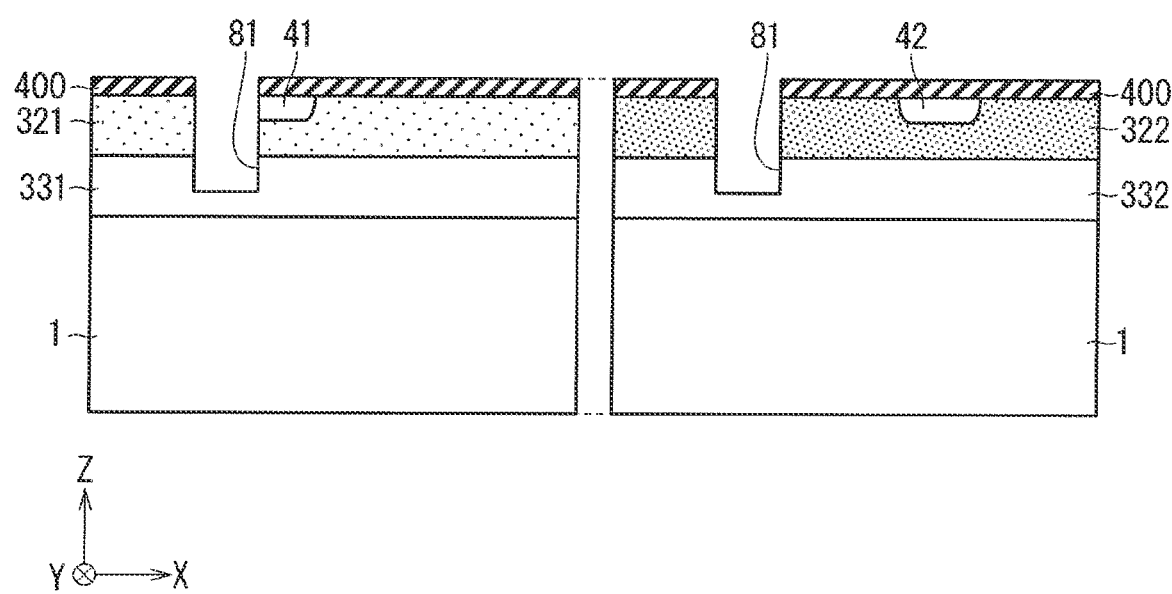

Next, as illustrated in FIG. 34, a gate trench 81 is formed using a resist 402. Further, an N+ type emitter layer 41 is formed.

Figure 35:
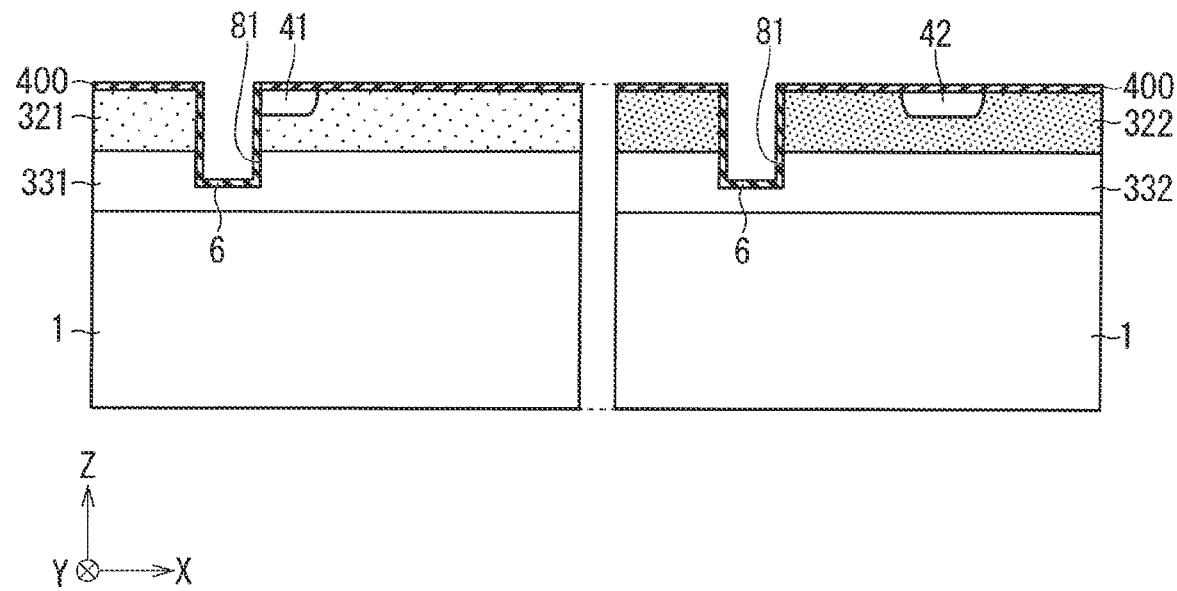

Next, as illustrated in FIG. 35, a gate oxide film 6 is formed on the inside (the side surface and bottom surface) of the gate trench 81.

Figure 36:
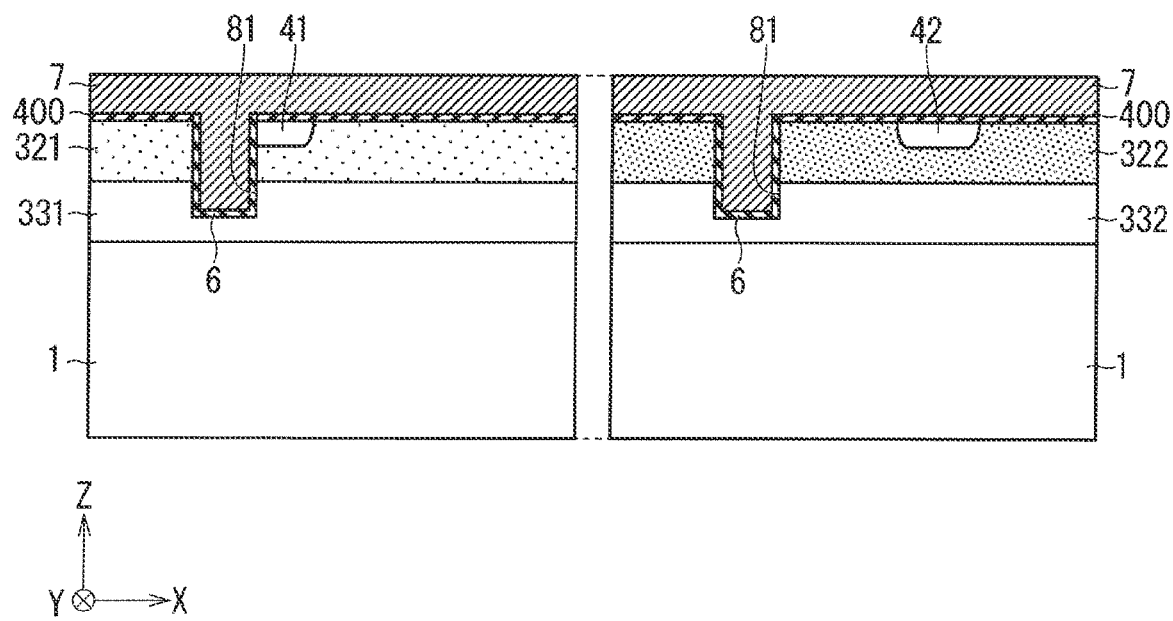

Next, as illustrated in FIG. 36, polysilicon is deposited on the upper surface of the substrate 1 including the inside (the side surface and bottom surface) of the gate trench 81.

Figure 37:
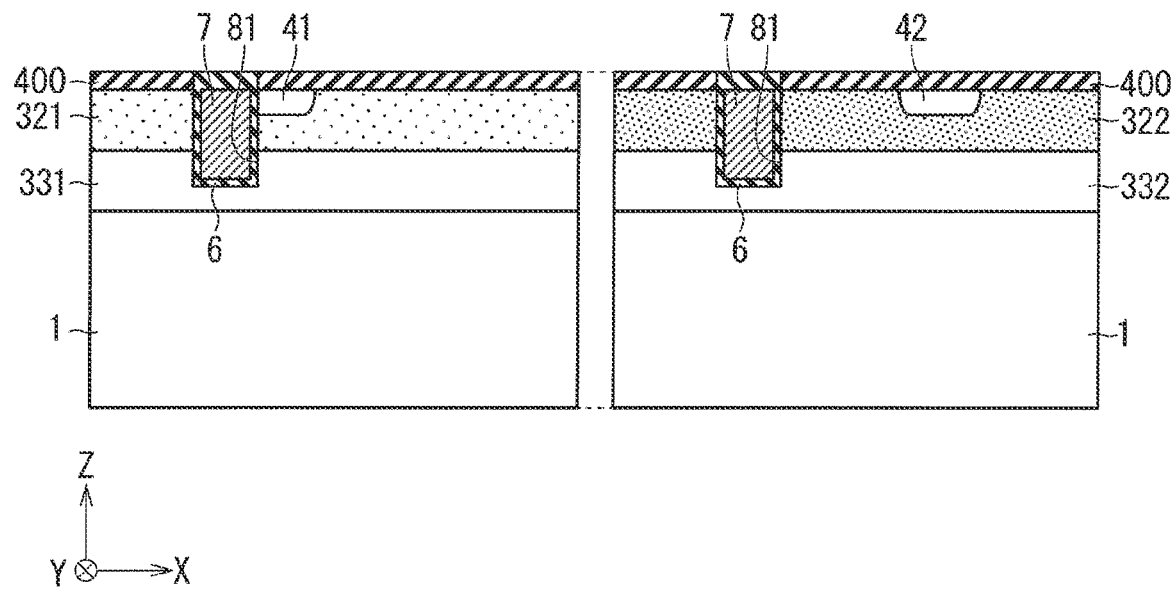

Next, as illustrated in FIG. 37, etching back is performed so as to leave polysilicon buried in the gate trench 81, thereby forming a buried layer 7 and oxidizing the upper surface of the buried layer 7.

Figure 38:
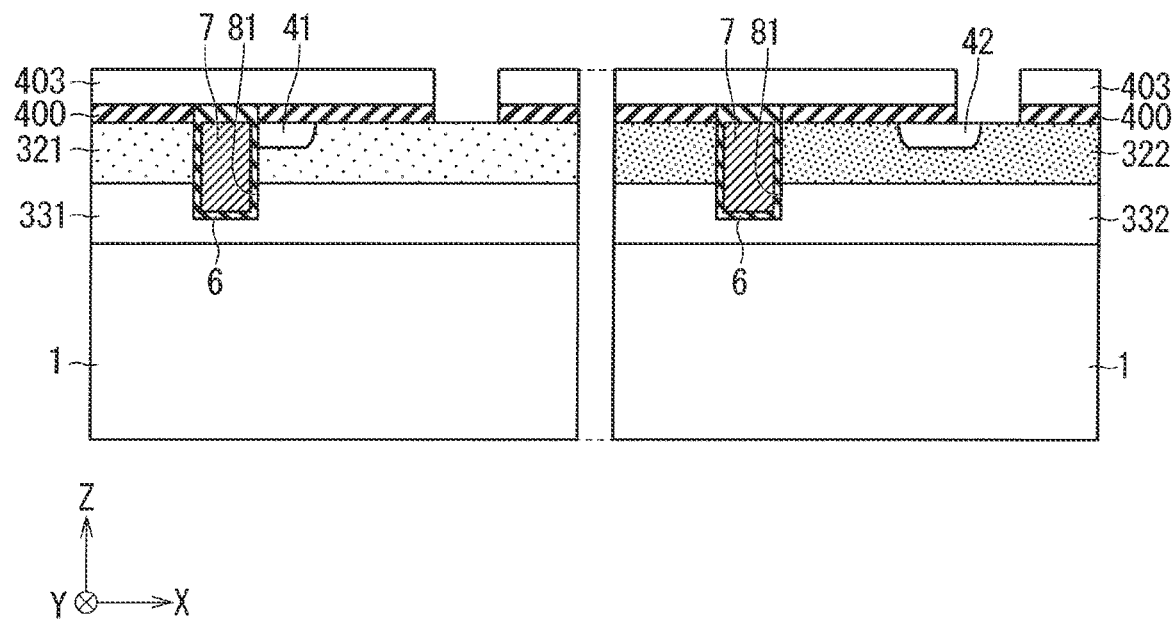

Next, as illustrated in FIG. 38, a resist 403 having an opening in each of the cross section D3 and the cross section D4 is formed on the upper surface of the silicon oxide film 400, and the silicon oxide film 400 is etched. Note that the position of the opening in the resist 403 is different from the position of the opening in the resist 402.

Figure 39:
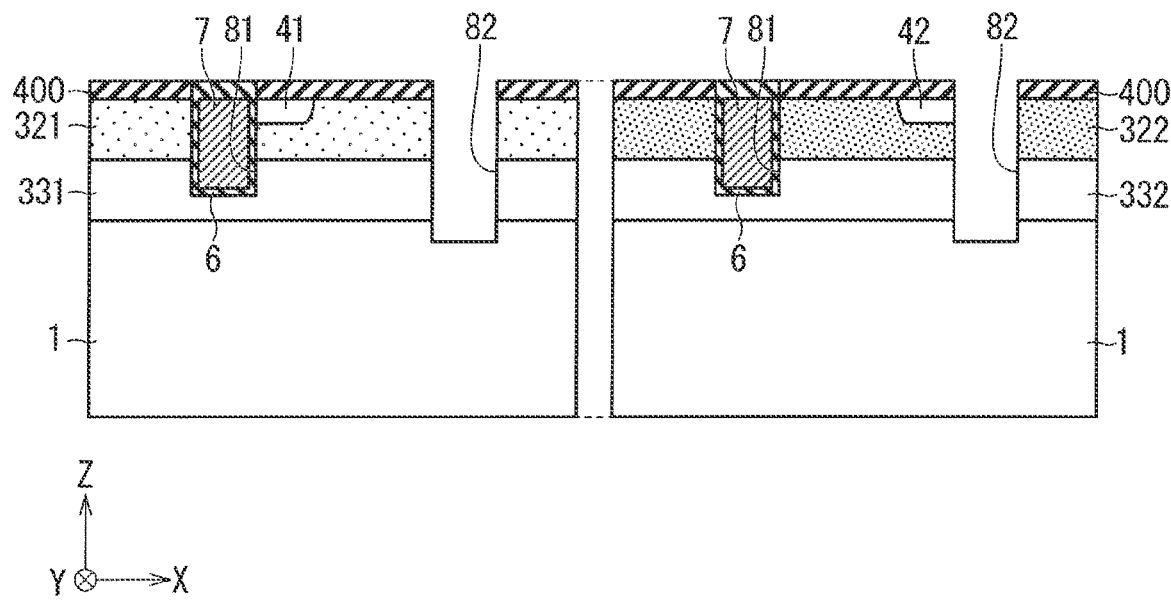

Next, as illustrated in FIG. 39, a gate trench 82 is formed using a resist 403. In addition, an N+ type emitter layer 42 is formed.

Figure 40:
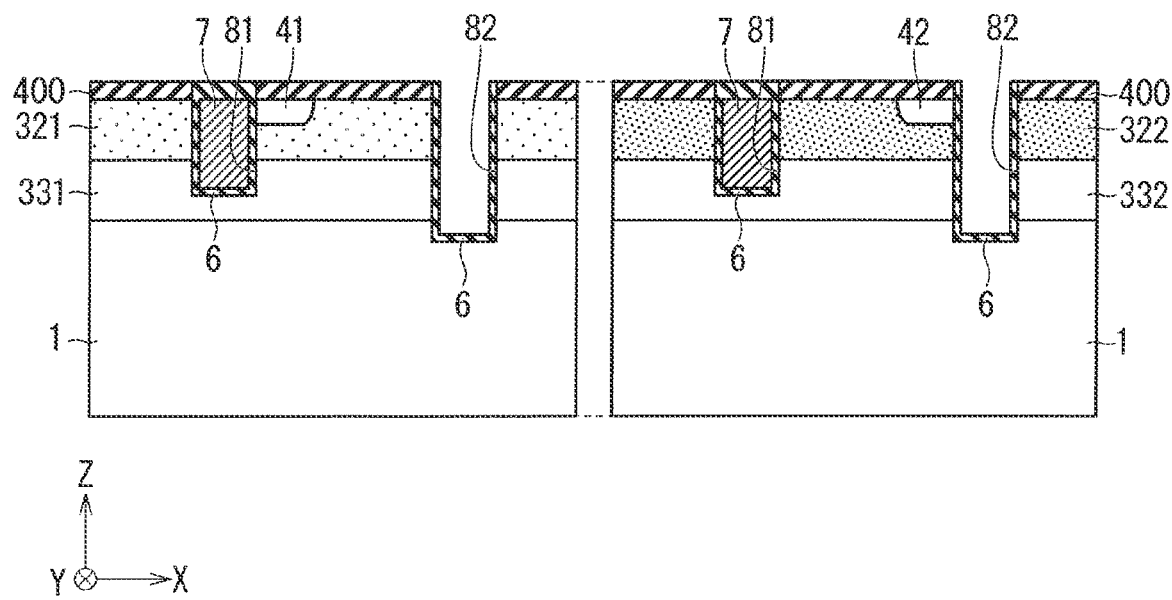

Next, as illustrated in FIG. 40, a gate oxide film 6 is formed on the inside (the side surface and bottom surface) of the gate trench 82.

Next, as illustrated in FIG. 41, polysilicon is deposited on the upper surface of the substrate 1 including the inside (the side surface and bottom surface) of the gate trench 82.

Next, as illustrated in FIG. 42, etching back is performed so as to leave polysilicon buried in the gate trench 82, thereby forming a buried layer 7 and oxidizing the upper surface of the buried layer 7.

In FIGS. 31 to 42, the gate trench 81 is formed first, but the gate trench 82 may be formed first. The N+ type emitter layer 41 and the N+ type emitter layer 42 may be formed after the corresponding trenches are formed.

FIGS. 43 to 49 are views illustrating another example of the method for manufacturing the structure illustrated in FIG. 18. FIGS. 43 to 49 show an example of a process for forming a trench structure by one-time etching. In each of FIGS. 43 to 49, a cross-sectional view of the cross section D3 in FIG. 18 is shown on the left side, and a cross-sectional view of the cross section D4 in FIG. 18 is shown on the right side.

Figure 43:
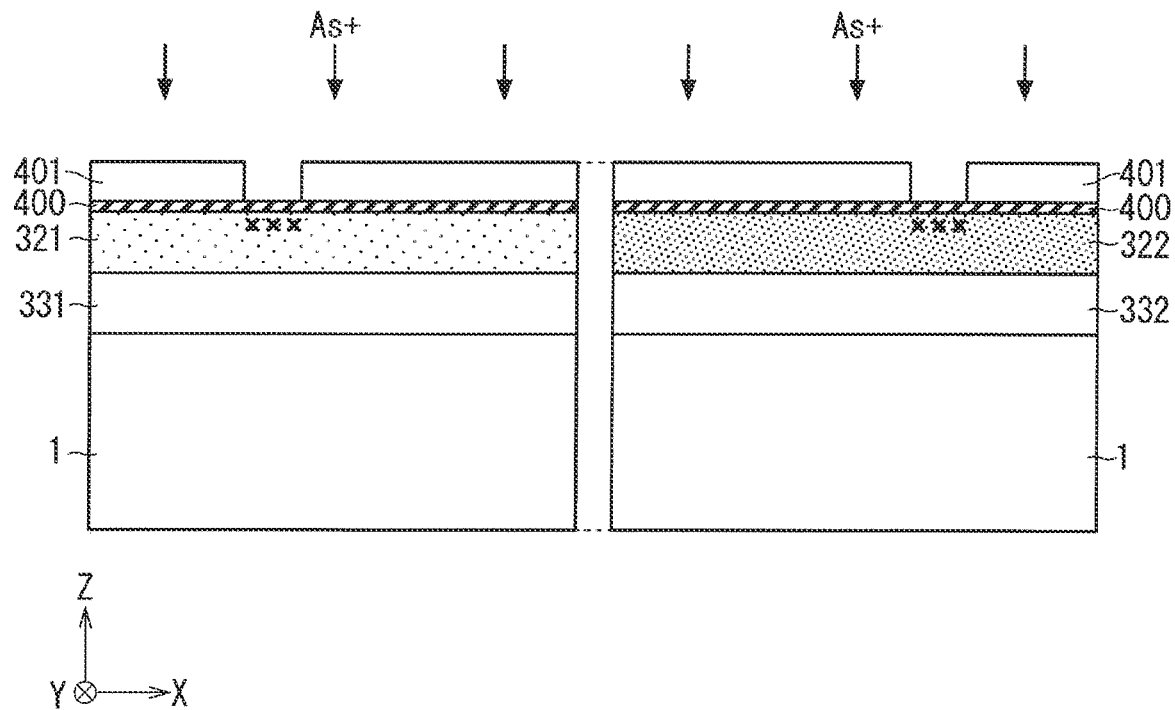
FIGS. 43 to 49 are views illustrating another example of the method for manufacturing the structure illustrated in FIG. 18.

First, as illustrated in FIG. 43, a silicon oxide film 400 is formed on the upper surface of the substrate 1. Then, after a resist 401 having an opening is formed on the upper surface of the silicon oxide film 400, As+ ions are implanted.

Figure 44:
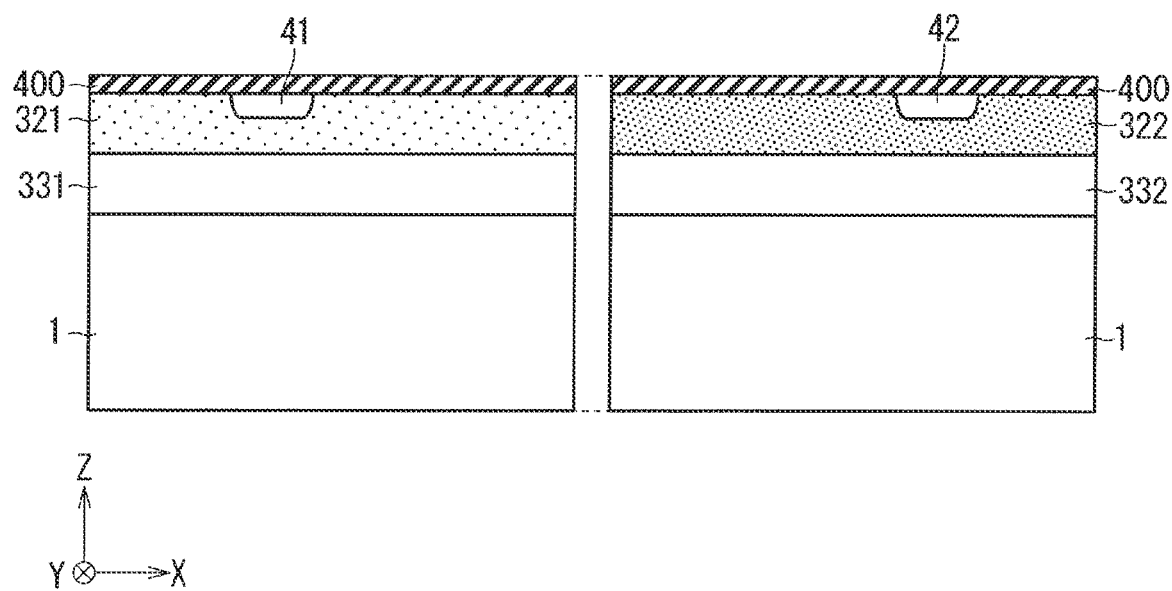

Next, as illustrated in FIG. 44, the implanted ions are diffused by high-temperature treatment (drive-in).

Figure 45:
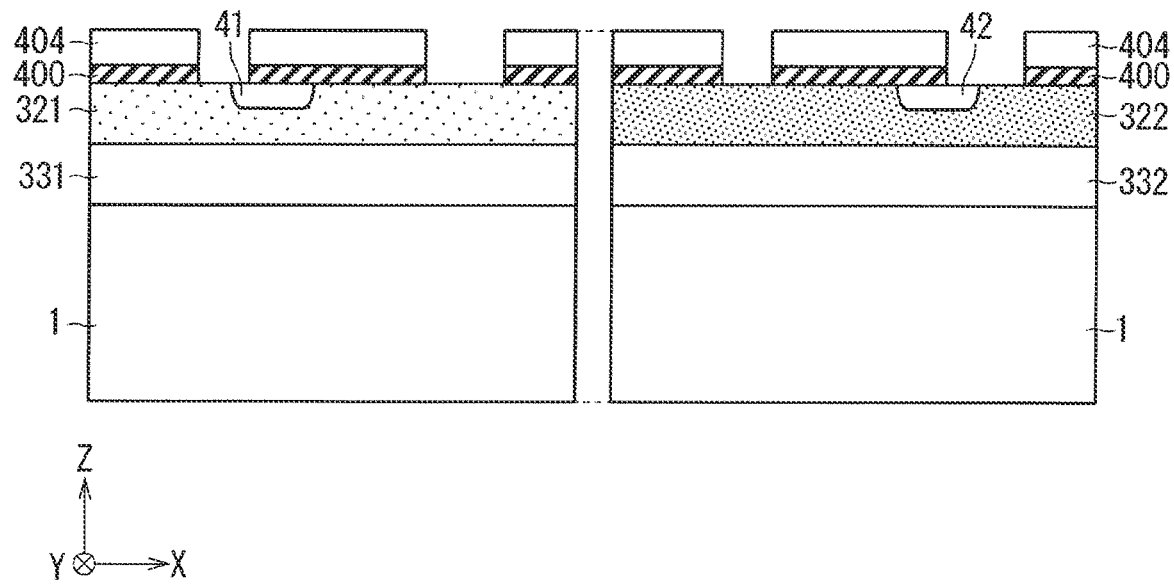

Next, as illustrated in FIG. 45, a resist 404 having a plurality of openings with different opening widths in each of the cross section D3 and the cross section D4 is formed on the upper surface of the silicon oxide film 400, and the silicon oxide film 400 is etched at the openings having the respective opening widths.

Figure 46:
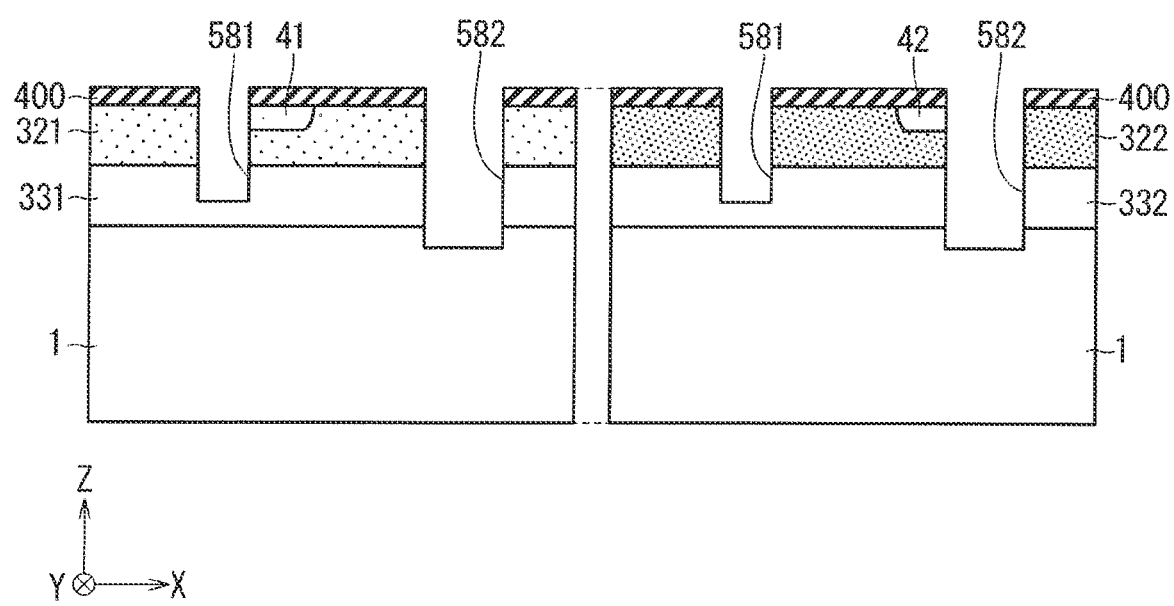

Next, as illustrated in FIG. 46, a gate trench 581 and a gate trench 582 are simultaneously formed using a resist 404. In addition, an N+ type emitter layer 41 and an N+ type emitter layer 42 are formed.

Here, in the resist 404, the width of the opening for forming the gate trench 581 is smaller than the width of the opening for forming the gate trench 582. As a result, the width of the gate trench 581 becomes smaller than the width of the gate trench 582. The depth of the bottom surface of the gate trench 581 becomes smaller than the depth of the bottom surface of the gate trench 582 due to the correlation between the opening width and the etching rate.

Figure 47:
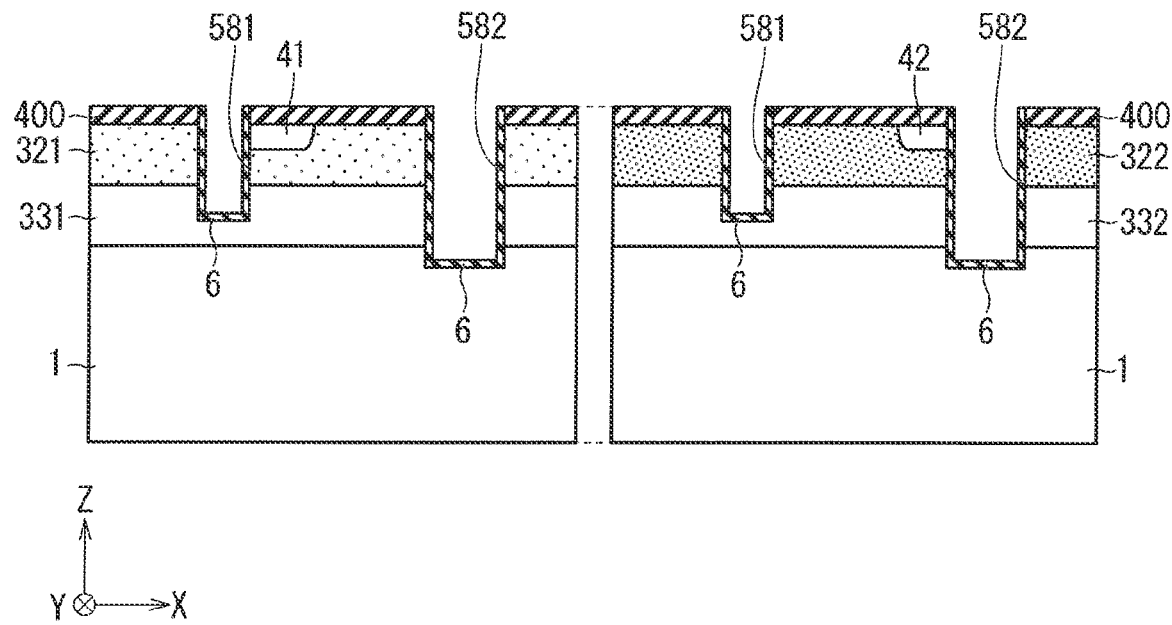

Next, as illustrated in FIG. 47, a gate oxide film 6 is formed on the inside (the side surface and bottom surface) of the gate trench 81 and on the inside (the side surface and bottom surface) of the gate trench 82.

Figure 48:
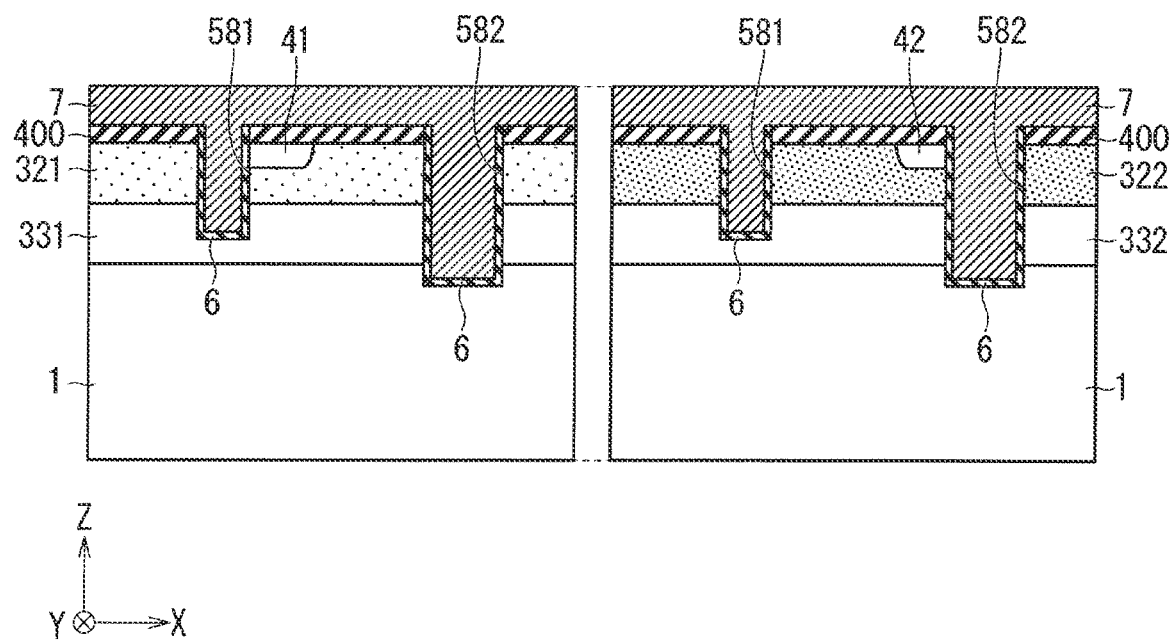

Next, as illustrated in FIG. 48, polysilicon is deposited on the upper surface of the substrate 1 including the inside (the side surface and bottom surface) of the gate trench 81 and the inside (the side surface and bottom surface) of the gate trench 82.

Figure 49:
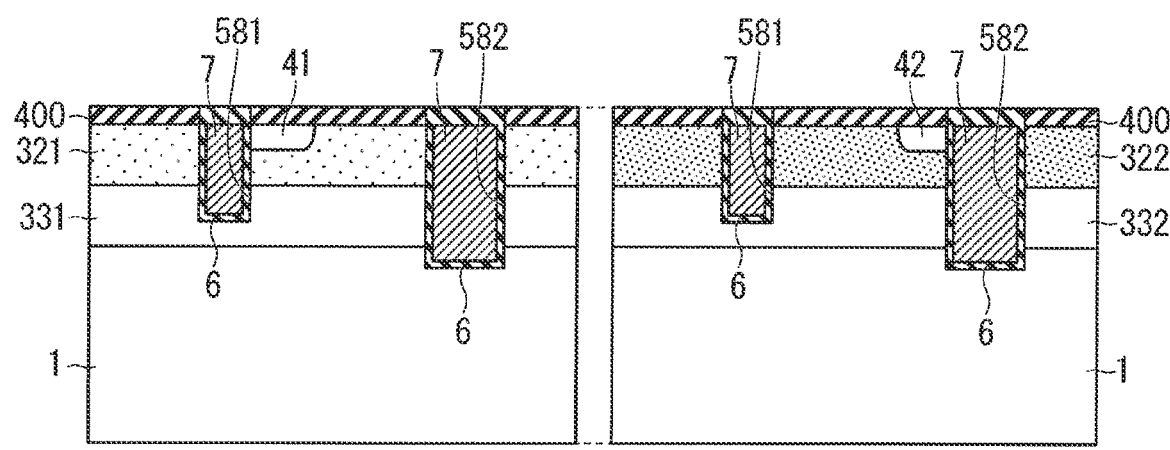

Next, as illustrated in FIG. 49, etching back is performed so as to leave polysilicon buried in the gate trench 81 and the gate trench 82, and a buried layer 7 is formed inside the gate trench 81 and the gate trench 82, and the upper surface of each buried layer 7 is oxidized.

Figure 50:
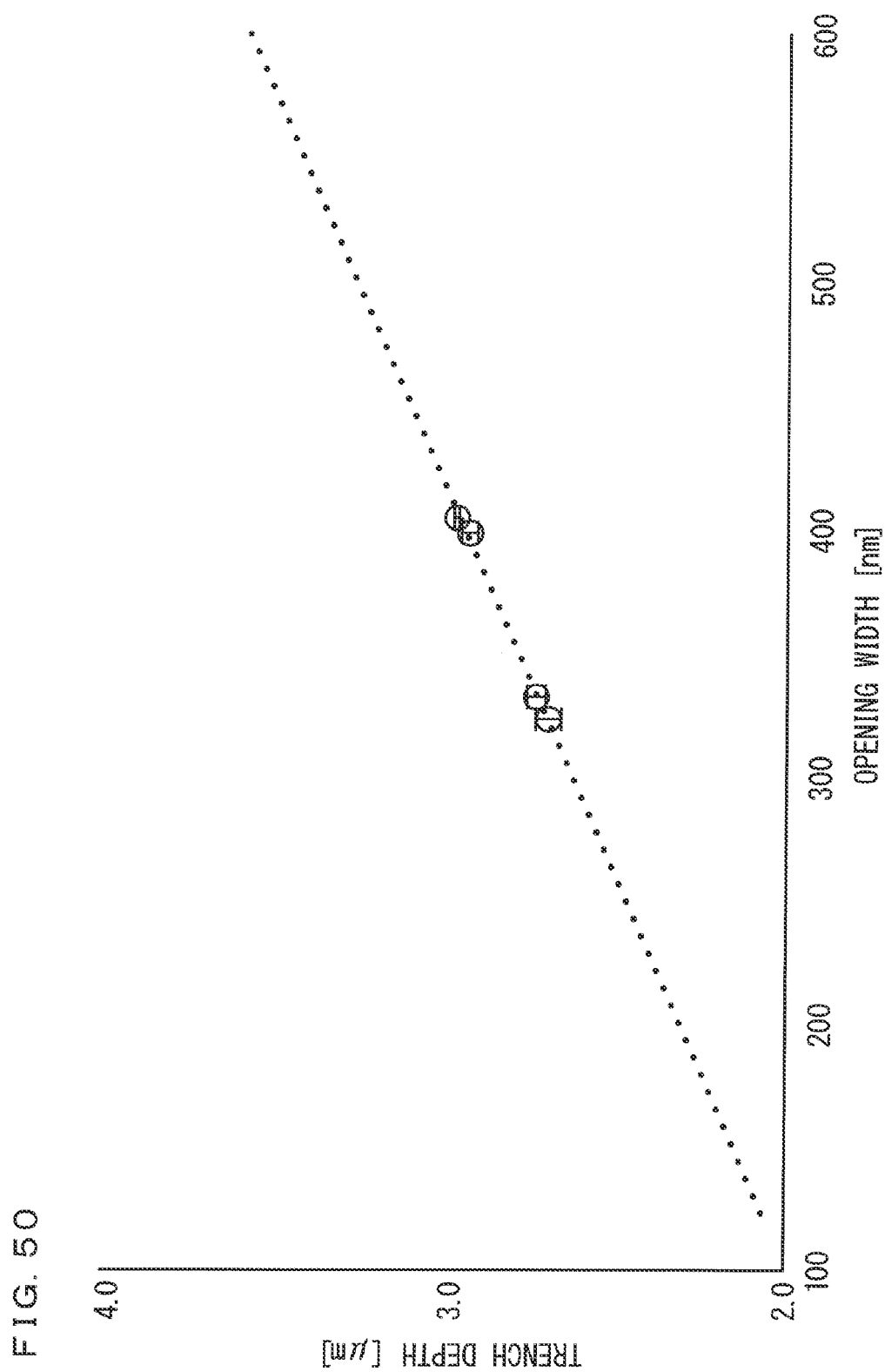
FIG. 50 is a diagram illustrating a correlation between an opening width of a trench and a trench depth at the bottom surface.

FIG. 50 is a diagram illustrating a correlation between the opening width of the trench and the trench depth at the bottom surface. In FIG. 50, the vertical axis represents the depth [μm] of the trench, and the horizontal axis of the trench represents the opening width [nm].

As illustrated in FIG. 50, it can be seen that the depth of the trench increases as the opening width of the trench increases.

Figure 51:
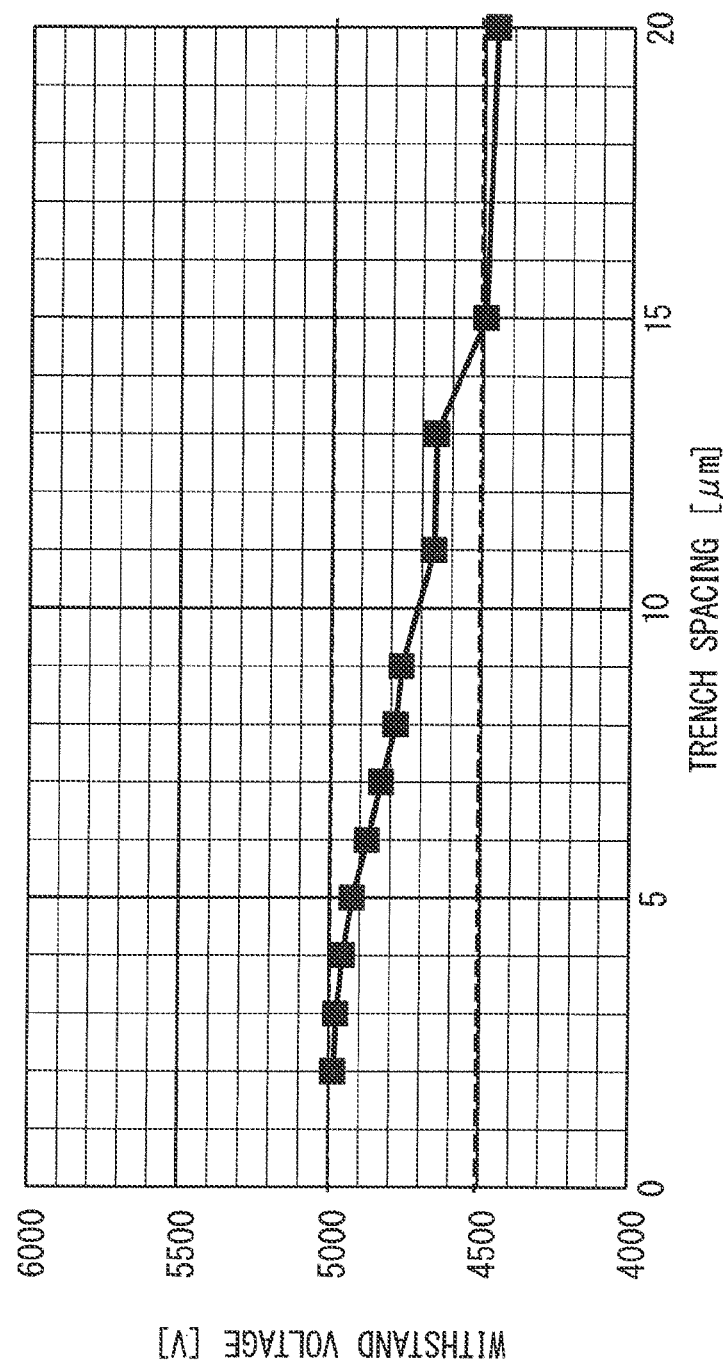
FIG. 51 is a diagram illustrating a relationship between a withstand voltage and a trench spacing of the structure illustrated in FIGS. 1 to 4.

FIG. 51 is a diagram illustrating a relationship between the withstand voltage and the trench spacing of the structure illustrated in FIGS. 1 to 4. In FIG. 51, the vertical axis represents the withstand voltage [V] at 25° C., and the horizontal axis represents the spacing [μm] between the trenches. Here, the spacing between the trenches corresponds to the spacing between the adjacent gate trenches 82, the spacing between the adjacent dummy trenches 9, or the spacing between the adjacent gate trench 82 and dummy trenches 9.

As illustrated in FIG. 51, it can be seen that the larger the spacing between the gate trenches 82, the lower the withstand voltage. For example, when the amount of implantation of the N type layer 31 and the N type layer 32 is 0, and the trench spacing is 15 μm, the withstand voltage is about 90% of the target withstand voltage.

When the spacing between the gate trenches 82 is excessively wide, the field plate effect between the gate trenches 82 weakens, and the electric field concentrates near the bottom surface of the gate trench 82. As a result, the withstand voltage decreases.

As the amount of implantation (dose) of the N type layer 31 and the N type layer 32 increases, the dependence of the withstand voltage on the trench spacing becomes more sensitive. That is, when the semiconductor device includes the N type layer 31 and the N type layer 32, the trench spacing needs to be smaller than 15 μm so as to maintain 90% or more of the target withstand voltage.

<Effects Produced by Plurality of Preferred Embodiments Described Above>

Next, examples of the effects produced by the plurality of preferred embodiments described above will be shown. In the following description, the effects will be described based on the specific configuration shown by an example in each of the plurality of preferred embodiments described above, but the configuration may be replaced with another specific configuration shown by an example in the present specification in a range where similar effects are produced. That is, in the following description, for convenience, only one of the associated specific configurations may be described as a representative, but the specific configuration described as a representative may be replaced with another specific configuration associated.

Further, the replacement may be performed across the plurality of preferred embodiments. That is, there may be a case where similar effects are produced by combining the respective configurations shown by examples in different preferred embodiments.

According to the preferred embodiment described above, a semiconductor device includes a semiconductor substrate of a first conductivity type (N type), an N type first semiconductor layer, a first impurity layer of a second conductivity type (P type), a P type second impurity layer, a first trench, at least one second trench, a first electrode layer, a second electrode layer, a first gate electrode, a second gate electrode, a P type third impurity layer, an N type second semiconductor layer, and an N type third semiconductor layer. Here, the semiconductor substrate corresponds to, for example, the substrate 1. The first semiconductor layer also corresponds to, for example, at least one of the N type layer 3, the N type layer 31, the N type layer 32, the N type layer 331, the N type layer 332, and the like. The first impurity layer corresponds to, for example, the P type layer 21, the P type layer 321, and the like. The second impurity layer corresponds to, for example, the P type layer 22, the P type layer 322, and the like. The first trench corresponds to, for example, the gate trench 81, the gate trench 581, and the like. The second trench corresponds to, for example, the gate trench 82, the gate trench 582, and the like. The first electrode layer corresponds to, for example, the buried layer 7. The second electrode layer corresponds to, for example, the buried layer 7. The first gate electrode corresponds to, for example, the gate electrode G1. The second gate electrode corresponds to, for example, the gate electrode G2. The third impurity layer corresponds to, for example, the P+ type emitter layer 5. The second semiconductor layer corresponds to, for example, the N+ type emitter layer 41. The third semiconductor layer corresponds to, for example, the N+ type emitter layer 42. The N type layer 3 is provided on the surface layer of the substrate 1. The P type layer 21 and the P type layer 22 are selectively provided on the surface layer of the N type layer 3. The gate trench 81 is provided from the upper surface of the P type layer 21 to the inside of the N type layer 3. The gate trench 82 is provided from the upper surface of the P type layer 22 to a position below the lower surface of the N type layer 3. The buried layer 7 is surrounded by the gate oxide film 6 and buried in each of the gate trench 81 and the gate trench 82. The gate electrode G1 is connected to the buried layer 7 in the gate trench 81. The gate electrode G2 is connected to the buried layer 7 in the gate trench 82. The P+ type emitter layer 5 is provided across the surface layer of the P type layer 21 and the surface layer of the P type layer 22. The N+ type emitter layer 41 is provided on the surface layer of the P type layer 21. The N+ type emitter layer 41 is disposed to be interposed between the gate trench 81 and the P+ type emitter layer 5 in a plan view. The N+ type emitter layer 42 is provided on the surface layer of the P type layer 22. The N+ type emitter layer 42 is disposed to be interposed between the gate trench 82 and the P+ type emitter layer 5 in the plan view. Here, the impurity concentration of the N type layer 3 is higher than the impurity concentration of the substrate 1. The impurity concentration (P2) of the P type layer 22 is higher than the impurity concentration (P1) of the P type layer 21. The impurity concentration of the P+ type emitter layer 5 is higher than the impurity concentration (P2) of the P type layer 22.

With such a configuration, an increase in saturation current is prevented while the deterioration in Vce(sat)-Eoff trade-off characteristic and the operational complexity of the gate driver are prevented.

Even when another configuration shown by an example in the present specification is appropriately added to the above configuration, that is, even when another configuration not mentioned as the above configuration in the present specification is appropriately added, similar effects can be produced.

According to the preferred embodiment described above, the first semiconductor layer includes a fourth semiconductor layer provided at a position overlapping the P type layer 21 in a plan view, and a fifth semiconductor layer provided at a position overlapping the P type layer 22 in the plan view. Here, the fourth semiconductor layer corresponds to, for example, the N type layer 31. The fifth semiconductor layer corresponds to, for example, the N type layer 32. The impurity concentration (N2) of the N type layer 32 is higher than the impurity concentration (N1) of the N type layer 31. With such a configuration, it is possible to prevent an increase in saturation current while preventing the deterioration in Vce(sat)-Eoff trade-off characteristic or the operational complexity of the gate driver.

According to the preferred embodiment described above, the semiconductor device includes the controller 500 that is connected to the gate electrode G1 and the gate electrode G2 and performs control so that the turn-off timing of the voltage signal of the gate electrode G1 is later than the turn-off timing of the voltage signal of the gate electrode G2. With such a configuration, it is possible to improve the trade-off characteristic between the saturation voltage Vce (sat) and Eoff while reducing the loss from turn-off to current-off of the gate electrode G2 and suppressing the saturation current.

According to the preferred embodiment described above, the P type layer 21 is provided along the direction in which the gate trench 81 extends in a plan view. The P type layer 22 is provided along a direction in which the gate trench 82 extends in the plan view. With such a configuration, the degree of freedom in the form of the P type layer provided between the trenches can be increased.

According to the preferred embodiment described above, the P type layer 321 and the P type layer 322 are provided across the gate trench 81 and the gate trench 82, respectively, in a plan view. With such a configuration, the degree of freedom in the form of the P type layer provided between the trenches can be increased.

According to the preferred embodiment described above, the semiconductor device includes at least one third trench, a third electrode layer, and an emitter electrode E. Here, the third trench corresponds to, for example, the dummy trench 9. The third electrode layer corresponds to, for example, the buried layer 7. The dummy trench 9 is provided from the upper surface of the substrate 1 to a position below the lower surface of the N type layer 3. The buried layer 7 is surrounded by the gate oxide film 6 and buried in the dummy trench 9. The emitter electrode E is connected to the buried layer 7 in the dummy trench 9. The dummy trench 9 is adjacent to the gate trench 82 on the side opposite to the gate trench 81. With such a configuration, the field plate effect can be enhanced to improve the withstand voltage of the semiconductor device.

According to the preferred embodiment described above, the width W2 of the gate trench 82 is larger than the width W1 of the gate trench 81. The width W3 of the dummy trench 9 is larger than the width W1 of the gate trench 81. With such a configuration, the gate trench 581 and the gate trench 582 can be simultaneously formed using the resist 404, thereby reducing the manufacturing cost.

According to the preferred embodiment described above, the depth of the bottom surface of the dummy trench 9 is equal to the depth of the bottom surface of the gate trench 82. With such a configuration, the dummy trench 9 and the gate trench 82 can be simultaneously formed, thereby reducing the manufacturing cost.

According to the preferred embodiment described above, the semiconductor device includes a plurality of gate trenches 82. The semiconductor device includes a plurality of dummy trenches 9. The spacing between the adjacent gate trenches 82, the spacing between the adjacent dummy trenches 9, or the spacing between the adjacent gate trenches 82 and the dummy trenches 9 is smaller than 15 μm. With such a configuration, 90% or more of the withstand voltage can be held.

According to the preferred embodiment described above, in the method for manufacturing the semiconductor device, the N type layer 3 of the N type is provided on the surface layer of the N type substrate 1. The P type layer 21 of the P type and the P type layer 22 of the P type are selectively provided on the surface layer of the N type layer 3. The N+ type emitter layer 41 of the N type is provided on a part of the surface layer of the P type layer 21. The N+ type emitter layer 42 of the N type is provided on a part of the surface layer of the P type layer 22. The gate trench 81 that reaches the inside of the N type layer 3 from the upper surface of the P type layer 21 is provided. At least one gate trench 82 that reaches a position below the lower surface of the N type layer 3 from the upper surface of the P type layer 22 is provided. The P+ type emitter layer 5 is provided across the surface layer of the P type layer 21 and the surface layer of the P type layer 22. Here, the N+ type emitter layer 41 is interposed between the gate trench 81 and the P+ type emitter layer 5 in the plan view. The N+ type emitter layer 42 is interposed between the gate trench 82 and the P+ type emitter layer 5 in the plan view. The buried layer 7 is surrounded by the gate oxide film 6 and buried in the gate trench 81. The buried layer 7 is surrounded by the gate oxide film 6 and buried in the gate trench 82. The gate electrode G1 connected to the buried layer 7 is provided. The gate electrode G2 connected to the buried layer 7 is provided. Here, the impurity concentration of the N type layer 3 is higher than the impurity concentration of the substrate 1. The impurity concentration (P2) of the P type layer 22 is higher than the impurity concentration (P1) of the P type layer 21. The impurity concentration of the P+ type emitter layer 5 is higher than the impurity concentration (P2) of the P type layer 22.

With such a configuration, an increase in saturation current is prevented while the deterioration in Vce(sat)-Eoff trade-off characteristic and the operational complexity of the gate driver are prevented.

When there is no particular limitation, the order in which each process is performed can be changed.

Even when another configuration shown by an example in the present specification is appropriately added to the above configuration, that is, even when another configuration not mentioned as the above configuration in the present specification is appropriately added, similar effects can be produced.

According to the preferred embodiment described above, in a state where a part of the surface layer of the N type layer 3 is covered by the implantation mask 405 with a stripe pattern or a dot pattern, the P type layer 321 is provided in a region covered by the implantation mask 405, and the P type layer 322 is provided in a region not covered by the implantation mask 405, simultaneously by ion implantation. With such a configuration, a structure in which the P type layer 321 is formed on the surface layer of the N type layer 331 and the P type layer 322 is formed on the surface layer of the N type layer 332 can be manufactured by a small number of processes.

According to the preferred embodiment described above, in a state where the upper surface of the substrate 1 covered by the etching mask including the first opening and the second opening with an opening width larger than the opening width of the first opening, the gate trench 581 is provided in the region corresponding to the first opening, and the gate trench 582 is provided in the region corresponding to the second opening, simultaneously by etching. With such a configuration, the etching process can be shortened.

According to the preferred embodiment described above, in the method for manufacturing the semiconductor device, the controller 500 connected to the gate electrode G1 and the gate electrode G2 is provided. Then, the controller 500 performs control so that the turn-off timing of the voltage signal of the gate electrode G1 is later than the turn-off timing of the voltage signal of the gate electrode G2. With such a configuration, it is possible to improve the trade-off characteristic between the saturation voltage Vce(sat) and Eoff while reducing the loss from turn-off to current-off of the gate electrode G2 and suppressing the saturation current.

Modifications of Plurality of Preferred Embodiments Described Above

In the plurality of preferred embodiments described above, the material quality, material, dimensions, shape, relative positional relationship, conditions for implementation, or the like, of each component may be described, but each of these is one example in all aspects and is not restrictive.

Accordingly, numerous modifications and equivalents, not shown by examples, are conceived within the scope of the technology disclosed in the present specification. This includes, for example, a case where at least one component is modified, added, or omitted, and further includes a case where at least one component in at least one preferred embodiment is extracted and combined with a component of another preferred embodiment.

In addition, in at least one of the preferred embodiments described above, when a material name or the like is described without being specified, unless there is a contradiction, the material contains other additives, for example, an alloy or the like.

Unless there is a contradiction, when it is described in the preferred embodiments described above that "one" component is provided, "one or more" components may be provided.

Further, each component in the preferred embodiments described above is a conceptual unit, and within the scope of the technology disclosed in the present specification, there are included a case where one component is made up of a plurality of structures, a case where one component corresponds to a part of a structure, and a case where a plurality of components are provided in one structure.

Each component in the preferred embodiments described above includes a structure having another structure or shape as long as the same function is exhibited.

The description in the present specification is referred to for all purposes related to the present technology, and none is recognized as prior art.

Hereinafter, various aspects of the present disclosure will be collectively described as appendixes.

(Appendix 1)

A semiconductor device including:

a semiconductor substrate of a first conductivity type;

a first semiconductor layer of the first conductivity type provided on a surface layer of the semiconductor substrate;

a first impurity layer of a second conductivity type and a second impurity layer of the second conductivity type that are selectively provided on a surface layer of the first semiconductor layer;

a first trench provided from an upper surface of the first impurity layer to an inside of the first semiconductor layer, at least one second trench provided from an upper surface of the second impurity layer to below a lower surface of the first semiconductor layer;

a first electrode layer surrounded by an oxide film and buried in the first trench;

a second electrode layer surrounded by an oxide film and buried in the second trench;

a first gate electrode connected to the first electrode layer;

a second gate electrode connected to the second electrode layer;

a third impurity layer of the second conductivity type provided across a surface layer of the first impurity layer and a surface layer of the second impurity layer, a second semiconductor layer of the first conductivity type provided on the surface layer of the first impurity layer and disposed to be interposed between the first trench and the third impurity layer in a plan view; and a third semiconductor layer of the first conductivity type provided on the surface layer of the second impurity layer and disposed to be interposed between the second trench and the third impurity layer in the plan view, in which an impurity concentration of the first semiconductor layer is higher than an impurity concentration of the semiconductor substrate, an impurity concentration of the second impurity layer is higher than an impurity concentration of the first impurity layer, and an impurity concentration of the third impurity layer is higher than an impurity concentration of the second impurity layer.

(Appendix 2)

A semiconductor device including:

a semiconductor substrate of a first conductivity type:

a first semiconductor layer of the first conductivity type and a second semiconductor layer of the first conductivity type that are selectively provided on a surface layer of the semiconductor substrate;

a first impurity layer of a second conductivity type provided on a surface layer of the first semiconductor layer;

a second impurity layer of the second conductivity type provided on a surface layer of the second semiconductor layer;

a first trench provided from an upper surface of the first impurity layer to an inside of the first semiconductor layer;

at least one second trench provided from an upper surface of the second impurity layer to a position below a lower surface of the second semiconductor layer, a first electrode layer surrounded by an oxide film and buried in the first trench;

a second electrode layer surrounded by an oxide film and buried in the second trench;

a first gate electrode connected to the first electrode layer;

a second gate electrode connected to the second electrode layer;

a third impurity layer of the second conductivity type provided across a surface layer of the first impurity layer and a surface layer of the second impurity layer;

a third semiconductor layer of the first conductivity type provided on the surface layer of the first impurity layer and disposed to be interposed between the first trench and the third impurity layer in a plan view; and a fourth semiconductor layer of the first conductivity type provided on the surface layer of the second impurity layer and disposed to be interposed between the second trench and the third impurity layer in the plan view, in which an impurity concentration of the first semiconductor layer is higher than an impurity concentration of the semiconductor substrate, an impurity concentration of the second semiconductor layer is higher than an impurity concentration of the first semiconductor layer, an impurity concentration of the second impurity layer is higher than an impurity concentration of the first impurity layer, and an impurity concentration of the third impurity layer is higher than an impurity concentration of the second impurity layer.

(Appendix 3)

The semiconductor device according to Appendix 1 or 2, in which a controller that is connected to the first gate electrode and the second gate electrode and performs control so that a turn-off timing of a voltage signal of the first gate electrode is later than a turn-off timing of a voltage signal of the second gate electrode.

(Appendix 4)

The semiconductor device according to any one of Appendixes 1 to 3, in which the first impurity layer is provided along a direction in which the first trench extends in the plan view, and the second impurity layer is provided along a direction in which the second trench extends in the plan view.

(Appendix 5)

The semiconductor device according to any one of Appendixes 1 to 3, in which the first impurity layer and the second impurity layer are provided across the first trench and the second trench, respectively, in the plan view.

(Appendix 6)

The semiconductor device according to any one of Appendixes 1 and 3 to 5, further including:

at least one third trench provided from an upper surface of the semiconductor substrate to a position below a lower surface of the first semiconductor layer;

a third electrode layer surrounded by an oxide film and buried in the third trench; and an emitter electrode connected to the third electrode layer, in which the third trench is adjacent to the second trench on a side opposite to the first trench.

(Appendix 7)

The semiconductor device according to any one of Appendixes 2 to 5, further including:

at least one third trench provided from an upper surface of the semiconductor substrate to a position below a lower surface of the second semiconductor layer;

a third electrode layer surrounded by an oxide film and buried in the third trench; and an emitter electrode connected to the third electrode layer, in which the third trench is adjacent to the second trench on a side opposite to the first trench.

(Appendix 8)

The semiconductor device according to Appendix 6 or 7, in which a width of the second trench is larger than a width of the first trench, and a width of the third trench is larger than the width of the first trench.

(Appendix 9)

The semiconductor device according to any one of Appendixes 6 to 8, in which a depth of a bottom surface of the third trench is equal to a depth of a bottom surface of the second trench.

(Appendix 10)

The semiconductor device according to any one of Appendixes 6 to 9, in which a plurality of the second trenches are provided, a plurality of the third trenches are provided, a spacing between the second trenches adjacent to each other, a spacing between the third trenches adjacent to each other, or a spacing between the second trenches and the third trenches adjacent to each other is smaller than 15 μm.

(Appendix 11)

A method for manufacturing a semiconductor device, the method comprising:

providing a first semiconductor layer of a first conductivity type on a surface layer of a semiconductor substrate of the first conductivity type;

providing a first impurity layer of a second conductivity type and a second impurity layer of the second conductivity type selectively on a surface layer of the first semiconductor layer;

providing a second semiconductor layer of the first conductivity type on a part of a surface layer of the first impurity layer;
providing a third semiconductor layer of the first conductivity type on a part of a surface layer of the second impurity layer);
providing a first trench that reaches an inside of the first semiconductor layer from an upper surface of the first impurity layer;
providing at least one second trench that reaches a position below a lower surface of the first semiconductor layer from an upper surface of the second impurity layer;
providing a third impurity layer of the second conductivity type across the surface layer of the first impurity layer and the surface layer of the second impurity layer,
the second semiconductor layer being interposed between the first trench and the third impurity layer in a plan view,
the third semiconductor layer being interposed between the second trench and the third impurity layer in the plan view;
providing a first electrode layer surrounded by an oxide film and buried in the first trenches;
providing a second electrode layer surrounded by an oxide film and buried in the second trench;
providing a first gate electrode connected to the first electrode layer; and
providing a second gate electrode connected to the second electrode layer,
in which
an impurity concentration of the first semiconductor layer is higher than an impurity concentration of the semiconductor substrate,
an impurity concentration of the second impurity layer is higher than an impurity concentration of the first impurity layer, and
an impurity concentration of the third impurity layer is higher than an impurity concentration of the second impurity layer.

(Appendix 12)

The method for manufacturing the semiconductor device according to Appendix 11, in which in a state where a part of the surface layer of the first semiconductor layer is covered by an implantation mask with a stripe pattern or a dot pattern, the first impurity layer is provided in a region covered by the implantation mask, and the second impurity layer is provided in a region not covered by the implantation mask, simultaneously by ion implantation.

(Appendix 13)

A method for manufacturing a semiconductor device, the method comprising:
providing a first semiconductor layer of a first conductivity type and a second semiconductor layer of the first conductivity type selectively on a surface layer of the semiconductor substrate of the first conductivity type;
providing a first impurity layer of a second conductivity type on a surface layer of the first semiconductor layer,
providing a second impurity layer of the second conductivity type on a surface layer of the second semiconductor layer;
providing a third semiconductor layer of the first conductivity type on a part of a surface layer of the first impurity layer;
providing a fourth semiconductor layer of the first conductivity type on a part of a surface layer of the second impurity layer;
providing a first trench that reaches an inside of the first semiconductor layer from an upper surface of the first impurity layer;
providing at least one second trench that reaches a position below a lower surface of the second semiconductor layer from an upper surface of the second impurity layer;
providing a third impurity layer of the second conductivity type across the surface layer of the first impurity layer and the surface layer of the second impurity layer,
the third semiconductor layer being interposed between the first trench and the third impurity layer in plan view,
the fourth semiconductor layer being interposed between the second trench and the third impurity layer in plan view;
providing a first electrode layer surrounded by an oxide film and buried in the first trenches;
providing a second electrode layer surrounded by an oxide film and buried in the second trench;
providing a first gate electrode connected to the first electrode layer; and
providing a second gate electrode connected to the second electrode layer,
in which
an impurity concentration of the first semiconductor layer is higher than an impurity concentration of the semiconductor substrate,
an impurity concentration of the second semiconductor layer is higher than an impurity concentration of the first semiconductor layer,
an impurity concentration of the second impurity layer is higher than an impurity concentration of the first impurity layer, and
an impurity concentration of the third impurity layer is higher than an impurity concentration of the second impurity layer.

(Appendix 14)

The method for manufacturing the semiconductor device according to Appendix 13, in which in a state where the surface layer of the first semiconductor layer is covered by an implantation mask with a stripe pattern or a dot pattern, the first impurity layer is provided in a region covered by the implantation mask, and the second impurity layer is provided in a region not covered by the implantation mask, simultaneously by ion implantation.

(Appendix 15)

The method for manufacturing the semiconductor device according to any one of Appendixes 11 to 14, in which in a state where the upper surface of the semiconductor substrate is covered by an etching mask including a first opening and a second opening with an opening width larger than an opening with of the first opening, the first trench is provided in a region corresponding to the first opening and a second trench is provided in a region corresponding to the second opening, simultaneously by etching.

(Appendix 16)

The method for manufacturing the semiconductor device according to any one of Appendixes 11 to 15, in which
a controller connected to the first gate electrode and the second gate electrode is further provided, and
the controller performs control so that a turn-off timing of a voltage signal of the first gate electrode is later than a turn-off timing of the voltage signal of the second gate electrode.

While the specification has been shown and described in detail, the foregoing description is in all aspects illustrative and not restrictive. It is therefore understood that numerous modifications and variations can be devised.

What is claimed is:

1. A semiconductor device comprising:
a semiconductor substrate of a first conductivity type;
a first semiconductor layer of the first conductivity type provided on a surface layer of the semiconductor substrate;
a first impurity layer of a second conductivity type and a second impurity layer of the second conductivity type that are selectively provided on a surface layer of the first semiconductor layer;
a first trench provided from an upper surface of the first impurity layer to an inside of the first semiconductor layer;
at least one second trench provided from an upper surface of the second impurity layer to a position below a lower surface of the first semiconductor layer;
a first electrode layer surrounded by an oxide film and buried in the first trench;
a second electrode layer surrounded by an oxide film and buried in the second trench;
a first gate electrode connected to the first electrode layer;
a second gate electrode connected to the second electrode layer;
a third impurity layer of the second conductivity type provided across a surface layer of the first impurity layer and a surface layer of the second impurity layer;
a second semiconductor layer of the first conductivity type provided on the surface layer of the first impurity layer and disposed to be interposed between the first trench and the third impurity layer in a plan view; and
a third semiconductor layer of the first conductivity type provided on the surface layer of the second impurity layer and disposed to be interposed between the second trench and the third impurity layer in the plan view,
wherein
an impurity concentration of the first semiconductor layer is higher than an impurity concentration of the semiconductor substrate,
an impurity concentration of the second impurity layer is higher than an impurity concentration of the first impurity layer, and
an impurity concentration of the third impurity layer is higher than an impurity concentration of the second impurity layer.

2. The semiconductor device according to claim 1, further comprising:
a controller that is connected to the first gate electrode and the second gate electrode and performs control so that a turn-off timing of a voltage signal of the first gate electrode is later than a turn-off timing of a voltage signal of the second gate electrode.

3. The semiconductor device according to claim 1, wherein
the first impurity layer is provided along a direction in which the first trench extends in a plan view, and
the second impurity layer is provided along a direction in which the second trench extends in the plan view.

4. The semiconductor device according to claim 1, wherein the first impurity layer and the second impurity layer are provided across the first trench and the second trench, respectively, in the plan view.

5. The semiconductor device according to claim 1, further comprising:
at least one third trench provided from an upper surface of the semiconductor substrate to a position below a lower surface of the first semiconductor layer;
a third electrode layer surrounded by an oxide film and buried in the third trench; and
an emitter electrode connected to the third electrode layer, wherein the third trench is adjacent to the second trench on a side opposite to the first trench.

6. The semiconductor device according to claim 5, wherein
a width of the second trench is larger than a width of the first trench, and
a width of the third trench is larger than the width of the first trench.

7. The semiconductor device according to claim 5, wherein a depth of a bottom surface of the third trench is equal to a depth of a bottom surface of the second trench.

8. The semiconductor device according to claim 5, wherein
a plurality of the second trenches are provided,
a plurality of the third trenches are provided,
a spacing between the second trenches adjacent to each other, a spacing between the third trenches adjacent to each other, or a spacing between the second trenches and the third trenches adjacent to each other is smaller than 15 µm.

9. A semiconductor device comprising:
a semiconductor substrate of a first conductivity type;
a first semiconductor layer of the first conductivity type and a second semiconductor layer of the first conductivity type that are selectively provided on a surface layer of the semiconductor substrate;
a first impurity layer of a second conductivity type provided on a surface layer of the first semiconductor layer;
a second impurity layer of the second conductivity type provided on a surface layer of the second semiconductor layer;
a first trench provided from an upper surface of the first impurity layer to an inside of the first semiconductor layer;
at least one second trench provided from an upper surface of the second impurity layer to a position below a lower surface of the second semiconductor layer;
a first electrode layer surrounded by an oxide film and buried in the first trench;
a second electrode layer surrounded by an oxide film and buried in the second trench;
a first gate electrode connected to the first electrode layer;
a second gate electrode connected to the second electrode layer;
a third impurity layer of the second conductivity type provided across a surface layer of the first impurity layer and a surface layer of the second impurity layer;
a third semiconductor layer of the first conductivity type provided on the surface layer of the first impurity layer and disposed to be interposed between the first trench and the third impurity layer in a plan view; and
a fourth semiconductor layer of the first conductivity type provided on the surface layer of the second impurity layer and disposed to be interposed between the second trench and the third impurity layer in the plan view, wherein
an impurity concentration of the first semiconductor layer is higher than an impurity concentration of the semiconductor substrate,
an impurity concentration of the second semiconductor layer is higher than an impurity concentration of the first semiconductor layer,
an impurity concentration of the second impurity layer is higher than an impurity concentration of the first impurity layer, and
an impurity concentration of the third impurity layer is higher than an impurity concentration of the second impurity layer.

10. The semiconductor device according to claim 9, further comprising:
at least one third trench provided from an upper surface of the semiconductor substrate to a position below a lower surface of the second semiconductor layer;
a third electrode layer surrounded by an oxide film and buried in the third trench; and
an emitter electrode connected to the third electrode layer, wherein the third trench is adjacent to the second trench on a side opposite to the first trench.

11. A method for manufacturing a semiconductor device, the method comprising:
providing a first semiconductor layer of a first conductivity type on a surface layer of a semiconductor substrate of the first conductivity type;
providing a first impurity layer of a second conductivity type and a second impurity layer of the second conductivity type selectively on a surface layer of the first semiconductor layer;
providing a second semiconductor layer of the first conductivity type on a part of a surface layer of the first impurity layer;
providing a third semiconductor layer of the first conductivity type on a part of a surface layer of the second impurity layer;
providing a first trench that reaches an inside of the first semiconductor layer from an upper surface of the first impurity layer;
providing at least one second trench that reaches a position below a lower surface of the first semiconductor layer from an upper surface of the second impurity layer;
providing a third impurity layer of the second conductivity type across the surface layer of the first impurity layer and the surface layer of the second impurity layer,
the second semiconductor layer being interposed between the first trench and the third impurity layer in a plan view,
the third semiconductor layer being interposed between the second trench and the third impurity layer in the plan view;
providing a first electrode layer surrounded by an oxide film and buried in the first trenches;
providing a second electrode layer surrounded by an oxide film and buried in the second trench;
providing a first gate electrode connected to the first electrode layer, and
providing a second gate electrode connected to the second electrode layer,
wherein
an impurity concentration of the first semiconductor layer is higher than an impurity concentration of the semiconductor substrate,
an impurity concentration of the second impurity layer is higher than an impurity concentration of the first impurity layer, and
an impurity concentration of the third impurity layer is higher than an impurity concentration of the second impurity layer.

12. The method for manufacturing the semiconductor device according to claim 11, wherein in a state where a part of the surface layer of the first semiconductor layer is covered by an implantation mask with a stripe pattern or a dot pattern, the first impurity layer is provided in a region covered by the implantation mask and the second impurity layer is provided in a region not covered by the implantation mask, simultaneously by ion implantation.

13. The method for manufacturing the semiconductor device according to claim 11, wherein in a state where the upper surface of the semiconductor substrate is covered by an etching mask including a first opening and a second opening with an opening width larger than an opening width of the first opening, the first trench is provided in a region corresponding to the first opening and a second trench is provided in a region corresponding to the second opening, simultaneously by etching.

14. The method for manufacturing the semiconductor device according to claim 11, wherein
a controller connected to the first gate electrode and the second gate electrode is further provided, and
the controller performs control so that a turn-off timing of a voltage signal of the first gate electrode is later than a turn-off timing of the voltage signal of the second gate electrode.

15. A method for manufacturing a semiconductor device, the method comprising:
providing a first semiconductor layer of a first conductivity type and a second semiconductor layer of the first conductivity type selectively on a surface layer of the semiconductor substrate of the first conductivity type;
providing a first impurity layer of a second conductivity type on a surface layer of the first semiconductor layer;
providing a second impurity layer of the second conductivity type on a surface layer of the second semiconductor layer;
providing a third semiconductor layer of the first conductivity type on a part of a surface layer of the first impurity layer,
providing a fourth semiconductor layer of the first conductivity type on a part of a surface layer of the second impurity layer;
providing a first trench that reaches an inside of the first semiconductor layer from an upper surface of the first impurity layer;
providing at least one second trench that reaches a position below a lower surface of the second semiconductor layer from an upper surface of the second impurity layer;
providing a third impurity layer of the second conductivity type across the surface layer of the first impurity layer and the surface layer of the second impurity layer,
the third semiconductor layer being interposed between the first trench and the third impurity layer in a plan view,
the fourth semiconductor layer being interposed between the second trench and the third impurity layer in the plan view;
providing a first electrode layer surrounded by an oxide film and buried in the first trenches;

providing a second electrode layer surrounded by an oxide film and buried in the second trench;

providing a first gate electrode connected to the first electrode layer; and providing a second gate electrode connected to the second electrode layer, wherein an impurity concentration of the first semiconductor layer is higher than an impurity concentration of the semiconductor substrate, an impurity concentration of the second semiconductor layer is higher than an impurity concentration of the first semiconductor layer, an impurity concentration of the second impurity layer is higher than an impurity concentration of the first impurity layer, and an impurity concentration of the third impurity layer is higher than an impurity concentration of the second impurity layer.

16. The method for manufacturing the semiconductor device according to claim 15, wherein in a state where the surface layer of the first semiconductor layer is covered by an implantation mask with a stripe pattern or a dot pattern, the first impurity layer is provided in a region covered by the implantation mask and the second impurity layer is provided in a region not covered by the implantation mask, simultaneously by ion implantation.

* * * * *